(12) United States Patent
Sung et al.

(10) Patent No.: US 10,103,142 B2
(45) Date of Patent: Oct. 16, 2018

(54) INTEGRATED CIRCUIT (IC) DEVICES INCLUDING STRESS INDUCING LAYERS

(71) Applicants: Sug-hyun Sung, Yongin-si (KR); Jung-gun You, Ansan-si (KR); Gi-gwan Park, Suwon-si (KR)

(72) Inventors: Sug-hyun Sung, Yongin-si (KR); Jung-gun You, Ansan-si (KR); Gi-gwan Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 76 days.

(21) Appl. No.: 15/076,952

(22) Filed: Mar. 22, 2016

(65) Prior Publication Data

US 2016/0351565 A1  Dec. 1, 2016

(30) Foreign Application Priority Data

May 28, 2015 (KR) ........................ 10-2015-0075372

(51) Int. Cl.
| | |
|---|---|
| H01L 27/088 | (2006.01) |
| H01L 29/78 | (2006.01) |
| H01L 29/06 | (2006.01) |
| H01L 29/66 | (2006.01) |
| H01L 21/762 | (2006.01) |
| H01L 21/8234 | (2006.01) |

(52) U.S. Cl.
CPC .... *H01L 27/0886* (2013.01); *H01L 21/76229* (2013.01); *H01L 21/823412* (2013.01); *H01L 21/823431* (2013.01); *H01L 29/0649* (2013.01); *H01L 29/66818* (2013.01); *H01L 29/7843* (2013.01); *H01L 29/7854* (2013.01)

(58) Field of Classification Search
None
See application file for complete search history.

(56) References Cited

U.S. PATENT DOCUMENTS

| | | | |
|---|---|---|---|
| 8,076,231 B2 | 12/2011 | Saitoh et al. | |
| 8,102,004 B2 | 1/2012 | Nagatomo | |
| 8,859,379 B2 | 10/2014 | Cheng et al. | |
| 8,889,500 B1 | 11/2014 | Kamineni et al. | |
| 8,890,255 B2 | 11/2014 | Kanakasabapathy et al. | |
| 2004/0212035 A1* | 10/2004 | Yeo ................... | H01L 21/76229 257/510 |

(Continued)

*Primary Examiner* — Tom Thomas
*Assistant Examiner* — Steven B Gauthier
(74) *Attorney, Agent, or Firm* — Myers Bigel, P.A.

(57) ABSTRACT

Integrated circuit devices are provided. The devices may include first and second fin-shaped channel regions protruding from a substrate, and the first and second fin-shaped channel regions may define a recess therebetween. The devices may also include an isolation layer in a lower portion of the recess. The isolation layer may include a first stress liner extending along a side of the first fin-shaped channel region, a second stress liner extending along a side of the second fin-shaped channel region and an insulation liner between the first stress liner and the side of the first fin-shaped channel region and between the second stress liner and the side of the second fin-shaped channel region. The devices may further include a gate insulation layer on surfaces of upper portions of the first and second fin-shaped channel regions and a gate electrode layer on the gate insulation layer.

20 Claims, 54 Drawing Sheets

(56) References Cited

U.S. PATENT DOCUMENTS

| | | | |
|---|---|---|---|
| 2010/0015778 A1* | 1/2010 | Lin | H01L 21/76232 |
| | | | 438/443 |
| 2013/0334614 A1 | 12/2013 | Liaw | |
| 2013/0341733 A1 | 12/2013 | Erickson et al. | |
| 2014/0054650 A1 | 2/2014 | Colinge | |
| 2014/0120677 A1 | 5/2014 | Pham et al. | |
| 2014/0227857 A1 | 8/2014 | Youn et al. | |
| 2014/0239404 A1 | 8/2014 | Huang et al. | |
| 2014/0252428 A1* | 9/2014 | Chang | H01L 29/785 |
| | | | 257/288 |
| 2014/0315371 A1* | 10/2014 | Cai | H01L 21/823821 |
| | | | 438/424 |
| 2014/0332904 A1 | 11/2014 | Wann et al. | |

\* cited by examiner

INTEGRATED CIRCUIT (IC) DEVICES INCLUDING STRESS INDUCING LAYERS

CROSS-REFERENCE TO RELATED APPLICATION

This application claims priority under 35 U.S.C. § 119 to Korean Patent Application No. 10-2015-0075372, filed on May 28, 2015, in the Korean Intellectual Property Office, the disclosure of which is incorporated by reference herein in its entirety.

BACKGROUND

The inventive concept relates to integrated circuit (IC) devices and, more particularly, to IC devices including a fin field effect transistor.

With the development of electronic technology, integrated circuit devices have been rapidly downscaled. Recently, since integrated circuit devices need to operate fast and accurately, various researches have been conducted to optimize structures of transistors in integrated circuit devices.

SUMMARY

The inventive concept provides integrated circuit (IC) devices capable of independently enhancing carrier mobility in channel regions of different conductive types.

An integrated circuit device may include first and second fin-shaped channel regions protruding from a substrate in a vertical direction. The first and second fin-shaped channel regions may define a recess therebetween. The device may also include an isolation layer in a lower portion of the recess in a depth direction of the recess. The isolation layer may include a first stress liner extending along a side of the first fin-shaped channel region, a second stress liner extending along a side of the second fin-shaped channel region, and an insulation liner between the first stress liner and the side of the first fin-shaped channel region and between the second stress liner and the side of the second fin-shaped channel region. The device may further include a gate insulation layer extending along surfaces of upper portions of the first and second fin-shaped channel regions that are exposed by the isolation layer and a gate electrode layer on the gate insulation layer.

According to various embodiments, the first stress liner and the second stress liner may be connected in the recess and may include a unitary structure.

According to various embodiments, each of the first stress liner and the second stress liner may include a first material, and the insulation liner may include a second material different from the first material.

In various embodiments, the isolation layer may include an insulation layer on the first and second stress liners, and the insulation layer may include a third material different from the first material.

According to various embodiments, the upper portions of the first and second fin-shaped channel regions that are exposed by the isolation layer each may include a sidewall that has a change in slope.

In various embodiments, the gate insulation layer may contact uppermost surfaces of the first stress liner and the second stress liner.

According to various embodiments, the device may further include an interfacial layer between the first and second fin-shaped channel regions and the gate insulation layer.

In various embodiments, the side of the first fin-shaped channel region may include a first side of the first fin-shaped channel region that is opposite a second side of the first fin-shaped channel region. The isolation layer may include a first isolation layer on the first side of the first fin-shaped channel region, and the first isolation layer may include a third stress liner extending along the first side of the first fin-shaped channel region and a first insulation liner between the third stress liner and the first side of the first fin-shaped channel region. The device may further include a second isolation layer on the second side of the first fin-shaped channel region, and the second isolation layer may include a fourth stress liner extending along the second side of the first fin-shaped channel region and a second insulation liner between the fourth stress liner and the second side of the first fin-shaped channel region. A first vertical distance between an uppermost portion of the first fin-shaped channel region and a lowermost portion of the first isolation layer may be less than a second vertical distance between the uppermost portion of the first fin-shaped channel region and a lowermost portion of the second isolation layer.

According to various embodiments, the side of the first fin-shaped channel region may include a first side of the first fin-shaped channel region that is opposite a second side of the first fin-shaped channel region. The isolation layer may include a first isolation layer on the first side of the first fin-shaped channel region, and the first isolation layer may include a third stress liner extending along the first side of the first fin-shaped channel region and a first insulation liner between the third stress liner and the first side of the first fin-shaped channel region. The device may further include a second isolation layer on the second side of the first fin-shaped channel region. The second isolation layer may include a fourth stress liner extending along the second side of the first fin-shaped channel region and a second insulation liner between the fourth stress liner and the second side of the first fin-shaped channel region. The device may also include a device isolation layer connected to a side of the second isolation layer. The second isolation layer may be between the first fin-shaped channel region and the device isolation layer, and a first vertical distance between an uppermost portion of the first fin-shaped channel region and a lowermost portion of the first isolation layer may be less than a second vertical distance between the uppermost portion of the first fin-shaped channel region and a lowermost portion of the device isolation layer.

An integrated circuit device may include first and second fin-shaped channel regions protruding from a substrate in a vertical direction. The first and second fin-shaped channel regions may define a recess therebetween. The device may also include an isolation layer in a lower portion of the recess in a depth direction of the recess. The isolation layer may include an insulation liner conformally extending on a surface of the lower portion of the recess, an insulation layer on the insulation liner and a stress liner between the insulation liner and the insulation layer. The stress liner may include a material different from the insulation liner and the insulation layer. The device may further include a gate insulation layer extending along surfaces of upper portions of the first and second fin-shaped channel regions that are exposed by the isolation layer and a gate electrode layer on the gate insulation layer.

According to various embodiments, the upper portions of the first and second fin-shaped channel regions that are exposed by the isolation layer each may include a sidewall that has a change in slope.

In various embodiments, the gate insulation layer may contact uppermost surfaces of the insulation liner, the stress liner and the insulation layer.

In various embodiments, a lower most portion of the recess may have a round shape.

According to various embodiments, the isolation layer may include a first isolation layer on a first side of the first fin-shaped channel region that is opposite a second side of the first fin-shaped channel region. The first isolation layer may include a first insulation liner conformally extending on the surface of the lower portion of the recess, a first insulation layer on the first insulation liner and a first stress liner between the first insulation liner and the first insulation layer. The first stress liner may include a first material different from the first insulation liner and the first insulation layer. The device may further include a second isolation layer on the second side of the first fin-shaped channel region. The second isolation layer may include a second insulation liner conformally extending on the second side of the first fin-shaped channel region, a second insulation layer on the second insulation liner and a second stress liner between the second insulation liner and the second insulation layer. The second stress liner may include the first material different from the second insulation liner and the second insulation layer. A first vertical distance between an uppermost portion of the first fin-shaped channel region and a lowermost portion of the first isolation layer may be less than a second vertical distance between the uppermost portion of the first fin-shaped channel region and a lowermost portion of the second isolation layer.

In various embodiments, the isolation layer may include a first isolation layer on a first side of the first fin-shaped channel region that is opposite a second side of the first fin-shaped channel region. The first isolation layer may include a first insulation liner conformally extending on the surface of the lower portion of the recess, a first insulation layer on the first insulation liner and a first stress liner between the first insulation liner and the first insulation layer. The first stress liner may include a first material different from the first insulation liner and the first insulation layer. The device may further include a second isolation layer on the second side of the first fin-shaped channel region, the second isolation layer may include a second insulation liner conformally extending on the second side of the first fin-shaped channel region, a second insulation layer on the second insulation liner and a second stress liner between the second insulation liner and the second insulation layer. The second stress liner may include the first material different from the second insulation liner and the second insulation layer. The device may also include a device isolation layer connected to a side of the second isolation layer. The second isolation layer may be between the first fin-shaped channel region and the device isolation layer, and a first vertical distance between an uppermost portion of the first fin-shaped channel region and a lowermost portion of the first isolation layer may be less than a second vertical distance between the uppermost portion of the first fin-shaped channel region and a lowermost portion of the device isolation layer.

According to various embodiments, a lower surface of the recess may be round, and a lower surface of the device isolation layer may be substantially flat.

An integrated circuit device may include a fin-shaped channel region protruding from a substrate in a vertical direction, a gate insulation layer extending along a surface of an upper portion of the fin-shaped channel region, a gate electrode layer on the gate insulation layer and an isolation structure on a side of a lower portion of the fin-shaped channel region. The isolation structure may include a device isolation layer and an isolation layer that is between the fin-shaped channel region and the device isolation. The isolation layer may include a stress liner extending along the side of the lower portion of the fin-shaped channel region and an insulation liner between the stress liner and the side of the lower portion of the fin-shaped channel region. A first vertical distance between an uppermost portion of the fin-shaped channel region and a lowermost portion of the stress liner may be less than a second vertical distance between the uppermost portion of the first fin-shaped channel region and a lowermost portion of the device isolation layer.

In various embodiments, the upper portion of the fin-shaped channel region may include a sidewall that has a change in slope.

According to various embodiments, the stress liner may include a first material, and the insulation liner may include a second material that is different from the first material.

According to various embodiments, the device isolation may be free of the stress liner.

BRIEF DESCRIPTION OF THE DRAWINGS

Example embodiments of the inventive concept will be more clearly understood from the following detailed description taken in conjunction with the accompanying drawings in which.

DETAILED DESCRIPTION

Figure 1A:
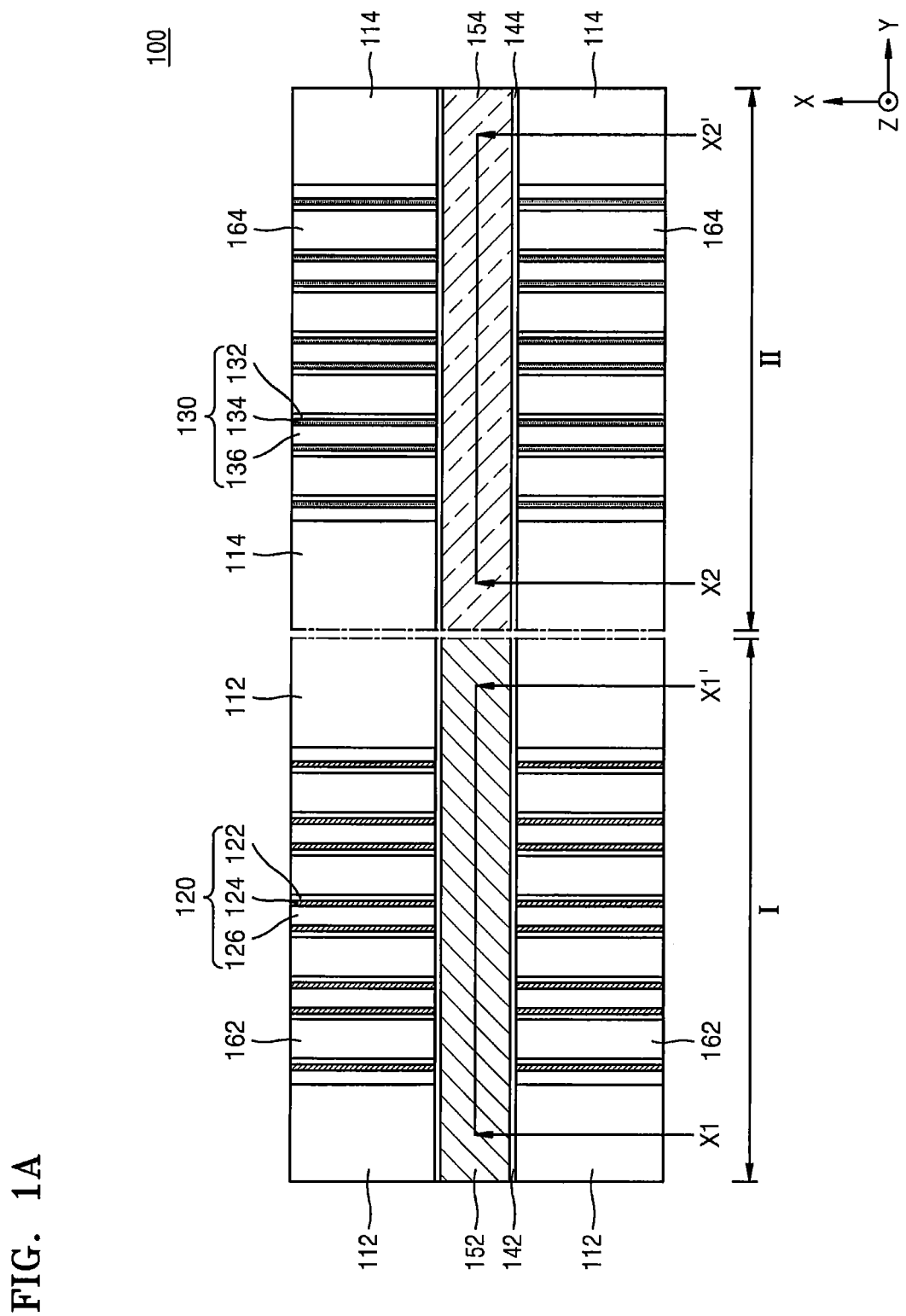
FIG. 1A is a plan view showing major components of an integrated circuit (IC) device according to some embodiments of the inventive concept.

Expressions such as "at least one of," when preceding a list of elements, modify the entire list of elements and do not modify the individual elements of the list. As used herein the term "and/or" includes any and all combinations of one or more of the associated listed items.

Hereinafter, the inventive concept will be described more fully with reference to the accompanying drawings, in which example embodiments of the inventive concept are shown. Like reference numerals in the drawings denote like elements throughout, and thus their description will be omitted.

The inventive concept may, however, be embodied in many different forms and should not be construed as being limited to the embodiments set forth herein; rather, these embodiments are provided so that this disclosure will be thorough and complete, and will fully convey the inventive concept to one of ordinary skill in the art.

It will be understood that, although the terms first, second, third, etc., may be used herein to describe various elements, regions, layers, sections, and/or components, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept. For example, a first component discussed below could be termed a second component, and similarly, a second component may be termed a first component without departing from the teachings of this disclosure.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The operations of all methods described herein can be performed in any suitable order unless otherwise indicated herein or otherwise clearly contradicted by context. The inventive concept is not limited to the described order of the operations. For example, two consecutively described processes may be performed substantially at the same time or performed in an order opposite to the described order.

Example embodiments of the inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, embodiments of the inventive concept should not be construed as being limited to the particular shapes of regions illustrated herein but are to include deviations in shapes that result, for example, from manufacturing. The term "substrate" used in this specification may refer to a substrate itself, or a stacked structure including a substrate and a layer or film formed on a surface of the substrate. The phrase "a surface of a substrate" used in this specification may refer to an exposed surface of a substrate or an outer surface of a layer or film formed on the substrate.

FIG. 1A is a plan view showing major components of an integrated circuit (IC) device 100 according to some embodiments of the inventive concept.

Figure 1B:
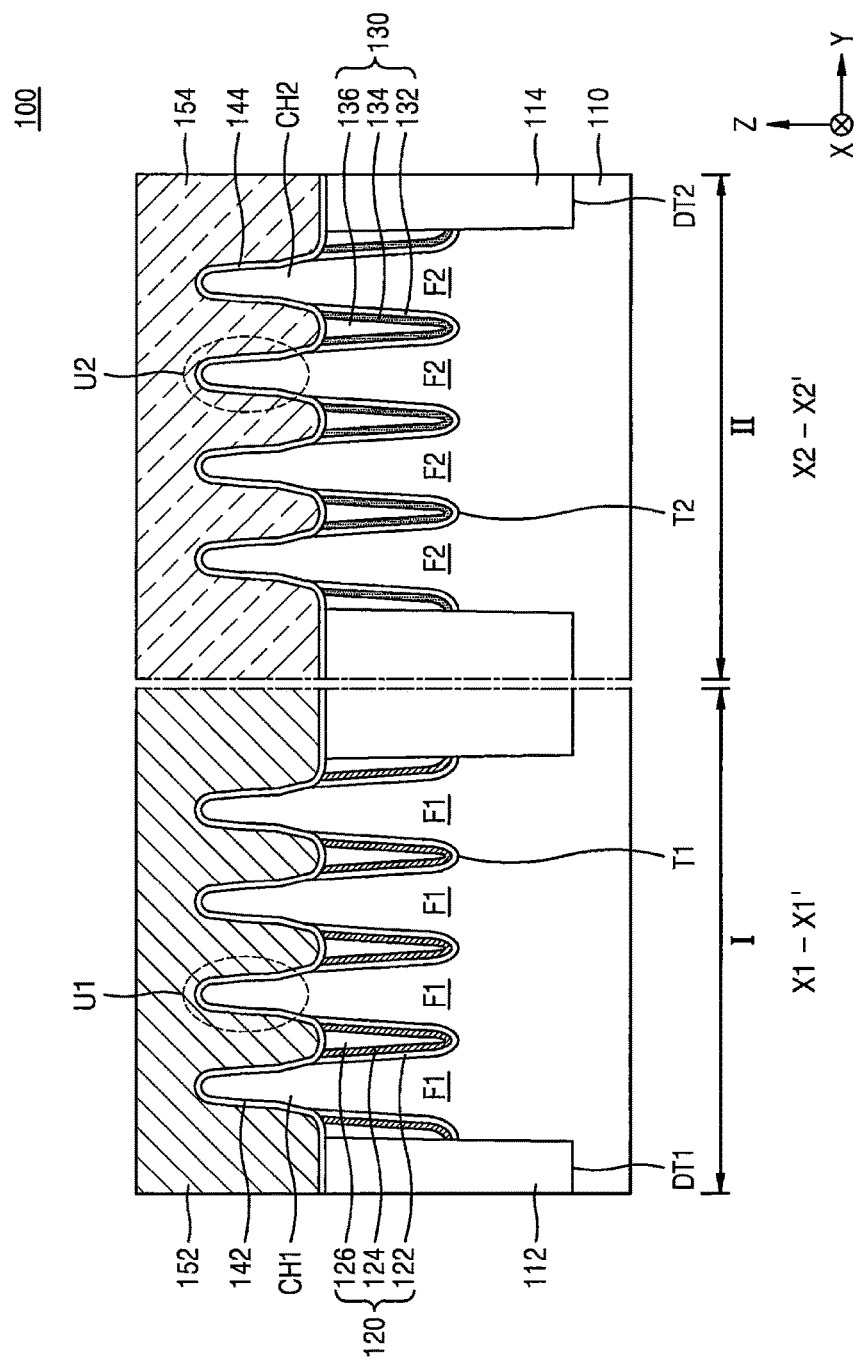
FIG. 1B is a cross-sectional view taken along the lines X1-X1' and X2-X2' of FIG. 1A according to some embodiments of the inventive concept.

FIG. 1B is a cross-sectional view taken along the lines X1-X1' and X2-X2' of FIG. 1A.

Referring to FIGS. 1A and 1B, the IC device 100 includes a substrate 110 having a first region I and a second region II.

The substrate 110 may include a semiconductor material such as Si and/or Ge, or a compound semiconductor such as SiGe, SiC, GaAs, InAs, or InP. According to some embodiments, the substrate 110 may be formed of at least one of a Group III and V elements-containing material and a Group IV element-containing material. The Group III and V elements-containing material may be a binary, ternary, or quaternary compound including at least one Group III element and at least one Group V element. The Group III and V elements-containing material may be a compound including, as a Group III element, at least one of In, Ga, and Al and, as a Group V element, at least one of As, P, and Sb. For example, the Group III and V elements-containing material may be selected from InP, $In_zGa_{1-z}As$ (0<z<1), and $Al_zGa_{1-z}As$ (0<z<1). The binary compound may be one of InP, GaAs, InAs, InSb and GaSb, for example. The ternary compound may be one of InGaP, InGaAs, AlInAs, InGaSb, GaAsSb, and GaAsP. The Group IV element-containing material may be Si or Ge. However, a Group III and V elements-containing material and a Group IV element-containing material that are usable by an IC device according to the inventive concept are not limited to the aforementioned materials. The Group III and V elements-containing material, and the Group IV element-containing material, such as Ge, may each be used as a channel material of a low-power and high-speed transistor. A high-performance CMOS may be formed using a semiconductor substrate formed of a Group III and V elements-containing material, for example GaAs, having higher mobility of electrons than an Si substrate, and a semiconductor substrate formed of a semiconductor material, for example Ge, having higher mobility of holes than an Si substrate. According to some embodiments, when an NMOS transistor is formed on the substrate 110, the substrate 110 may be formed of one of the above-exemplified Group III and V elements-containing materials. According to some embodiments, when a PMOS transistor is formed on the substrate 110, the substrate 110 may be formed of Ge. In some embodiments, the substrate 110 may have a silicon-on-insulator (SOI) structure. The substrate 110 may include a conductive region, for example, an impurity-doped well or an impurity-doped structure.

The first region I and the second region II of the substrate 110 indicate different regions of the substrate 110, and thus may be regions that require different threshold voltages. For example, the first region I may be an NMOS region, and the second region II may be a PMOS region.

A plurality of first fin-shaped active regions F1 may protrude in a third direction (Z direction) perpendicular to a main surface of the substrate 110, in the first region I of the substrate 110. Each of the plurality of first fin-shaped active regions F1 may have a first conductive channel region CH1. Both lower sidewalls of each of the plurality of first fin-shaped active regions F1 that are below the first conductive channel region CH1 may be covered with a plurality of first isolation layers 120 as illustrated in FIG. 1B. Each of the plurality of first fin-shaped active regions F1 may have a first upper portion U1 that is exposed by the plurality of first isolation layers 120. In some embodiments, sidewalls of the first upper portion U1 may have a change in slope as illustrated in FIG. 1B. The sidewalls of the first upper portion U1 may have a first slope adjacent a top of the first upper portion U1 that is steeper than a second slope adjacent the plurality of first isolation layers 120.

A plurality of second fin-shaped active regions F2 may protrude in the third direction (Z direction) perpendicular to the main surface of the substrate 110, in the second region II of the substrate 110. Each of the plurality of second fin-shaped active regions F2 may have a second conductive channel region CH2. Both lower sidewalls of each of the plurality of second fin-shaped active regions F2 that are below the second conductive channel region CH2 may be covered with a plurality of second isolation layers 130. Each of the plurality of second fin-shaped active regions F2 may have a second upper portion U2 that is exposed by the plurality of second isolation layers 130. In some embodiments, sidewalls of the second upper portion U2 may have a change in slope as illustrated in FIG. 1B. The sidewalls of the second upper portion U2 may have a third slope adjacent a top of the second upper portion U2 that is steeper than a fourth slope adjacent the plurality of second isolation layers 130.

Although four first fin-shaped active regions F1 are formed in the first region I and four second fin-shaped active regions F2 are formed in the second region II in FIGS. 1A and 1B, the inventive concept is not limited thereto. For example, one fin-shaped active region, two fin-shaped active regions, three fin-shaped active regions, or five or more fin-shaped active regions may be formed in each of the first region I and the second region II. Although FIG. 1B illustrates that profiles of opposing sidewalls of each of the plurality of first and second fin-shaped active regions F1 and F2 are substantially symmetric with respect to a center line of the opposing sidewalls extending in the third direction (Z direction) perpendicular to the main surface of the substrate 110. However, the inventive concept is not limited thereto, and the IC device 100 may include a plurality of first fin-shaped active regions F1 and a plurality of second fin-shaped active regions F2 each having any of various other shapes.

In some embodiments, the first isolation layers 120 and the second isolation layers 130 may have different stacked structures.

The first isolation layers 120 may be formed to fill at least portions of first trenches T1 that define the first fin-shaped active regions F1. The first trenches T1 may each have a lowermost portion having a rounded shape. In some embodiments, each of the first isolation layers 120 may be formed in a lower portion of one of the first trenches T1 in a depth direction of the first trenches T1 as illustrated in FIG. 1B. Each of the first trenches T1 may be a recess defined by two adjacent first fin-shaped active regions F1. Each of the first isolation layers 120 may include a first insulation liner 122, a first stressor liner 124, and a first gap-fill insulation layer 126 sequentially stacked on an inner wall of each of the first trenches T1. The first insulation liner 122 may contact sidewalls of first fin-shaped active regions F1. In some embodiments, the first insulation liner 122 may have a substantially constant thickness on the inner walls of the first trenches T1 and may conformally extend on the inner walls of the first trenches T1 as illustrated in FIG. 1B. The first stressor liner 124 may extend along, in some embodiments may conformally extend along, the sidewalls of the first fin-shaped active regions F1. The first insulation liner 122 may be interposed between the first stressor liner 124 and the sidewalls of the first fin-shaped active regions F1. The first stressor liner 124 in one of the first trenches T1 may have a unitary structure. The first gap-fill insulation layer 126 may be formed on the first stressor liner 124 and fill a lower portion of the first trench T1.

The first insulation liner 122 may be formed of a first oxide layer. For example, the first insulation liner 122 may be formed of a natural oxide layer. According to some embodiments, the first oxide layer in the first insulation liner 122 may be obtained by oxidizing (e.g., thermally oxidizing) the surfaces of the first fin-shaped active regions F1. According to some embodiments, the first insulation liner 122 may have a thickness of about 10 Å to about 100 Å.

The first stressor liner 124 may be formed of a material that applies a first stress to first conductive channel regions CH1. The first stressor liner 124 may enhance carrier mobility within the first conductive channel regions CH1 of the first fin-shaped active regions F1 by applying the first stress to the first conductive channel regions CH1. According to some embodiments, when the first conductive channel regions CH1 are N-type channel regions, the first stressor liner 124 may be formed of a material that applies a tensile stress to the first conductive channel regions CH1. For example, the first stressor liner 124 may be formed of silicon nitride (SiN), silicon oxynitride (SiON), silicon boronitride (SiBN), silicon carbide (SiC), SiC:H, SiCN, SiCN:H, SiOCN, SiOCN:H, silicon oxycarbide (SiOC), silicon dioxide ($SiO_2$), polysilicon, or a combination thereof. According to some embodiments, the first stressor liner 124 may have a thickness of about 10 Å to about 100 Å.

The first gap-fill insulation layer 126 may be formed of a second oxide layer. The first oxide layer and the second oxide layer may be oxide layers obtained using different methods. According to some embodiments, the second oxide layer in the first gap-fill insulation layer 126 may be formed of a layer formed by deposition and/or coating. According to some embodiments, the first gap-fill insulation layer 126 may be formed of an oxide layer formed by flowable chemical vapor deposition (FCVD) and/or spin coating. For example, the first gap-fill insulation layer 126 may be formed of fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), and/or tonen silazene (TOSZ), but is not limited thereto.

The plurality of second isolation layers 130 may be formed to fill at least portions of second trenches T2 that define the second fin-shaped active regions F2. The second trenches T2 may each have a lowermost portion having a rounded shape. In some embodiments, each of the second isolation layers 130 may be formed in a lower portion of one of the second trenches T2 in a depth direction of the second trenches T2 as illustrated in FIG. 1B. Each of the second trenches T2 may be a recess defined by two adjacent second fin-shaped active regions F2. Each of the plurality of second isolation layers 130 may include a second insulation liner 132, a second stressor liner 134, and a second gap-fill insulation layer 136 sequentially stacked on an inner wall of each of the second trenches T2.

The second insulation liner 132 may contact sidewalls of second fin-shaped active regions F2. In some embodiments, the second insulation liner 132 may have a substantially constant thickness on the inner walls of the second trenches T2 and may conformally extend on the inner walls of the second trenches T2 as illustrated in FIG. 1B. The second stressor liner 134 may cover the sidewalls of the second fin-shaped active regions F2 by interposing the second insulation liner 132 between the second stressor liner 134 and the sidewalls of the second fin-shaped active regions F2. In some embodiments, the second stressor liner 134 may have a substantially constant thickness on the second insulation liner 132 and may conformally extend on the second insulation liner 132 as illustrated in FIG. 1B. The second stressor liner 134 in one of the second trenches T2 may have a unitary structure. The second gap-fill insulation layer 136 may cover the sidewalls of the second fin-shaped active regions F2 by interposing the second insulation liner 132 and the second stressor liner 134 between the second gap-fill insulation layer 136 and the sidewalls of the second fin-shaped active regions F2.

The second insulation liner 132 may be formed of a third oxide layer. For example, the second insulation liner 132 may be formed of a natural oxide layer. The second insulation liner 132 may be obtained by oxidizing (e.g., thermally oxidizing) the surfaces of the second fin-shaped active regions F2. For example, the second insulation liner 132 may be formed of an oxide layer formed by thermal oxidation. According to some embodiments, the third oxide layer in the second insulation liner 132 may be formed of a layer formed using the same method as a method used to form the first oxide layer in the first insulation liner 122. According to some embodiments, the second insulation liner 132 may have a thickness of about 10 Å to about 100 Å.

The second stressor liner 134 may be formed of a material that applies a second stress, which is different from the first stress, to second conductive channel regions CH2. The second stressor liner 134 may enhance carrier mobility within the second conductive channel regions CH2 of the second fin-shaped active regions F2 by applying the second stress to the second conductive channel regions CH2. According to some embodiments, when the second conductive channel regions CH2 are P-type channel regions, the second stressor liner 134 may be formed of a material that applies a compressive stress to the second conductive channel regions CH2. For example, the second stressor liner 134 may be formed of SiN, SiON, SiBN, SiC, SiC:H, SiCN, SiCN:H, SiOCN, SiOCN:H, SiOC, $SiO_2$, polysilicon, or a combination thereof. According to some embodiments, the second stressor liner 134 may be formed of the same material as that used to form the first stressor liner 124, but the first stressor liner 124 and the second stressor liner 134 may apply different stresses to adjacent conductive channel regions. The first stressor liner 124 and the second stressor liner 134 may have the same thickness or different thicknesses. The first stressor liner 124 and the second stressor liner 134 may be respectively formed of layers formed via different methods. According to some embodiments, the second stressor liner 134 may have a thickness of about 10 Å to about 100 Å.

The second gap-fill insulation layer 136 may be formed of a fourth oxide layer. The second gap-fill insulation layer 136 may be formed of a layer formed by deposition or coating. According to some embodiments, the second gap-fill insulation layer 136 may be formed of an oxide layer formed by FCVD or spin coating. For example, the second gap-fill insulation layer 136 may be formed of FSG, USG, BPSG, PSG, FOX, PE-TEOS, and/or TOSZ. According to some embodiments, the fourth oxide layer in the second gap-fill insulation layer 136 may be formed of the same layer as the layer used to form the second oxide layer in the first gap-fill insulation layer 126.

In the first region I of the substrate 110, a first gate insulation layer 142 and a first gate 152 covering both sidewalls and an upper surface of each of the plurality of first fin-shaped active regions F1 may be formed on the plurality of first fin-shaped active regions F1 and the first isolation layers 120. The first gate insulation layer 142 and the first gate 152 may extend in a second direction (Y direction) that intersects with a first direction (X direction) in which each of the plurality of first fin-shaped active regions F1 extends. The first gate 152 may be electrically coupled with plurality of first fin-shaped active regions F1.

In the first region I and the second region II of the substrate 110, a first deep trench DT1 and a second deep trench DT2 which are respectively deeper than the first trench T1 and the second trench T2 may be formed, respectively. According to some embodiments, the first deep trench DT1 and the second deep trench DT2 may be formed in respective edges of the first region I and the second region II, respectively, or may be formed between the first region I and the second region II.

A first inter-device isolation insulating layer 112 may be formed in the first deep trench DT1. In some embodiments, the first deep trench DT1 may be filled with the first inter-device isolation insulating layer 112. A second inter-device isolation insulating layer 114 may be formed in the second deep trench DT2. In some embodiments, the second deep trench DT2 may be filled with the second inter-device isolation insulating layer 114. In some embodiments, the first inter-device isolation insulating layer 112 and/or the second inter-device isolation insulating layer 114 may have a substantially flat lower surface.

The first inter-device isolation insulating layer 112 may extend into the substrate 110 to a deeper level than the plurality of first isolation layers 120 in order to define the first region I. The first inter-device isolation insulating layer 112 may contact some parts of the plurality of first isolation layers 120.

The second inter-device isolation insulating layer 114 may extend into the substrate 110 to a deeper level than the plurality of second isolation layers 130 in order to define the second region II. The second inter-device isolation insulating layer 114 may contact some parts of the plurality of second isolation layers 130. In some embodiments, the first inter-device isolation insulating layer 112 may separate the first region I that has a well region of a first conductivity type from an adjacent region that has a well region of a second conductivity type that is different from the first conductivity type. In some embodiments, the first region I defined by the first inter-device isolation insulating layer 112 may include a single well. Further, in some embodiments, the second inter-device isolation insulating layer 114 may separate the second region II that has a well region of the second conductivity type from an adjacent region that has a well region of the first conductivity type. In some embodiments, the second region II defined by the second inter-device isolation insulating layer 114 may include a single well.

As shown in FIG. 1B, in the first region I, the first stressor liner 124 may directly contact the first inter-device isolation insulating layer 112. The first inter-device isolation insulating layer 112 may be connected to a side of the first stressor liner 124. In the second region II, the second stressor liner 134 may directly contact the second inter-device isolation insulating layer 114. The second inter-device isolation insulating layer 114 may be connected to a side of the second stressor liner 134.

The first inter-device isolation insulating layer 112 and the second inter-device isolation insulating layer 114 may each be formed of a fifth oxide layer. According to some embodiments, the fifth oxide layer may be formed by coating or deposition. The fifth oxide layer may be formed of a material that is different from those used to form the first and second gap-fill insulation layers 126 and 136 that are respectively included in the first and second isolation layers 120 and 130. For example, the second and fourth oxide layers in the first and second gap-fill insulation layers 126 and 136 may each be formed by FSG, and the fifth oxide layer in the first inter-device isolation insulating layer 112 and the second inter-device isolation insulating layer 114 may be formed by USG.

In the second region II of the substrate 110, a second gate insulation layer 144 and a second gate 154, covering both sidewalls and an upper surface of each of the plurality of second fin-shaped active regions F2, may be formed on the plurality of second fin-shaped active regions F2 and the plurality of second isolation layers 130. The second gate insulation layer 144 and the second gate 154 may extend in the second direction (Y direction) that intersects with the first direction (X direction) in which each of the plurality of second fin-shaped active regions F2 extends. The second gate 154 may be electrically coupled with plurality of second fin-shaped active regions F2.

The first and second gate insulation layers 142 and 144 may be formed to cover respective lower surfaces and respective both sidewalls of the first and second gates 152 and 154, respectively. In some embodiments, the first gate insulation layer 142 may contact uppermost surfaces of the first insulation liner 122, the first stressor liner 124 and the first gap-fill insulation layer 126 as illustrated in FIG. 1B. In some embodiments, the second gate insulation layer 144 may contact uppermost surfaces of the second insulation liner 132, the second stressor liner 134 and the second gap-fill insulation layer 136 as illustrated in FIG. 1B The first and second gate insulation layers 142 and 144 may each be formed of a silicon oxide layer, a high dielectric constant layer, or a combination thereof. The high dielectric constant layer may be formed of a material having a higher dielectric constant than a silicon oxide layer. For example, each of the first and second gate insulation layers 142 and 144 may have a dielectric constant of about 10 to about 25. The high dielectric constant layer may be formed of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof, but a material used to form the high dielectric constant layer is not limited thereto. The first and second gate insulation layers 142 and 144 may be formed by an atomic layer deposition (ALD), a chemical vapor deposition (CVD), or a physical vapor deposition (PVD). According to some embodiments, the first and second gate insulation layers 142 and 144 may include the same material or may have the same structure. In some embodiments, the first and second gate insulation layers 142 and 144 may have different structures and may have different materials.

Each of the first and second gates 152 and 154 may include a work-function adjustment metal-containing layer, and a gap-fill metal-containing layer that fills a space formed in an upper portion of the work-function adjustment metal-containing layer. According to some embodiments, each of the first and second gates 152 and 154 may have a structure in which a metal nitride layer, a metal layer, a conductive capping layer, and a gap-fill metal layer are sequentially stacked. The metal nitride layer and the metal layer may each include at least one metal selected from Ti, W, Ru, Nb, Mo, Hf, Ni, Co, Pt, Yb, Tb, Dy, Er, and Pd. The metal nitride layer and the metal layer may each be formed by an ALD, a metal organic ALD (MOALD), or a metal organic CVD (MOCVD). The conductive capping layer may function as a protection layer that may possibly prevent the surface of the metal layer from being oxidized. The conductive capping layer may also function as a wetting layer for facilitating deposition when another conductive layer is formed on the metal layer. The conductive capping layer may be formed of metal nitride, for example, TiN, TaN, or a combination thereof, but is not limited thereto. The gap-fill metal layer may extend over the conductive capping layer. The gap-fill metal layer may be formed of, for example, a W layer. The gap-fill metal layer may be formed by an ALD, a CVD, or a PVD. The gap-fill metal layer may fill a recess formed by a stepped portion of an upper surface of the conductive capping layer, without voids. According to some embodiments, the first and second gates 152 and 154 may have different compositions.

In the first region I of the substrate 110, first source/drain regions 162 are respectively formed on both sides of the first gate 152, within the first fin-shaped active regions F1. In the second region II of the substrate 110, second source/drain regions 164 are respectively formed on both sides of the second gate 154, within the second fin-shaped active regions F2.

Although not shown in FIGS. 1A and 1B, the first and second source/drain regions 162 and 164 may include semiconductor layers epitaxially grown from the first and second fin-shaped active regions F1 and F2, respectively. Each of the first and second source/drain regions 162 and 164 may be formed of an embedded SiGe structure including a plurality of epitaxially grown SiGe layers, an epitaxially grown Si layer, and/or an epitaxially grown SiC layer. The first source/drain regions 162 and the second source/drain regions 164 may have different compositions.

Figure 1C:
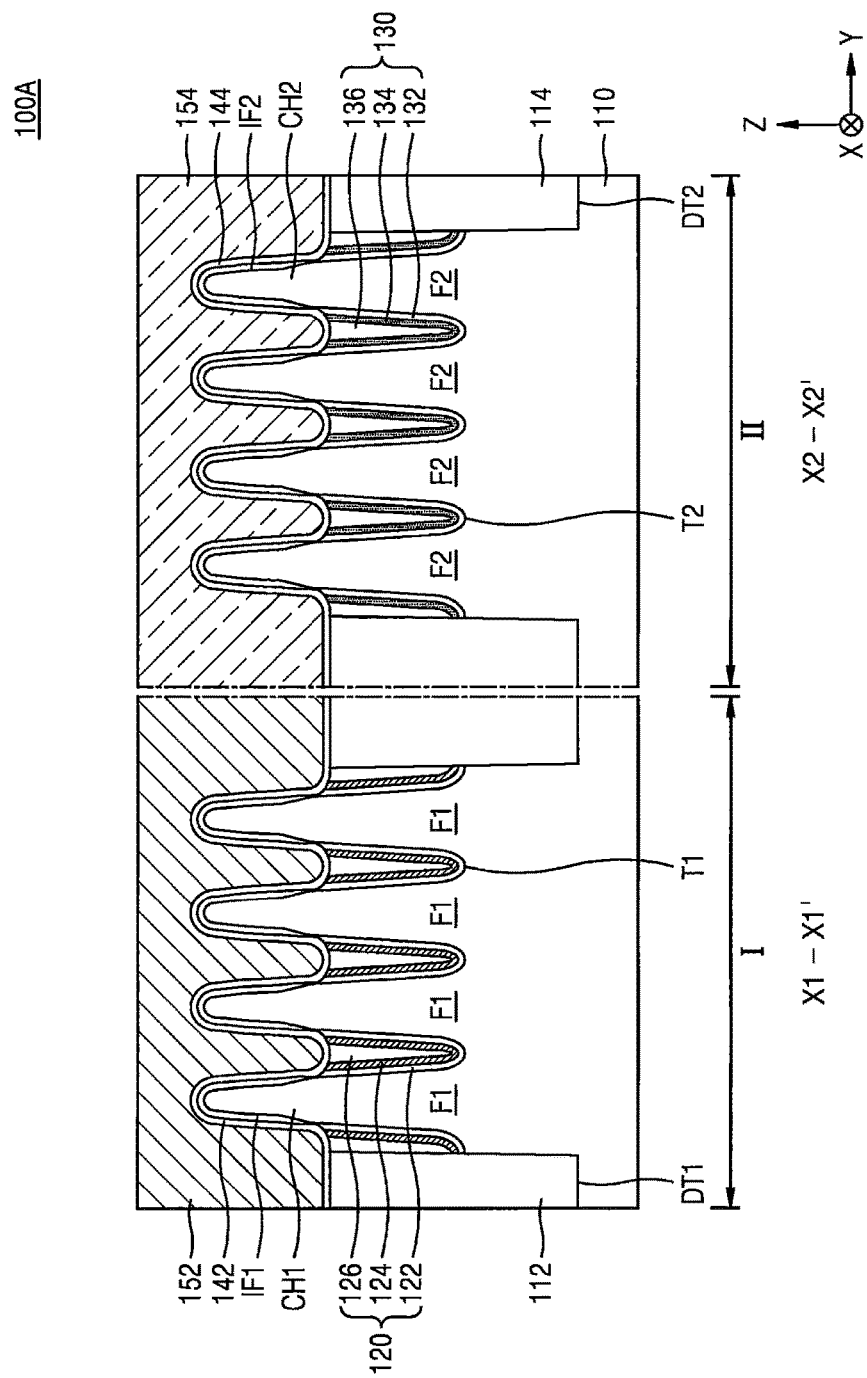
FIG. 1C is a cross-sectional view taken along the lines X1-X1' and X2-X2' of FIG. 1A according to some embodiments of the inventive concept.

FIG. 1C is a cross-sectional view of an IC device 100A taken along the lines X1-X1' and X2-X2' of FIG. 1A according to some embodiments of the inventive concept. The same reference characters and numerals in FIG. 1C as those in FIGS. 1A and 1B denote the same elements, and thus their description will be omitted herein.

The IC device 100A of FIG. 1C may have a similar structure to that of the IC device 100 of FIG. 1B except a first interfacial layer IF1 that is interposed between the first conductive channel regions CH1 of the plurality of first fin-shaped active regions F1 and the first gate insulation layer 142 in the first region I and a second interfacial layer IF2 that is interposed between the second conductive channel regions CH2 of the plurality of second fin-shaped active regions F2 and the second gate insulation layer 144 in the second region II.

According to some embodiments, the first interfacial layer IF1 and the second interfacial layer IF2 may be obtained by oxidizing the surfaces of the plurality of first fin-shaped active regions F1 and the surfaces of the plurality of second fin-shaped active regions F2, respectively.

The first interfacial layer IF1 may contact the plurality of first fin-shaped active regions F1, and the second interfacial layer IF2 may contact the plurality of second fin-shaped active regions F2. The first interfacial layer IF1 may cure interfacial defects between the plurality of first fin-shaped active regions F1 and the first gate insulation layer 142. The second interfacial layer IF2 may cure interfacial defects between the plurality of second fin-shaped active regions F2 and the second gate insulation layer 144.

According to some embodiments, the first and second interfacial layers IF1 and IF2 may be formed of a low dielectric material layer having a dielectric constant of about 9 or less, for example, a silicon oxide layer, a silicon nitride layer, or a combination thereof. According to some embodiments, the first and second interfacial layers IF1 and IF2 may be formed of silicate, a combination of silicate and a silicon oxide layer, or a combination of silicate and a silicon oxynitride layer.

According to some embodiments, the first interfacial layer IF1 and the second interfacial layer IF2 may each have a thickness of about 5 Å to about 20 Å, but thicknesses thereof are not limited thereto.

In the IC devices 100 and 100A of FIGS. 1A-1C, the plurality of first isolation layers 120 formed in the first region I may include first stressor liners 124 extending along both sidewalls of the first fin-shaped active regions F1 to apply the first stress to the first conductive channel regions CH1 of the first fin-shaped active regions F1, and the plurality of second isolation layers 130 formed in the second region II may include second stressor liners 134 extending along both sidewalls of the second fin-shaped active regions F2 to apply the second stress, which is different from the first stress, to the second conductive channel regions CH2 of the second fin-shaped active regions F2. Accordingly, the first conductive channel regions CH1 of the first fin-shaped active regions F1 and the second conductive channel regions CH2 of the second fin-shaped active regions F2 receive stresses capable of independently enhancing carrier mobility of the first and second conductive channel regions CH1 and CH2, and thus the performance of transistors formed in the first region I and the second region II may be enhanced.

Figure 2:
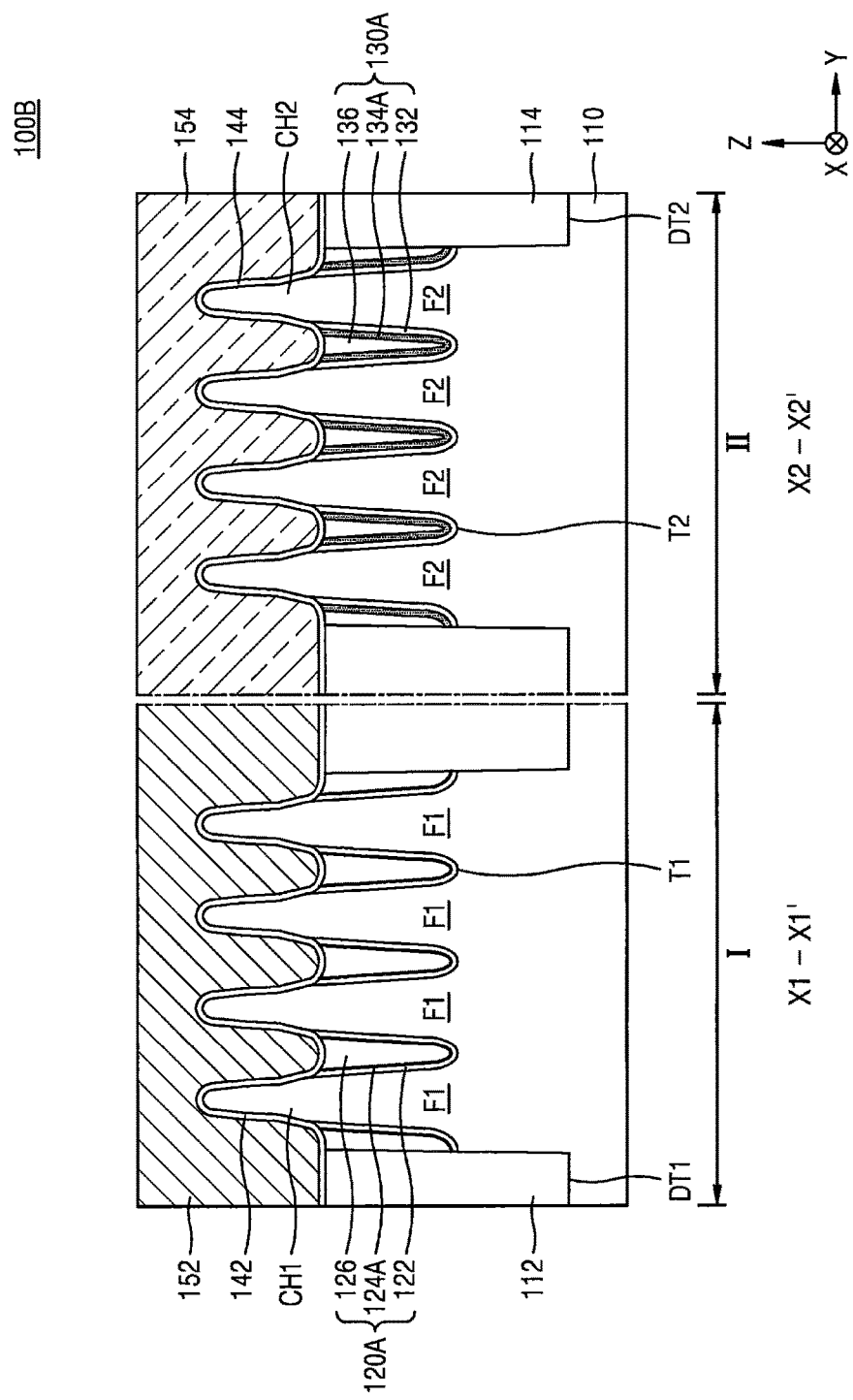
FIG. 2 is a cross-sectional view taken along the lines X1-X1' and X2-X2' of FIG. 1A according to some embodiments of the inventive concept.

FIG. 2 is a cross-sectional view of an IC device 100B taken along the lines X1-X1' and X2-X2' of FIG. 1A according to some embodiments of the inventive concept. The same reference characters and numerals in FIG. 2 as those in FIGS. 1A and 1B denote the same elements, and thus their description will be omitted herein.

Referring to FIG. 2, in the first region I, both lower sidewalls of each of the plurality of first fin-shaped active regions F1, which are below a first conductive channel region CH1 corresponding to the first fin-shaped active region F1, may be covered with a plurality of first isolation layers 120A. In the second region II, both lower sidewalls of each of the plurality of second fin-shaped active regions F2, which are below a second conductive channel region CH2 corresponding to the second fin-shaped active region F2, may be covered with a plurality of second isolation layers 130A.

Each of the plurality of first isolation layers 120A may include a first insulation liner 122, a first stressor liner 124A, and a first gap-fill insulation layer 126 sequentially stacked on an inner wall of each of the first trenches T1.

Each of the plurality of second isolation layers 130A may include a second insulation liner 132, a second stressor liner 134A, and a second gap-fill insulation layer 136 sequentially stacked on an inner wall of each of the second trenches T2.

A thickness of the first stressor liner 124A included in the first isolation layer 120A may be smaller than that of the second stressor liner 134A included in the second isolation layer 130A. For example, the first stressor liner 124A may have a thickness of about 10 Å to about 40 Å and the second stressor liner 134A may have a thickness of about 50 Å to about 100 Å, but the thicknesses of the first stressor liner 124A and the second stressor liner 134A are not limited thereto.

According to some embodiments, the first stressor liner 124A and the second stressor liner 134A may be formed of the same material. According to some embodiments, the first stressor liner 124A and the second stressor liner 134A may be formed of different materials. Details of the first stressor liner 124A and the second stressor liner 134A may be similar to those of the first stressor liner 124 and the second stressor liner 134 in FIGS. 1A and 1B.

Although not shown in FIG. 2, similar to the IC device 100A of FIG. 1C, the IC device 100B may further include a first interfacial layer IF1 interposed between the plurality of first fin-shaped active regions F1 and the first gate insulation layer 142 in the first region I, and a second interfacial layer IF2 interposed between the plurality of second fin-shaped active regions F2 and the second gate insulation layer 144 in the second region II.

Figure 3:
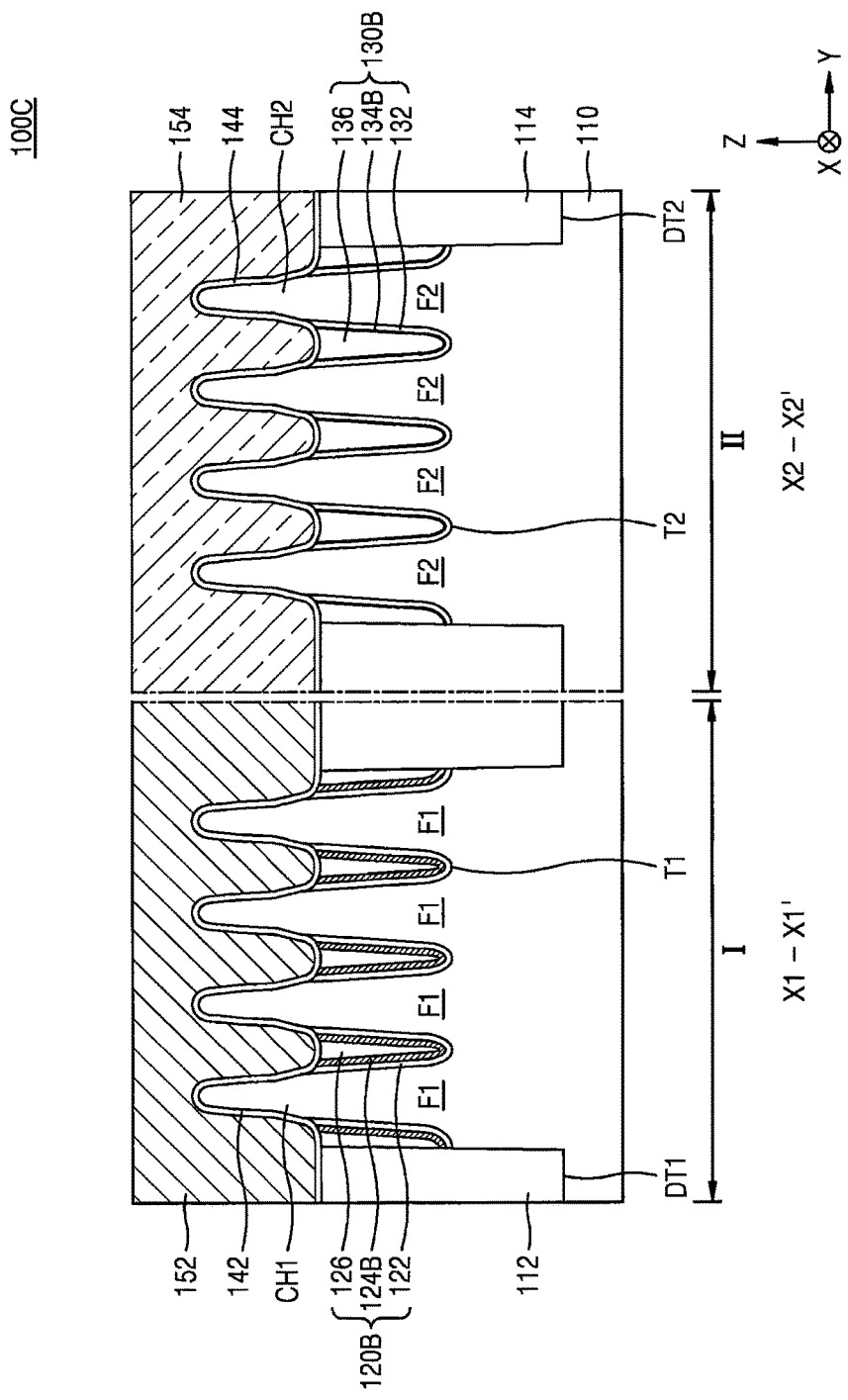
FIG. 3 is a cross-sectional view taken along the lines X1-X1' and X2-X2' of FIG. 1A according to some embodiments of the inventive concept.

FIG. 3 is a cross-sectional view of an IC device 100C taken along the lines X1-X1' and X2-X2' of FIG. 1A according to some embodiments of the inventive concept. The same reference characters and numerals in FIG. 3 as those in FIGS. 1A and 1B denote the same elements, and thus their description will be omitted herein.

Referring to FIG. 3, in the first region I, both lower sidewalls of each of the plurality of first fin-shaped active regions F1, which are below a first conductive channel region CH1 corresponding to the first fin-shaped active region F1, may be covered with a plurality of first isolation layers 120B. In the second region II, both lower sidewalls of each of the plurality of second fin-shaped active regions F2, which are below a second conductive channel region CH2 corresponding to the second fin-shaped active region F2, may be covered with a plurality of second isolation layers 130B.

Each of the plurality of first isolation layers 120B may include a first insulation liner 122, a first stressor liner 124B, and a first gap-fill insulation layer 126 sequentially stacked on an inner wall of each of the first trenches T1.

Each of the plurality of second isolation layers 130B may include a second insulation liner 132, a second stressor liner 134B, and a second gap-fill insulation layer 136 sequentially stacked on an inner wall of each of the second trenches T2.

A thickness of the first stressor liner 124B included in the first isolation layer 120B may be greater than that of the second stressor liner 134B included in the second isolation layer 130B. For example, the first stressor liner 124B may have a thickness of about 50 Å to about 100 Å and the second stressor liner 134B may have a thickness of about 10 Å to about 40 Å, but the thicknesses of the first stressor liner 124B and the second stressor liner 134B are not limited thereto.

According to some embodiments, the first stressor liner 124B and the second stressor liner 134B may be formed of the same material. According to some embodiments, the first stressor liner 124B and the second stressor liner 134B may be formed of different materials. Details of the first stressor liner 124B and the second stressor liner 134B may be similar to those of the first stressor liner 124 and the second stressor liner 134 in FIGS. 1A and 1B.

Although not shown in FIG. 3, similar to the IC device 100A of FIG. 1C, the IC device 100C may further include a first interfacial layer IF1 interposed between the plurality of first fin-shaped active regions F1 and the first gate insulation layer 142 in the first region I and a second interfacial layer IF2 interposed between the plurality of second fin-shaped active regions F2 and the second gate insulation layer 144 in the second region II.

Figure 4A:
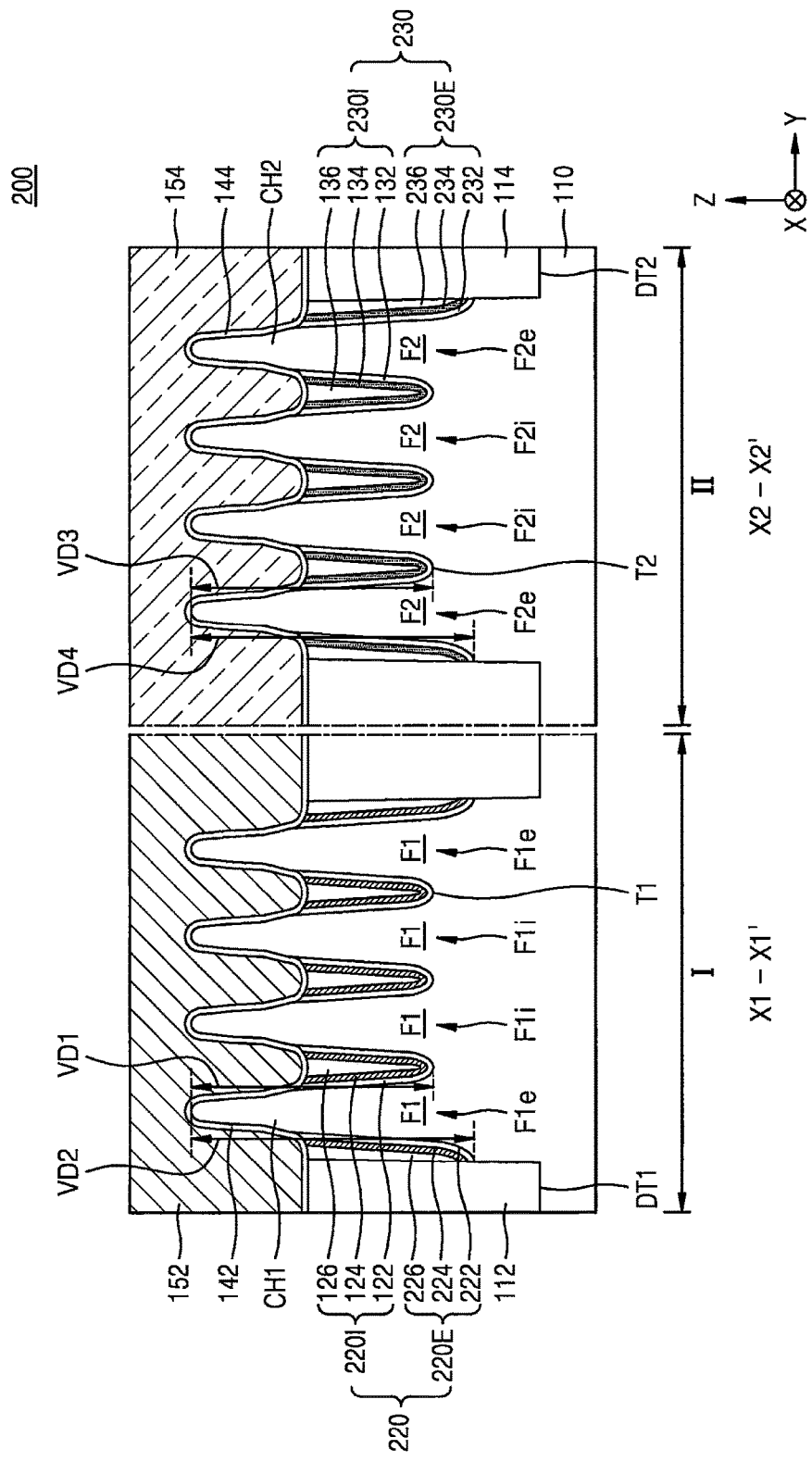
FIG. 4A is a cross-sectional view taken along the lines X1-X1' and X2-X2' of FIG. 1A according to some embodiments of the inventive concept.

FIG. 4A is a cross-sectional view of an IC device 200 taken along the lines X1-X1' and X2-X2' of FIG. 1A according to some embodiments of the inventive concept. The same reference characters and numerals in FIG. 4A as those in FIGS. 1A and 1B denote the same elements, and thus their description will be omitted herein.

Referring to FIG. 4A, a plurality of first fin-shaped active regions F1 protrude in the third direction (Z direction) perpendicular to the main surface of the substrate 110, in the first region I. The plurality of first fin-shaped active regions F1 may extend parallel to each other.

The plurality of first fin-shaped active regions F1 may include external first fin-shaped active regions F1e that are closest to first inter-device isolation insulating layers 112, and internal first fin-shaped active regions F1i that are away from the first inter-device isolation insulating layers 112 with the external first fin-shaped active regions F1e interposed therebetween.

Figure 4B:
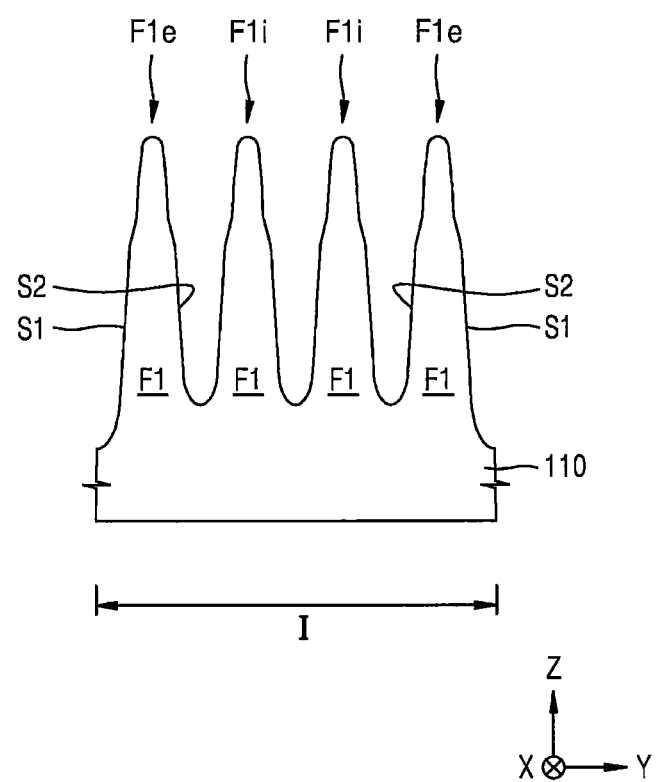
FIG. 4B is a magnified cross-sectional view of a plurality of first fin-shaped active regions illustrated in FIG. 4A.

FIG. 4B is a magnified cross-sectional view of the plurality of first fin-shaped active regions F1 of FIG. 4A.

Referring to FIGS. 4A and 4B, in each of the external first fin-shaped active regions F1e, a first sidewall S1 facing each of the first inter-device isolation insulating layers 112 and a second sidewall S2 opposite the first sidewall S1 are asymmetric with respect to a center axis of the each of the external first fin-shaped active regions F1e that extends in the third direction (Z direction) perpendicular to the main surface of the substrate 110.

As shown in FIG. 4A, a plurality of first isolation layers 220 in the first region I may include internal first isolation layers 220I that may be formed on or may cover both sidewalls of the internal first fin-shaped active regions F1i and the second sidewalls S2 of the external first fin-shaped active regions F1e, and external first isolation layers 220E that may be formed on or may cover the first sidewalls S1 of the external first fin-shaped active regions F1e.

The external first isolation layers 220E on the first sidewalls S1 may have a thickness in the third direction (Z direction) greater than that of the internal first isolation layers 220I on the second sidewalls S2 as illustrated in FIG. 4A. In some embodiment, a first vertical distance VD1 between an upper uppermost portion of the external first fin-shaped active regions F1e and a lowermost portion of the internal first isolation layers 220I may be less than a second vertical distance VD2 between the uppermost portion of the external first fin-shaped active regions F1e and a lowermost portion of the external first isolation layers 220E.

In the third direction (Z direction), a first insulation liner 222, a first stressor liner 224, and a first gap-fill insulation layer 226 included in the external first isolation layers 220E may have respective thicknesses greater than those of a first insulation liner 122, a first stressor liner 124, and a first gap-fill insulation layer 126 included in the internal first isolation layers 220I as illustrated in FIG. 4A.

The first stressor liners 224 included in the external first isolation layers 220E may contact the first inter-device isolation insulating layers 112, respectively.

In the second region II of the IC device 200 of FIG. 4A, a plurality of second fin-shaped active regions F2 may protrude in the third direction (Z direction) perpendicular to the main surface of the substrate 110. The plurality of second fin-shaped active regions F2 may extend parallel to each other.

The plurality of second fin-shaped active regions F2 may include external second fin-shaped active regions F2e that are closest to second inter-device isolation insulating layers 114, and internal second fin-shaped active regions F2i that are away from the second inter-device isolation insulating layers 114 with the external second fin-shaped active regions F2e interposed therebetween.

Figure 4C:
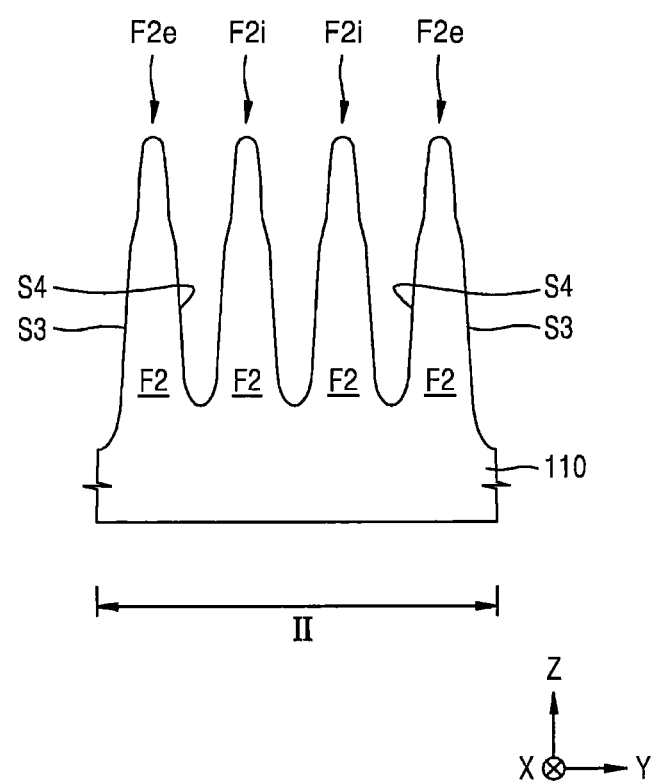
FIG. 4C is a magnified cross-sectional view of a plurality of second fin-shaped active regions illustrated in FIG. 4A.

FIG. 4C is a magnified cross-sectional view of the plurality of second fin-shaped active regions F2 of FIG. 4A.

Referring to FIGS. 4A and 4C, in each of the external second fin-shaped active regions F2e, a third sidewall S3 facing each of the second inter-device isolation insulating layers 114 and a fourth sidewall S4 opposite the third sidewall S3 are asymmetric with respect to a center axis of the each of the external second fin-shaped active regions F2e that extends in the third direction (Z direction) perpendicular to the main surface of the substrate 110.

As shown in FIG. 4A, a plurality of second isolation layers 230 in the second region II may include internal second isolation layers 230I that may be formed on or may cover both sidewalls of the internal second fin-shaped active regions F2i and the fourth sidewalls S4 of the external second fin-shaped active regions F2e, and external second isolation layers 230E that may be formed on or may cover the third sidewalls S3 of the external second fin-shaped active regions F2e.

The external second isolation layers 230E on the third sidewalls S3 may have a thickness in the third direction (Z direction) greater than that of the internal second isolation layers 230I on the fourth sidewalls S4. In some embodiment, a third vertical distance VD3 between an upper uppermost portion of the external second fin-shaped active regions F2e and a lowermost portion of the internal second isolation layers 230I may be less than a fourth vertical distance VD4 between the uppermost portion of the external second fin-shaped active regions F2e and a lowermost portion of the external second isolation layers 230E.

In the third direction (Z direction), a second insulation liner 232, a second stressor liner 234, and a second gap-fill insulation layer 236 included in the external second isolation layers 230E may have respective thicknesses greater than those of a second insulation liner 132, a second stressor liner 134, and a second gap-fill insulation layer 136 included in the internal second isolation layers 230I as illustrated in FIG. 4A.

The second stressor liners 234 included in the external second isolation layers 230E may contact the second inter-device isolation insulating layers 114, respectively.

Details of the first insulation liner 222, the first stressor liner 224, and the first gap-fill insulation layer 226 in the external first isolation layers 220E may be similar to those of the first insulation liner 122, the first stressor liner 124, and the first gap-fill insulation layer 126 in FIGS. 1A and 1B. Details of the second insulation liner 232, the second stressor liner 234, and the second gap-fill insulation layer 236 in the external second isolation layers 230E may be similar to those of the second insulation liner 132, the second stressor liner 134, and the second gap-fill insulation layer 136 in FIGS. 1A and 1B.

Figure 4D:
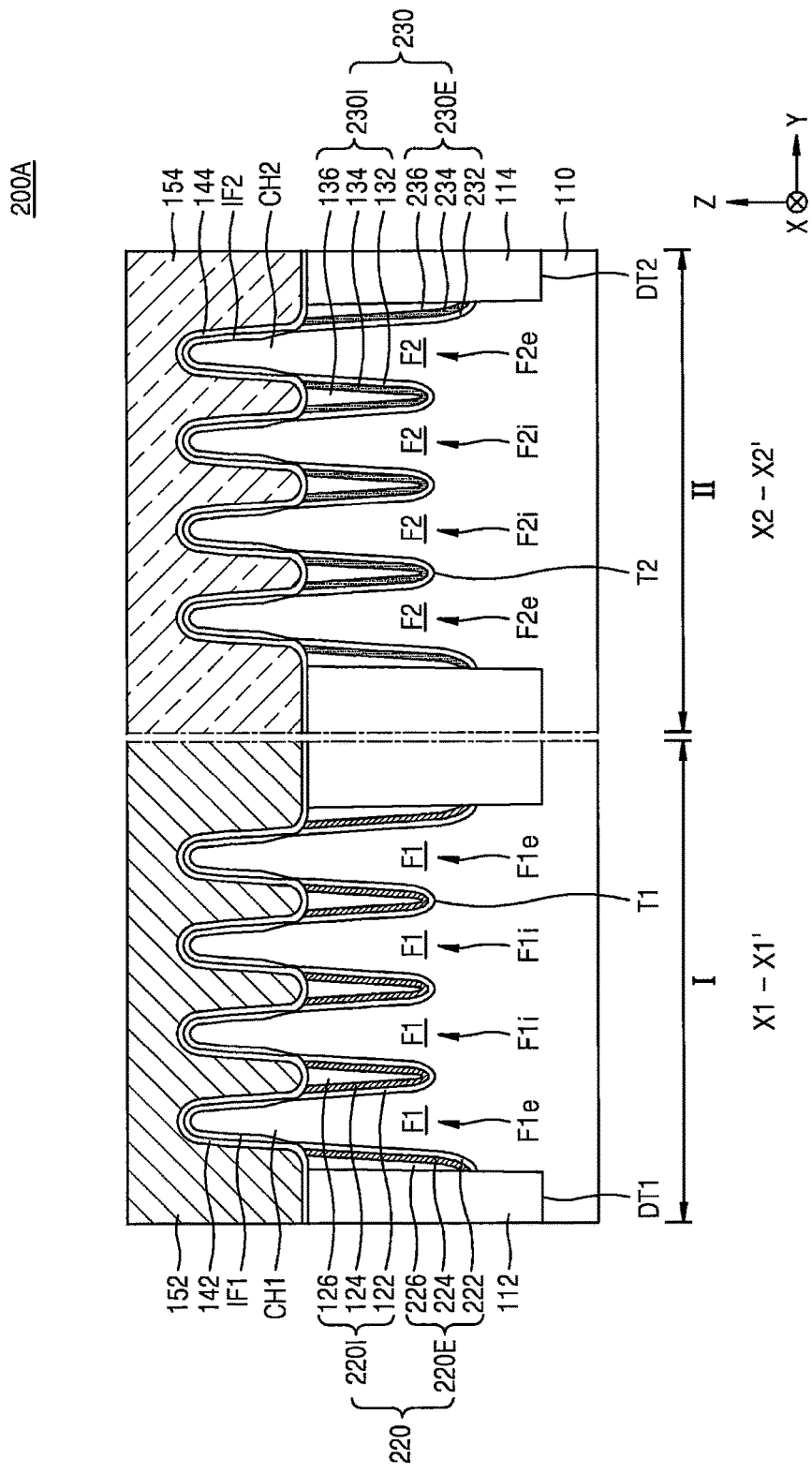
FIG. 4D is a cross-sectional view taken along the lines X1-X1' and X2-X2' of FIG. 1A according to some embodiments of the inventive concept.

FIG. 4D is a cross-sectional view of an IC device 200A taken along the lines X1-X1' and X2-X2' of FIG. 1A according to some embodiments of the inventive concept. The same reference characters and numerals in FIG. 4D as those in FIGS. 1A-4C denote the same elements, and thus their description will be omitted herein.

The IC device 200A of FIG. 4D may have a similar structure to that of the IC device 200 of FIG. 4A except a first interfacial layer IF1 that is interposed between the first conductive channel regions CH1 of the plurality of first fin-shaped active regions F1 and the first gate insulation layer 142 in the first region I and a second interfacial layer IF2 that is interposed between the second conductive channel regions CH2 of the plurality of second fin-shaped active regions F2 and the second gate insulation layer 144 in the second region II.

Figure 5:
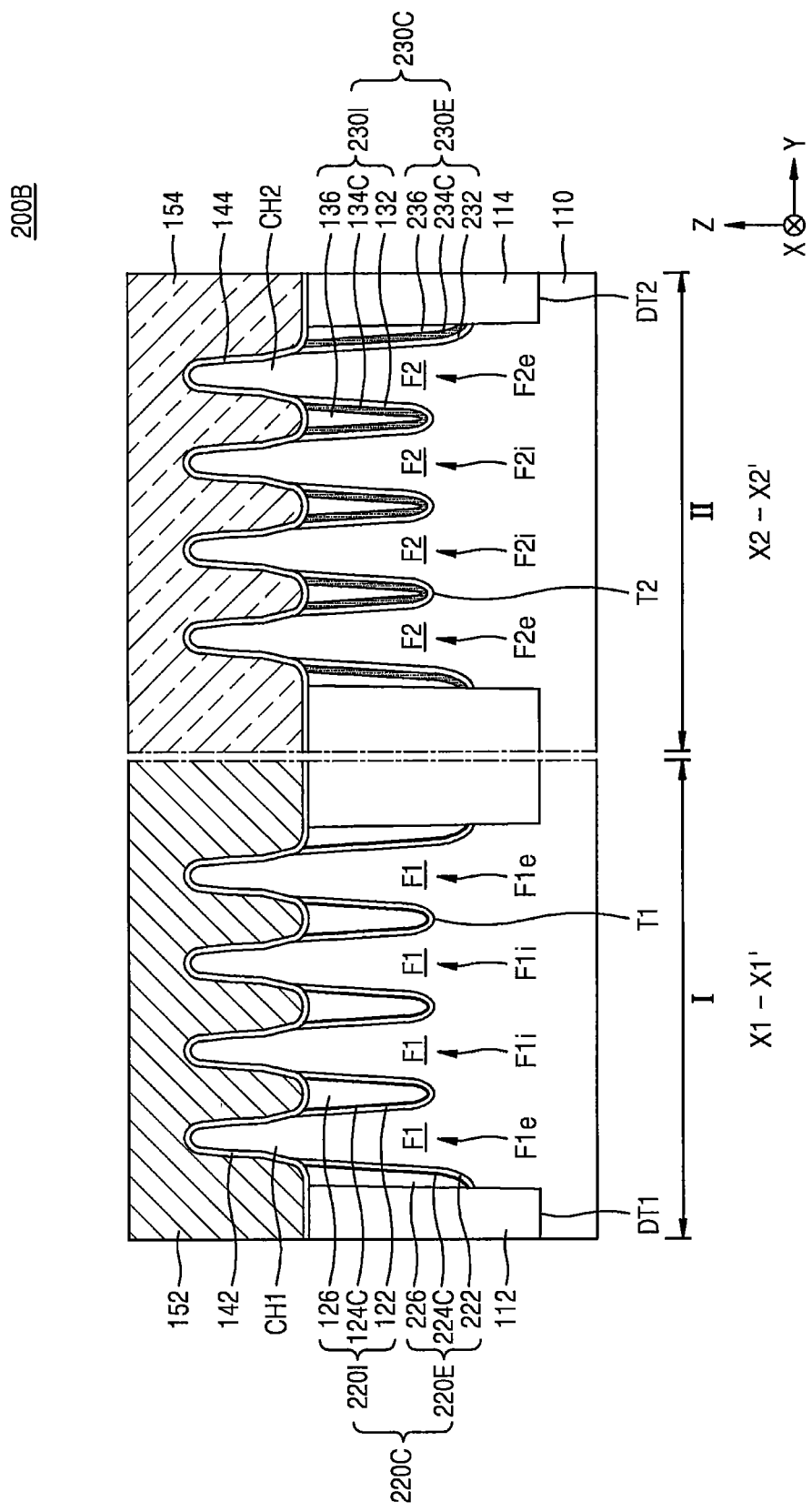
FIG. 5 is a cross-sectional view taken along the lines X1-X1' and X2-X2' of FIG. 1A according to some embodiments of the inventive concept.

FIG. 5 is a cross-sectional view of an IC device 200B taken along the lines X1-X1' and X2-X2' of FIG. 1A according to some embodiments of the inventive concept. The same reference characters and numerals in FIG. 5 as those in FIGS. 1A, 1B, and 4A-4D denote the same elements, and thus their description will be omitted herein.

Referring to FIG. 5, in the first region I, both lower sidewalls of each of the plurality of first fin-shaped active regions F1, which are below a first conductive channel region CH1 corresponding to the first fin-shaped active region F1, may be covered with a plurality of first isolation layers 220C. Similar to the plurality of first isolation layers 220 of FIG. 4A, the plurality of first isolation layers 220C may include internal first isolation layers 220I and external first isolation layers 220E.

In the second region II, both lower sidewalls of each of the plurality of second fin-shaped active regions F2, which are below a second conductive channel region CH2 corresponding to the second fin-shaped active region F2, may be covered with a plurality of second isolation layers 230C. Similar to the plurality of second isolation layers 230 of FIG. 4A, the plurality of second isolation layers 230C may include internal second isolation layers 230I and external second isolation layers 230E.

First stressor liners 124C and 224C respectively included in each of the internal first isolation layers 220I and each of the external first isolation layers 220E may be thinner than second stressor liners 134C and 234C respectively included in each of the internal second isolation layers 230I and each of the external second isolation layers 230E. For example, each of the first stressor liners 124C and 224C may have a thickness of about 10 Å to about 40 Å, and each of the second stressor liners 134C and 234C may have a thickness of about 50 Å to about 100 Å, but the thicknesses of the first stressor liners 124C and 224C and the second stressor liners 134C and 234C are not limited thereto.

According to some embodiments, the first stressor liners 124C and 224C and the second stressor liners 134C and 234C may be formed of the same material. According to some embodiments, the first stressor liners 124C and 224C and the second stressor liners 134C and 234C may be formed of different materials.

Details of the first stressor liners 124C and 224C and the second stressor liners 134C and 234C may be similar to those of the first stressor liner 124 and the second stressor liner 134 in FIGS. 1A and 1B.

Although not shown in FIG. 5, similar to the IC device 200A of FIG. 4D, the IC device 200B may further include a first interfacial layer IF1 interposed between the plurality of first fin-shaped active regions F1 and the first gate insulation layer 142 in the first region I and a second interfacial layer IF2 interposed between the plurality of second fin-shaped active regions F2 and the second gate insulation layer 144 in the second region II.

Figure 6:
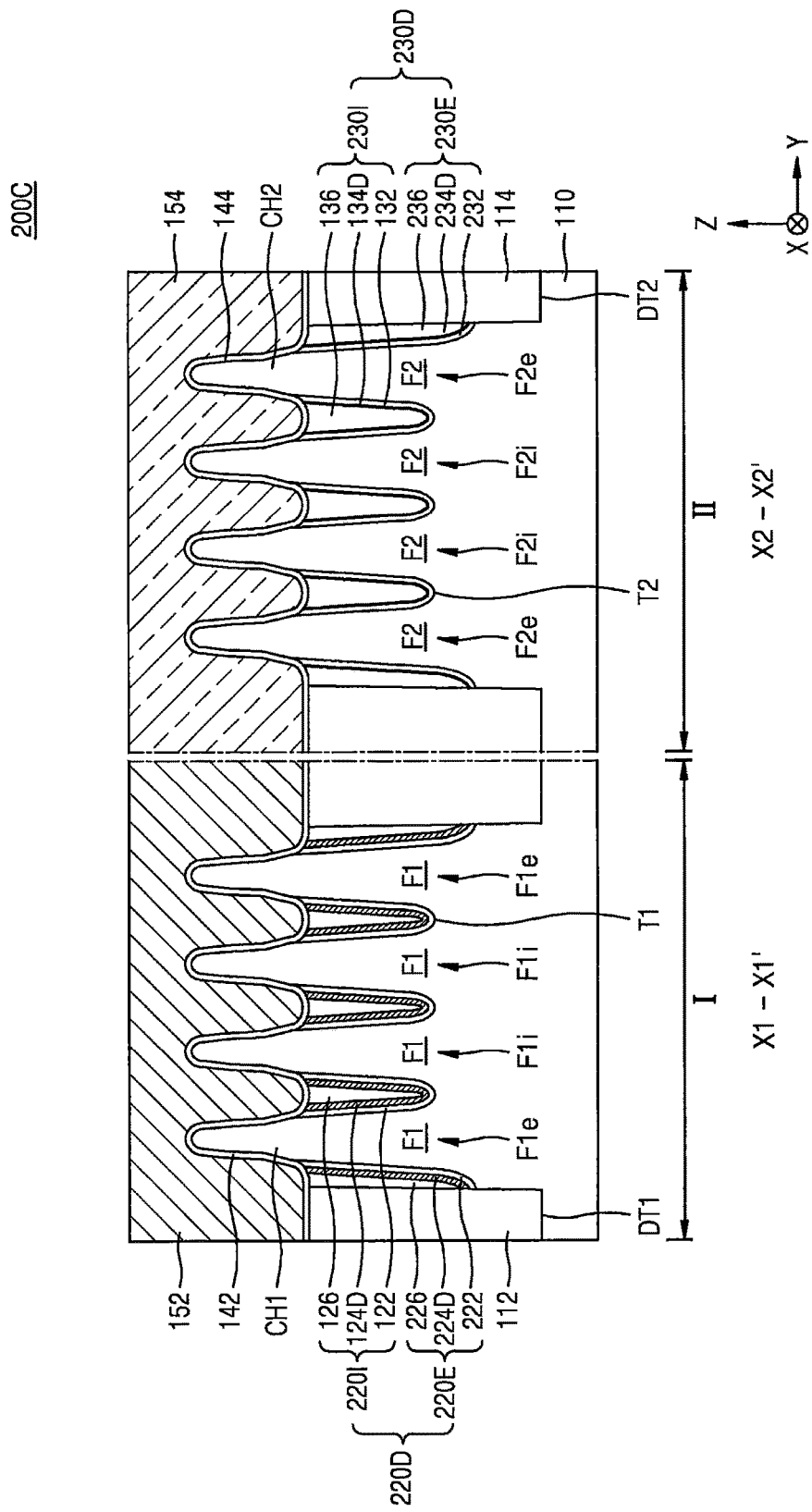
FIG. 6 is a cross-sectional view taken along the lines X1-X1' and X2-X2' of FIG. 1A according to some embodiments of the inventive concept.

FIG. 6 is a cross-sectional view of an IC device 200C taken along the lines X1-X1' and X2-X2' of FIG. 1A according to some embodiments of the inventive concept. The same reference characters and numerals in FIG. 6 as those in FIGS. 1A, 1B, and 4A-4D denote the same elements, and thus their description will be omitted herein.

Referring to FIG. 6, in the first region I, both lower sidewalls of each of the plurality of first fin-shaped active regions F1, which are below a first conductive channel region CH1 corresponding to the first fin-shaped active region F1, may be covered with a plurality of first isolation layers 220D. Similar to the plurality of first isolation layers 220 of FIG. 4A, the plurality of first isolation layers 220D may include internal first isolation layers 220I and external first isolation layers 220E.

In the second region II, both lower sidewalls of each of the plurality of second fin-shaped active regions F2, which are below a second conductive channel region CH2 corresponding to the second fin-shaped active region F2, may be covered with a plurality of second isolation layers 230D. Similar to the plurality of second isolation layers 230 of FIG. 4A, the plurality of second isolation layers 230D may include internal second isolation layers 230I and external second isolation layers 230E.

First stressor liners 124D and 224D respectively included in each of the internal first isolation layers 220I and each of the external first isolation layers 220E may be thinner than second stressor liners 134D and 234D respectively included in each of the internal second isolation layers 230I and each of the external second isolation layers 230E. For example, each of the first stressor liners 124D and 224D may have a thickness of about 10 Å to about 40 Å, and each of the second stressor liners 134D and 234D may have a thickness of about 50 Å to about 100 Å, but the thicknesses of the first stressor liners 124D and 224D and the second stressor liners 134D and 234D are not limited thereto.

According to some embodiments, the first stressor liners 124D and 224D and the second stressor liners 134D and 234D may be formed of the same material. According to some embodiments, the first stressor liners 124D and 224D and the second stressor liners 134D and 234D may be formed of different materials.

Details of the first stressor liners 124D and 224D and the second stressor liners 134D and 234D may be similar to those of the first stressor liner 124 and the second stressor liner 134 in FIGS. 1A and 1B.

Although not shown in FIG. 6, similar to the IC device 200A of FIG. 4D, the IC device 200C may further include a first interfacial layer IF1 interposed between the plurality of first fin-shaped active regions F1 and the first gate insulation layer 142 in the first region I and a second interfacial layer IF2 interposed between the plurality of second fin-shaped active regions F2 and the second gate insulation layer 144 in the second region II.

Figure 7:
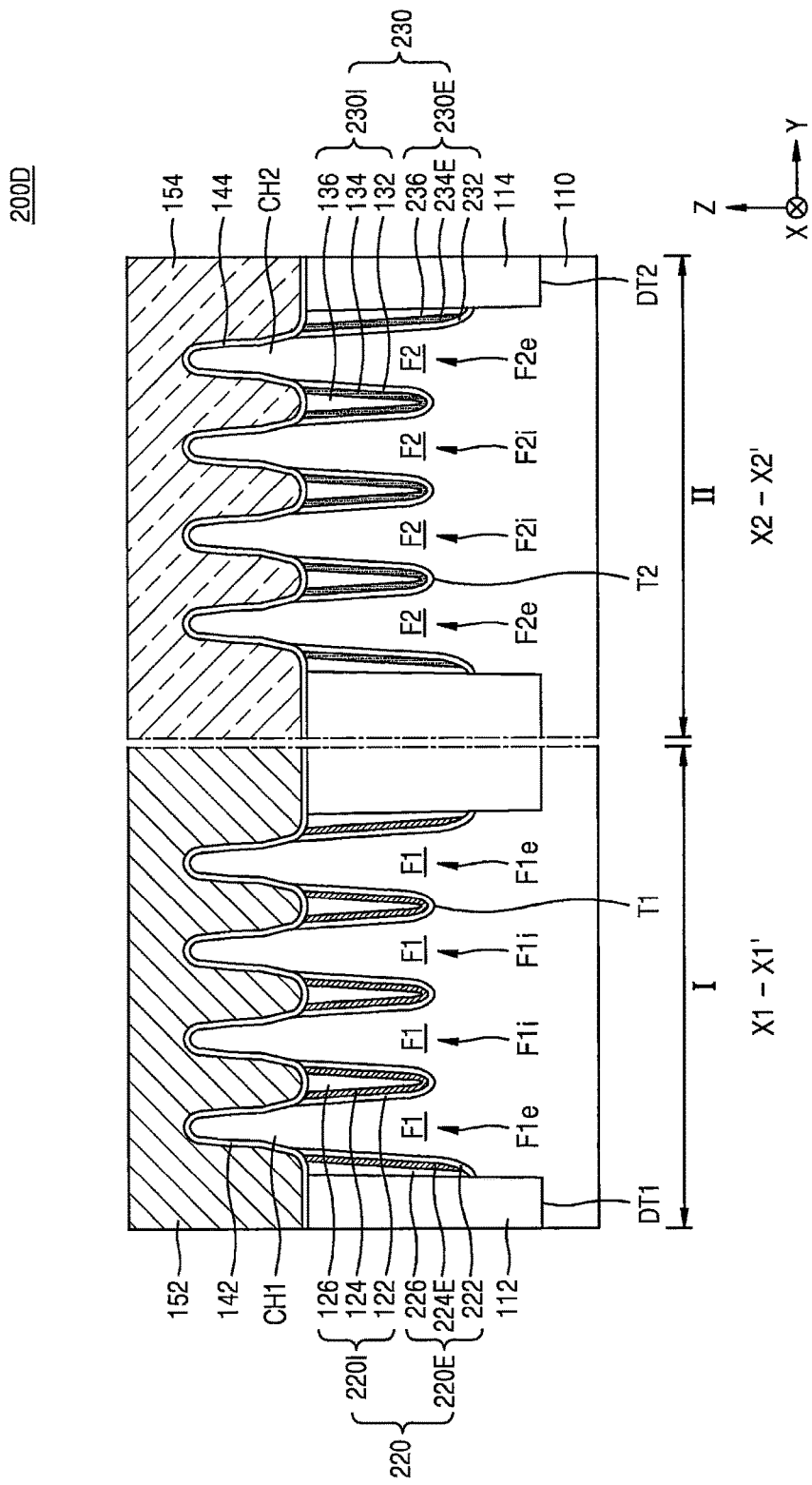
FIG. 7 is a cross-sectional view taken along the lines X1-X1' and X2-X2' of FIG. 1A according to some embodiments of the inventive concept.

FIG. 7 is a cross-sectional view of an IC device 200D taken along the lines X1-X1' and X2-X2' of FIG. 1A according to some embodiments of the inventive concept. The same reference characters and numerals in FIG. 7 as those in FIGS. 1A, 1B, and 4A-4C denote the same elements, and thus their description will be omitted herein.

Referring to FIG. 7, first stressor liners 224E respectively included in external first isolation layers 220E in the first region I are spaced apart from first inter-device isolation insulating layers 112. Second stressor liners 234E respectively included in external second isolation layers 230E in the second region II are spaced apart from second inter-device isolation insulating layers 114.

In the third direction (Z direction), a first stressor liner 224E included in each external first isolation layer 220E and a second stressor liner 234E included in each external second isolation layer 230E may have thicknesses greater than those of a first stressor liner 124 and a second stressor liner 134 respectively included in each internal first isolation layer 220I and each internal second isolation layer 230I.

Although not shown in FIG. 7, similar to the IC device 200A of FIG. 4D, the IC device 200D may further include a first interfacial layer IF1 interposed between the plurality of first fin-shaped active regions F1 and the first gate insulation layer 142 in the first region I and a second interfacial layer IF2 interposed between the plurality of second fin-shaped active regions F2 and the second gate insulation layer 144 in the second region II.

Figure 8A:
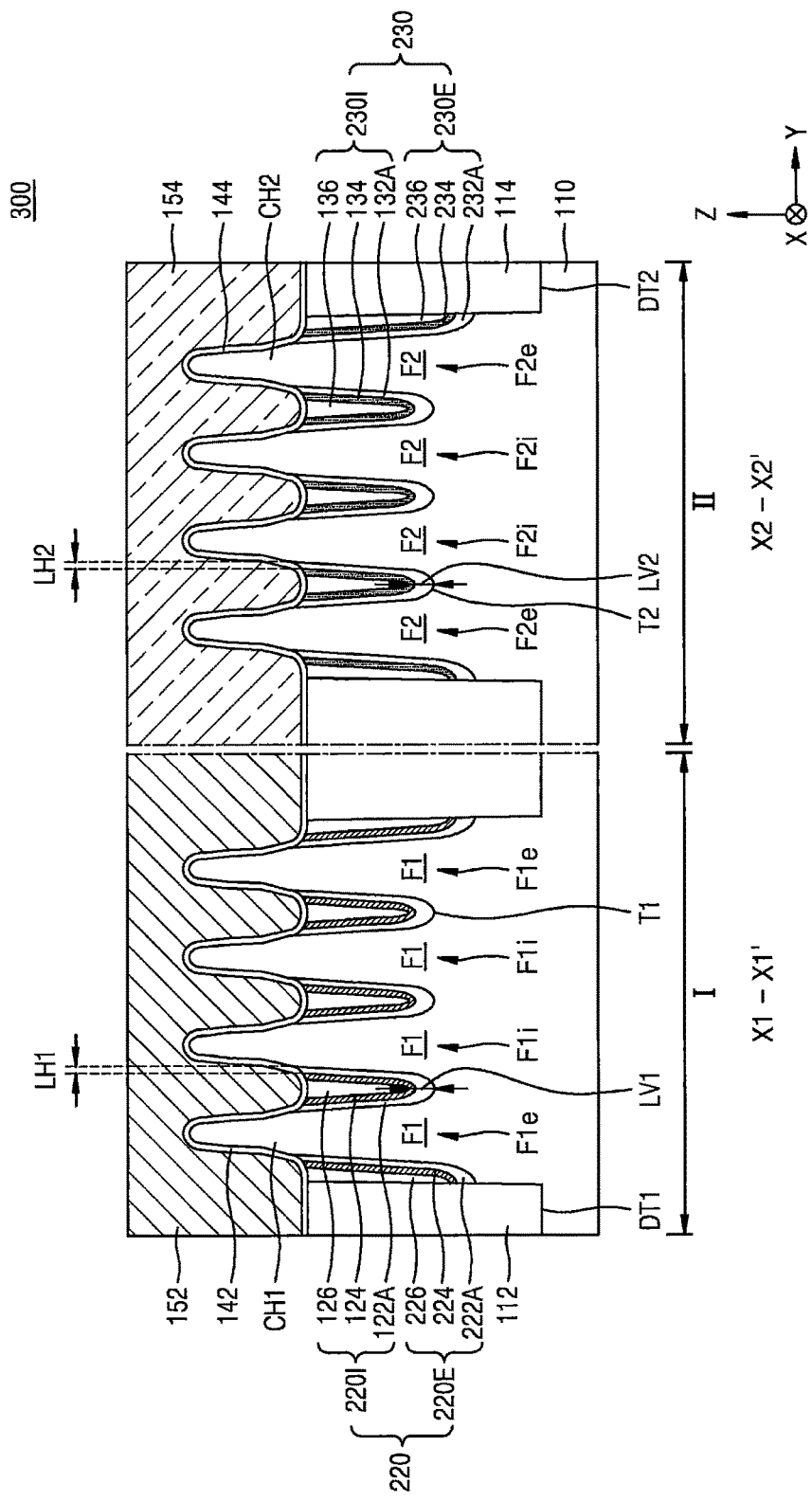
FIG. 8A is a cross-sectional view taken along the lines X1-X1' and X2-X2' of FIG. 1A according to some embodiments of the inventive concept.

FIG. 8A is a cross-sectional view of an IC device 300 taken along the lines X1-X1' and X2-X2' of FIG. 1A according to some embodiments of the inventive concept. The same reference characters and numerals in FIG. 8A as those in FIGS. 1A-4D denote the same elements, and thus their description will be omitted herein.

The IC device 300 of FIG. 8 may have a similar structure to that of the IC device 200 of FIGS. 4A-4C except that thicknesses of first insulation liners 122A and 222A and second insulation liners 132A and 232A are each not uniform (i.e. constant).

Referring to FIG. 8A, in the first region I, first insulation liners 122A and 222A respectively included in each of the internal first isolation layers 220I and each of the external first isolation layers 220E are thicker at portions contacting the lower surfaces of the first trenches T1 than at portions contacting the sidewalls thereof. Accordingly, in the plurality of first isolation layers 220, a vertical shortest distance LV1 between each of the first stressor liners 124 and 224 and a lower surface of each first isolation layer 220 is greater than a horizontal shortest distance LH1 between each of the first stressor liners 124 and 224 and a sidewall of each first isolation layer 220.

In the second region II, second insulation liners 132A and 232A respectively included in each of the internal second isolation layers 230I and each of the external second isolation layers 230E are thicker at portions contacting the lower surfaces of the second trenches T2 than at portions contacting the sidewalls thereof. Accordingly, in the plurality of second isolation layers 230, a vertical shortest distance LV2 between each of the second stressor liners 134 and 234 and a lower surface of each second isolation layer 230 is greater than a horizontal shortest distance LH2 between each of the second stressor liners 134 and 234 and a sidewall of each second isolation layer 230.

Details of the first insulation liners 122A and 222A and the second insulation liners 132A and 232A may be similar to those of the first and second insulation liners 122 and 132 in FIGS. 4A-4C.

In the first region I and the second region II, the first stressor liners 224 may contact the first inter-device isolation insulating layers 112, and the second stressor liners 234 may contact the second inter-device isolation insulating layers 114.

Figure 8B:
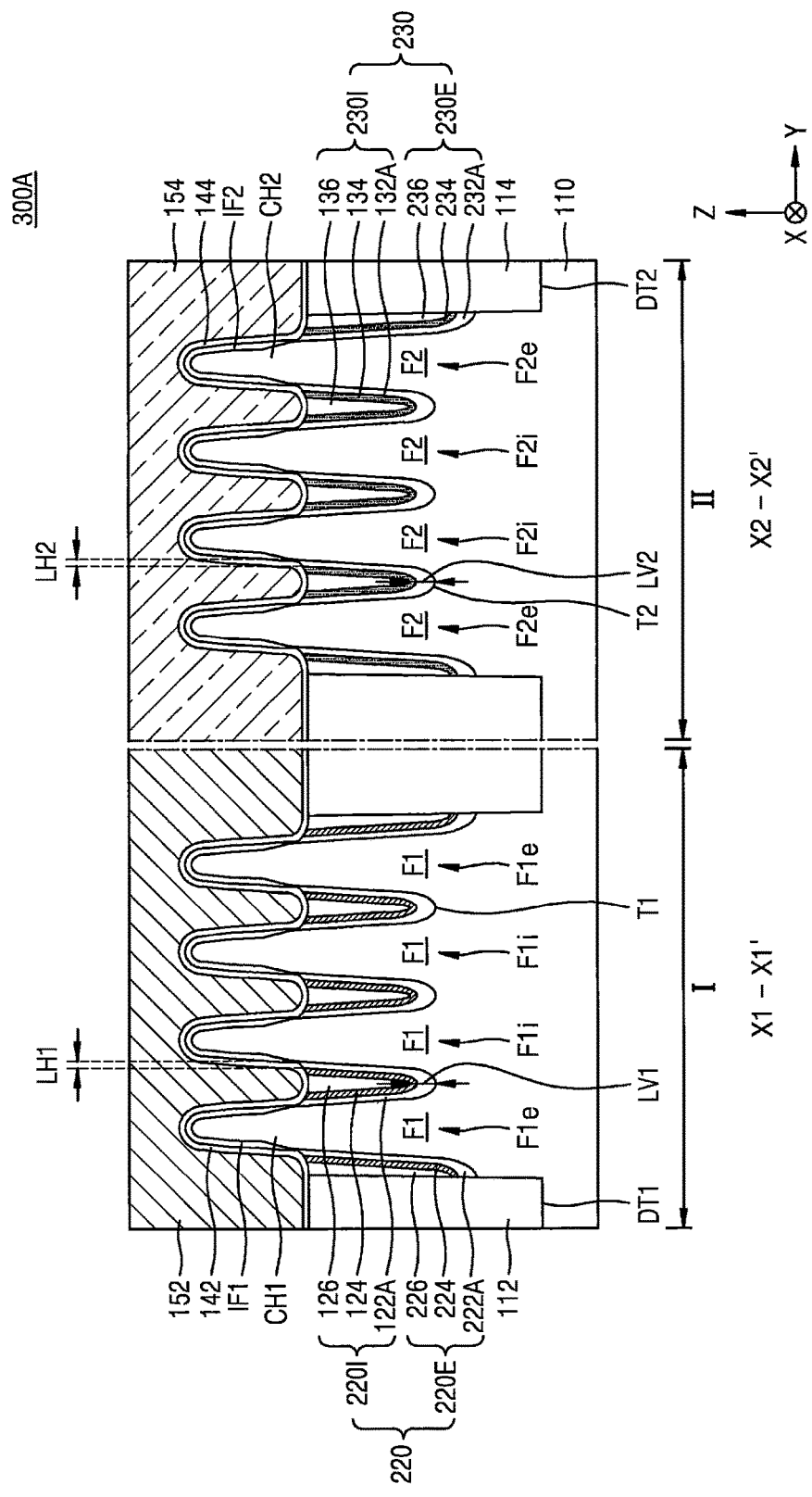
FIG. 8B is a cross-sectional view taken along the lines X1-X1' and X2-X2' of FIG. 1A according to some embodiments of the inventive concept.

FIG. 8B is a cross-sectional view of an IC device 300A taken along the lines X1-X1' and X2-X2' of FIG. 1A according to some embodiments of the inventive concept. The same reference characters and numerals in FIG. 8B as those in FIGS. 1A-4D denote the same elements, and thus their description will be omitted herein.

The IC device 300A of FIG. 8B may have a similar structure to that of the IC device 300 of FIG. 8A except that a first interfacial layer IF1 is interposed between the first conductive channel regions CH1 of the plurality of first fin-shaped active regions F1 and the first gate insulation layer 142 in the first region I, and a second interfacial layer IF2 is interposed between the second conductive channel regions CH2 of the plurality of second fin-shaped active regions F2 and the second gate insulation layer 144 in the second region II.

Figure 9:
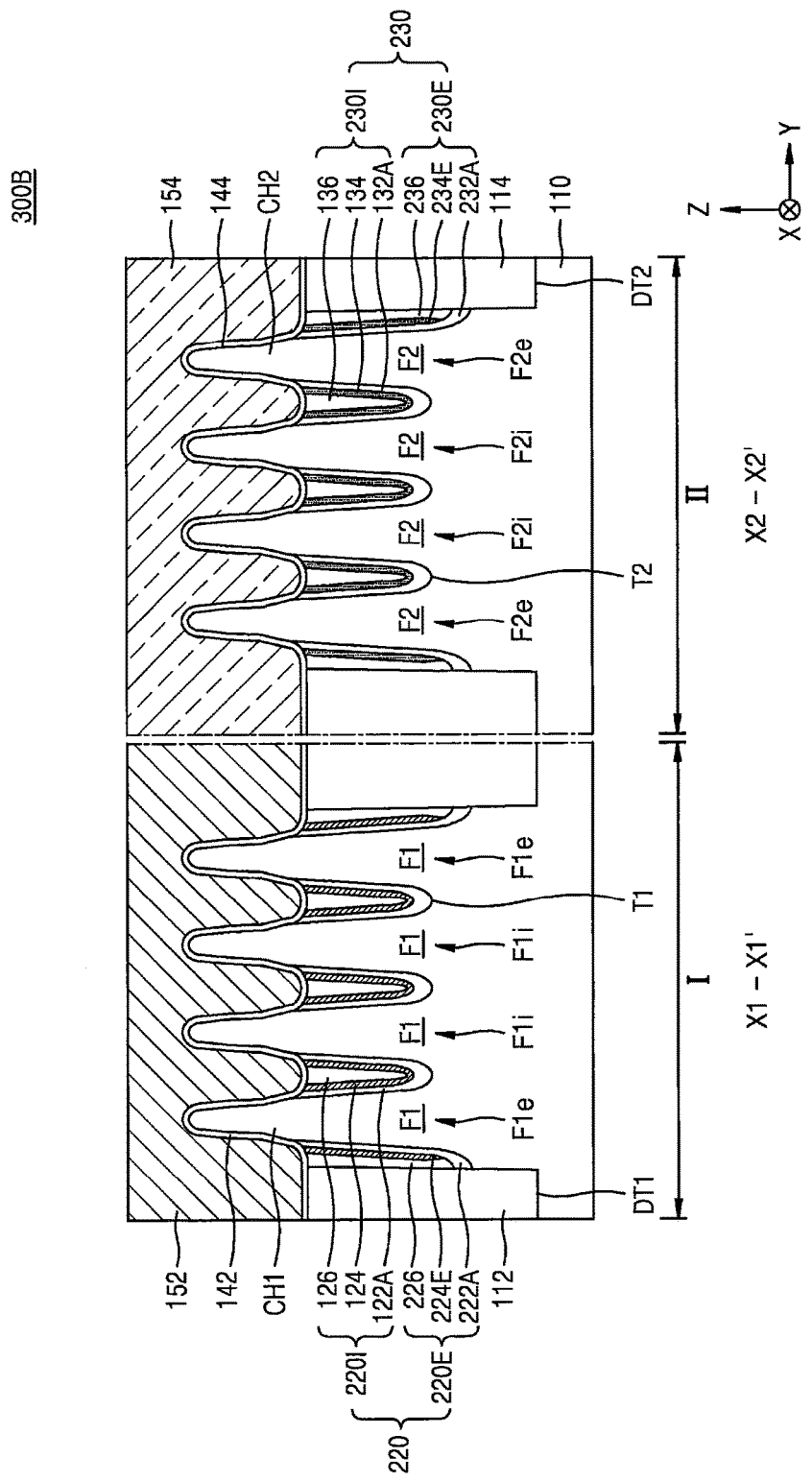
FIG. 9 is a cross-sectional view taken along the lines X1-X1' and X2-X2' of FIG. 1A according to some embodiments of the inventive concept.

FIG. 9 is a cross-sectional view of an IC device 300B taken along the lines X1-X1' and X2-X2' of FIG. 1A according to some embodiments of the inventive concept. The same reference characters and numerals in FIG. 9 as those in FIGS. 1A-8B denote the same elements, and thus their description will be omitted herein.

The IC device 300B of FIG. 9 may have a similar structure to that of the IC device 300 of FIG. 8A except that, in the first region I and the second region II, first stressor liners 224E are respectively spaced apart from the first inter-device isolation insulating layers 112, and second stressor liners 234E are respectively spaced apart from the second inter-device isolation insulating layers 114.

Although not shown in FIG. 9, similar to the IC device 300A of FIG. 8B, the IC device 300B may further include a first interfacial layer IF1 interposed between the plurality of first fin-shaped active regions F1 and the first gate insulation layer 142 in the first region I and a second interfacial layer IF2 interposed between the plurality of second fin-shaped active regions F2 and the second gate insulation layer 144 in the second region II.

Figure 10:
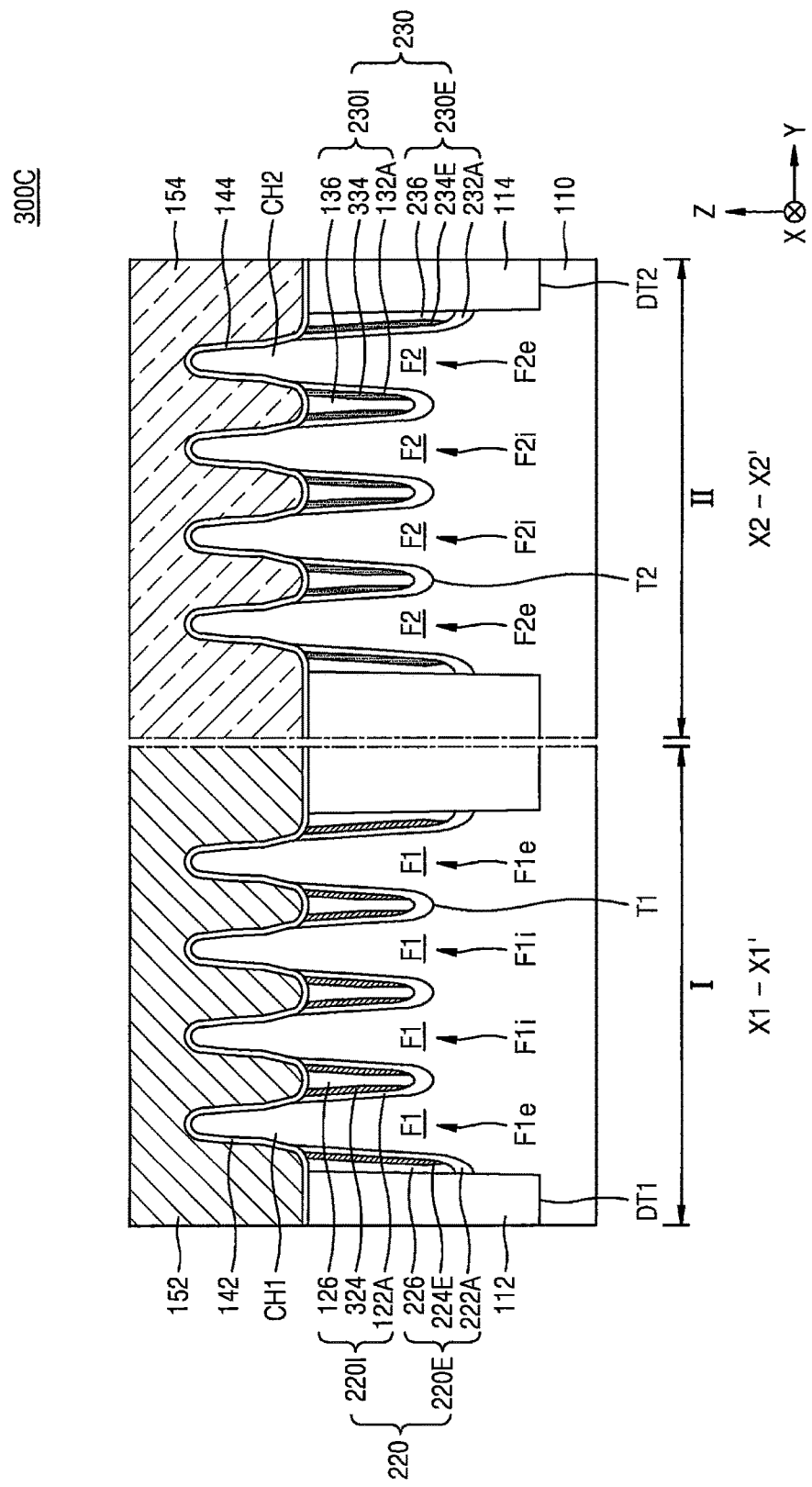
FIG. 10 is a cross-sectional view taken along the lines X1-X1' and X2-X2' of FIG. 1A according to some embodiments of the inventive concept.

FIG. 10 is a cross-sectional view of an IC device 300C taken along the lines X1-X1' and X2-X2' of FIG. 1A according to some embodiments of the inventive concept. The same reference characters and numerals in FIG. 10 as those in FIGS. 1A-9 denote the same elements, and thus their description will be omitted herein.

The IC device 300C of FIG. 10 may have a similar structure to that of the IC device 300B of FIG. 9 except that each internal first isolation layer 220I includes two separate first stressor liners 324 and each internal second isolation layer 230I includes two separate second stressor liners 334.

In the first region I, each of a plurality of internal first isolation layers 220I includes two separate first stressor liners 324. The two separate first stressor liners 324 are respectively formed on or may cover respective sidewalls of different first fin-shaped active regions F1 of the plurality of first fin-shaped active regions F1.

In the second region II, each of a plurality of internal second isolation layers 230I includes two separate second stressor liners 334. The two separate second stressor liners 334 are respectively formed on or may cover respective sidewalls of different second fin-shaped active regions F2 of the plurality of second fin-shaped active regions F2.

Although not shown in FIG. 10, similar to the IC device 300A of FIG. 8B, the IC device 300C may further include a first interfacial layer IF1 interposed between the plurality of first fin-shaped active regions F1 and the first gate insulation layer 142 in the first region I and a second interfacial layer IF2 interposed between the plurality of second fin-shaped active regions F2 and the second gate insulation layer 144 in the second region II.

Figure 11A:
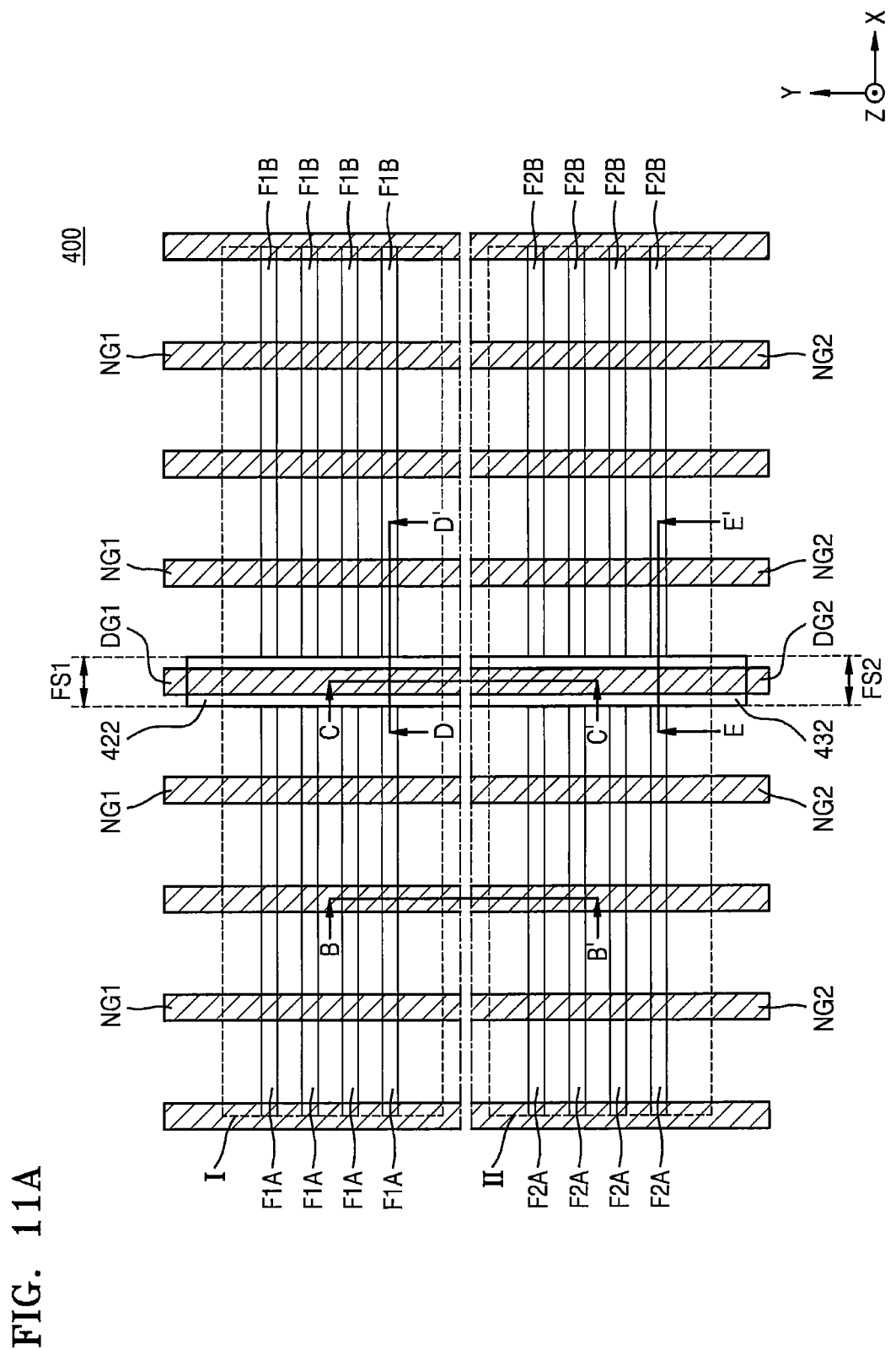
FIG. 11A is a plan view showing major components of an IC device according to some embodiments of the inventive concept.
Figure 11B:
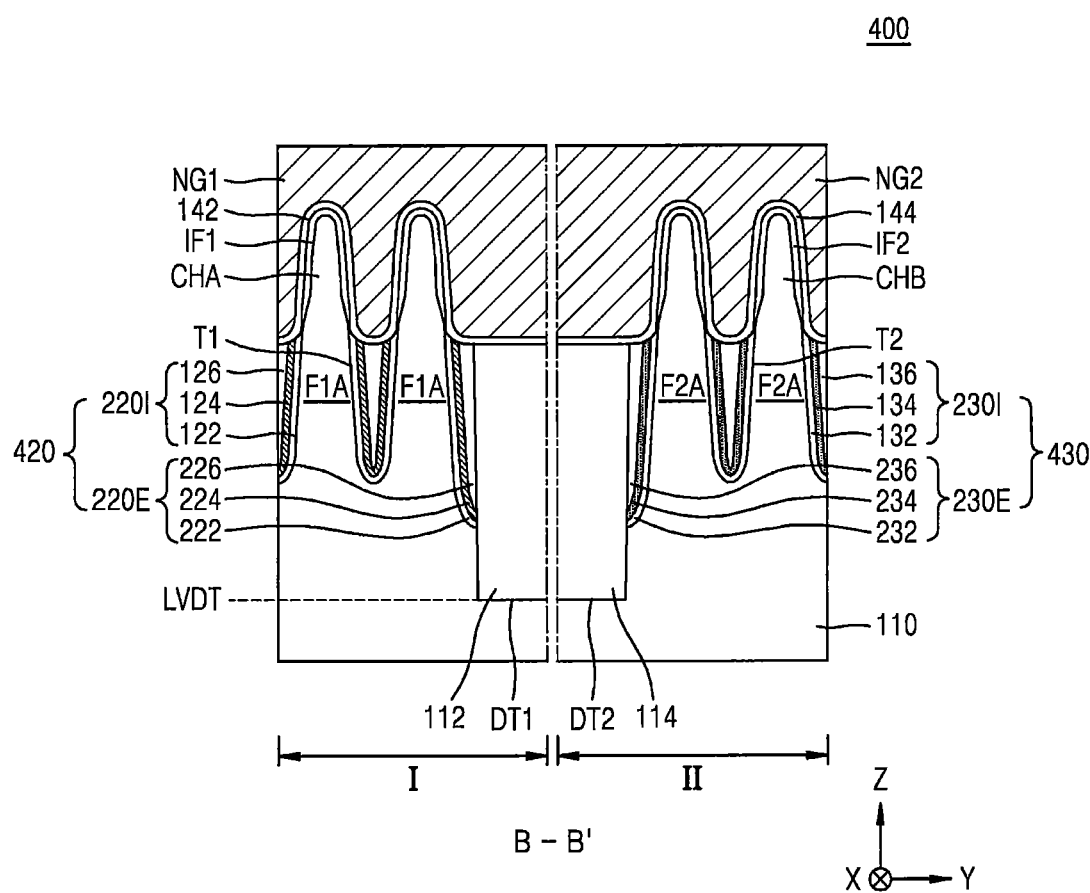
FIG. 11B is a cross-sectional view taken along the line B-B' of FIG. 11A.
Figure 11C:
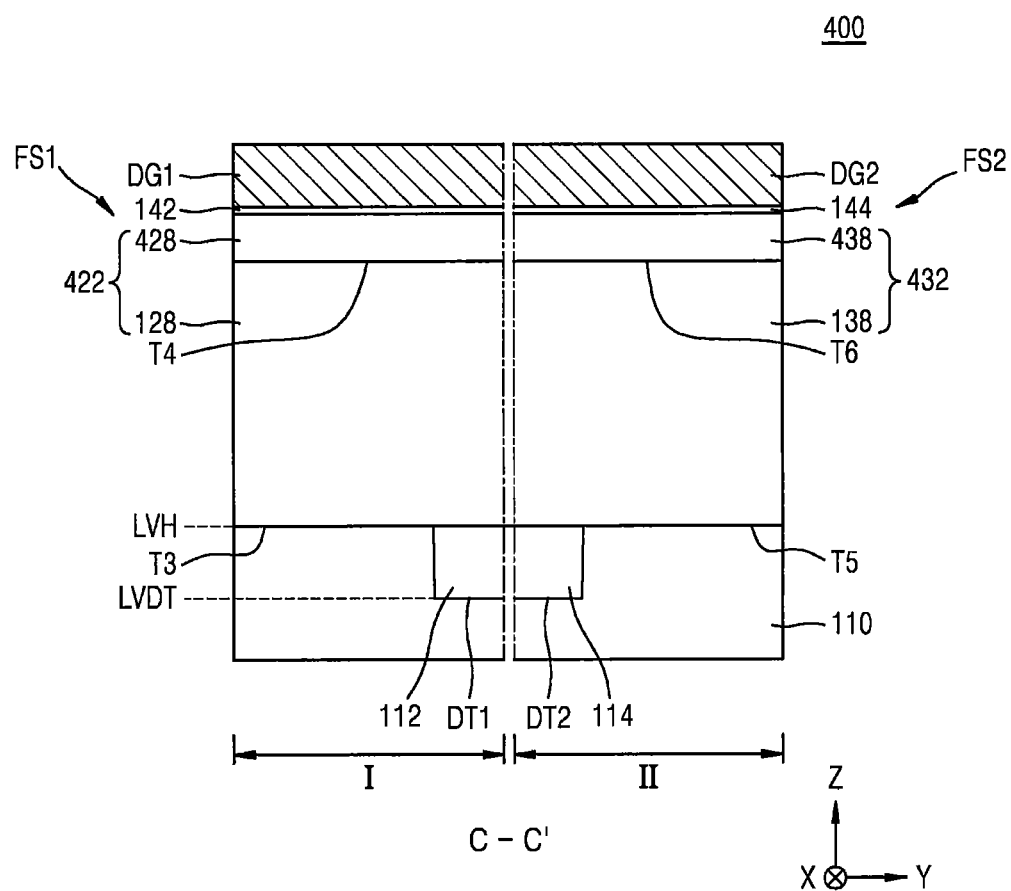
FIG. 11C is a cross-sectional view taken along the line C-C' of FIG. 11A.
Figure 11D:
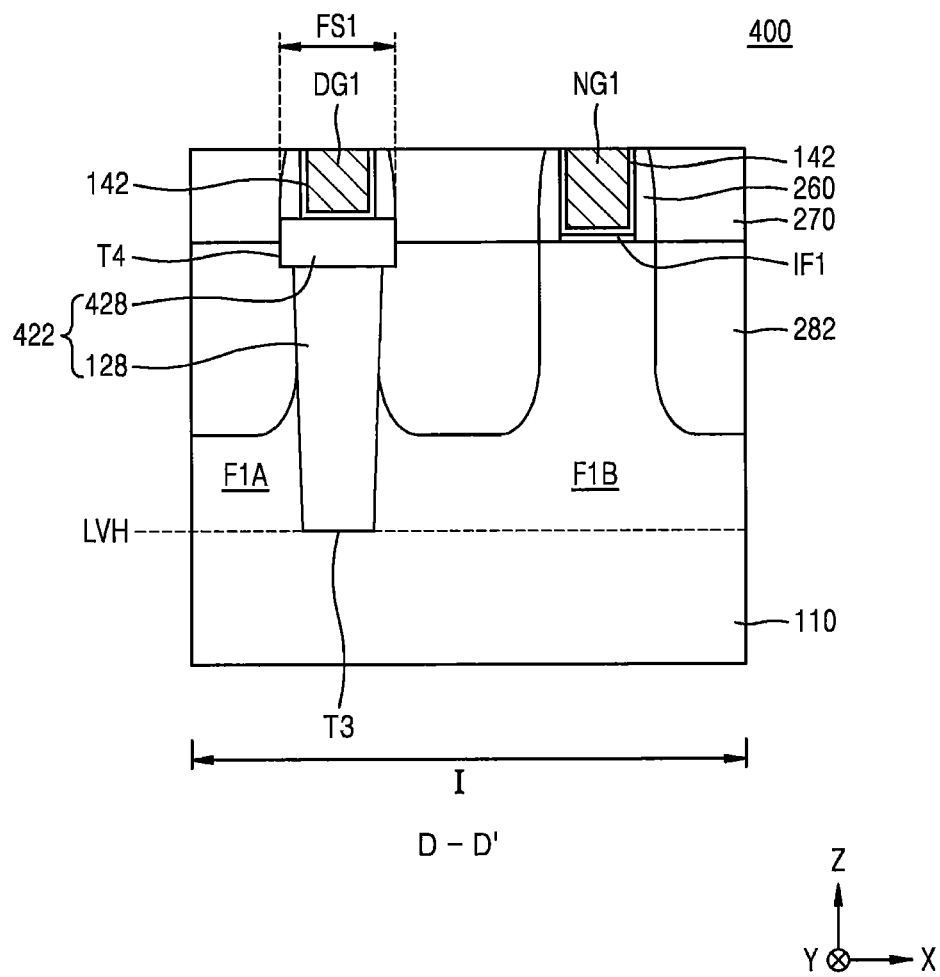
FIG. 11D is a cross-sectional view taken along the line D-D' of FIG. 11A.
Figure 11E:
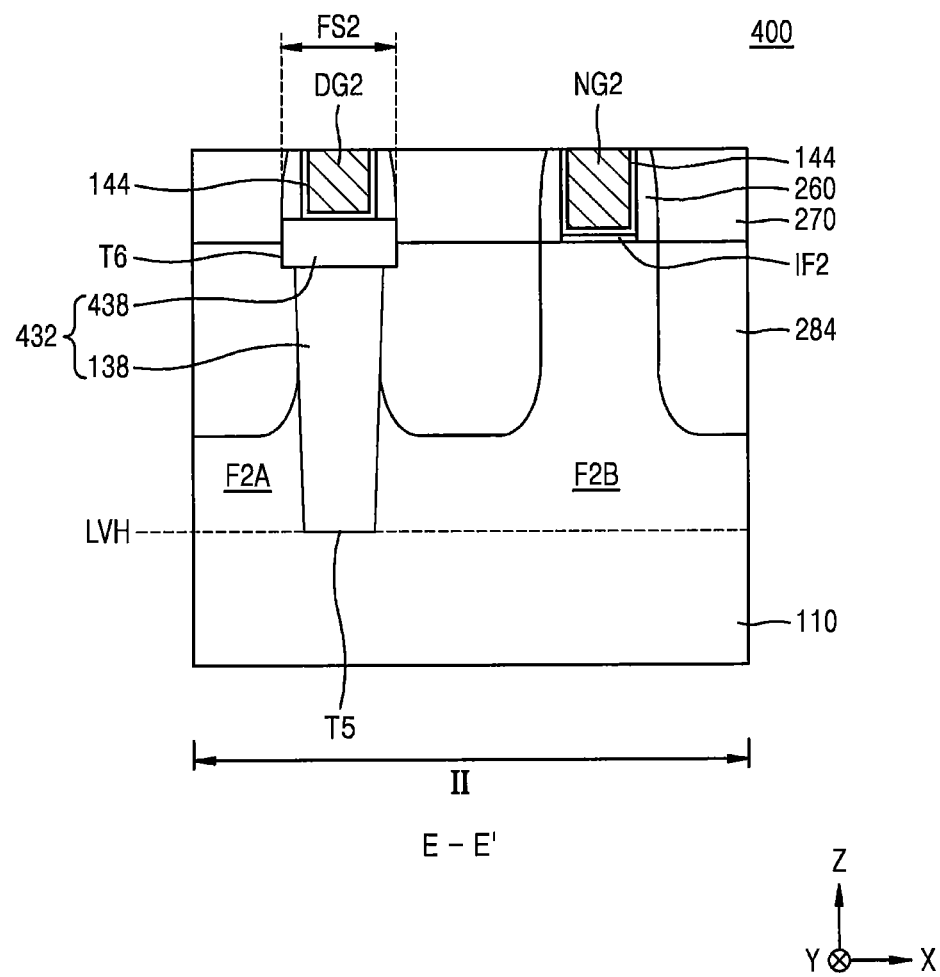
FIG. 11E is a cross-sectional view taken along the line E-E' of FIG. 11A.

FIG. 11A is a plan view showing major components of the IC device 400 according to some embodiments of the inventive concept, FIG. 11B is a cross-sectional view taken along the line B-B' of FIG. 11A, FIG. 11C is a cross-sectional view taken along the line C-C' of FIG. 11A, FIG. 11D is a cross-sectional view taken along the line D-D' of FIG. 11A, and FIG. 11E is a cross-sectional view taken along the line E-E' of FIG. 11A. The same reference characters and numerals in FIGS. 11A-11E as those in FIGS. 1A-10 denote the same elements, and thus their description will be omitted herein.

Referring to FIGS. 11A-11E, the IC device 400 includes a substrate 110 having a first region I and a second region II.

A plurality of first fin-shaped active regions F1A and F1B may protrude in a third direction (Z direction) perpendicular to a main surface of the substrate 110, in the first region I of the substrate 110. Each of the plurality of first fin-shaped active regions F1A and F1B may have a first conductive channel region CHA. Both lower sidewalls of each of the plurality of first fin-shaped active regions F1A and F1B which are below the first conductive channel region CHA may be covered with low-level first isolation layers 420.

A plurality of second fin-shaped active regions F2A and F2B may protrude in the Z direction, in the second region II of the substrate 110. Each of the plurality of second fin-shaped active regions F2A and F2B may have a second conductive channel region CHB. Both lower sidewalls of each of the plurality of second fin-shaped active regions F2A and F2B that are below the second conductive channel region CHB may be covered with low-level second isolation layers 430.

The plurality of first fin-shaped active regions F1A and F1B and the plurality of second fin-shaped active regions F2A and F2B may each extend in a first direction (X direction) on the substrate 110 so as to be parallel to each other. The plurality of first fin-shaped active regions F1A may be spaced part from the plurality of first fin-shaped active region F1B in the X direction and a first fin separation region FS1 may be interposed between the plurality of first fin-shaped active regions F1A and the plurality of first fin-shaped active region F1B. The plurality of second fin-shaped active regions F2A may be spaced part from the plurality of second fin-shaped active region F2B in the X direction and a second fin separation region FS2 may be interposed between the plurality of second fin-shaped active regions F2A and the plurality of second fin-shaped active region F2B. According to some embodiments, the first fin separation region FS1 and the second fin separation region FS2 may be connected to each other. According to some embodiments, the first fin separation region FS1 and the second fin separation region FS2 may be spaced apart from each other.

Although four first fin-shaped active regions F1A, four first fin-shaped active regions F1B, four second fin-shaped active regions F2A, and four second fin-shaped active regions F2B are shown in FIG. 11A, the inventive concept is not limited thereto. For example, in the first region I and the second region II, the numbers of first fin-shaped active regions F1A, first fin-shaped active regions F1B, second fin-shaped active regions F2A, and second fin-shaped active regions F2B may vary.

In the first region I and the second region II of the substrate 110, a plurality of normal gates NG1 and NG2, dummy gates DG1 and DG2 may extend in a second direction (Y direction) that intersects with the first direction (X direction) in which each of the plurality of first fin-shaped active regions F1A and F1B and the plurality of second fin-shaped active regions F2A and F2B extends. The dummy gates DG1 and DG2 may be in the first and second fin separation regions FS1 and FS2, respectively.

In the first region I, a first interfacial layer IF1 and a first gate insulation layer 142 may be interposed between the first conductive channel regions CHA of the plurality of first fin-shaped active regions F1A and F1B and the plurality of normal gates NG1. In the second region II, a second interfacial layer IF2 and a second gate insulation layer 144 may be interposed between the second conductive channel regions CHB of the plurality of second fin-shaped active regions F2A and F2B and the plurality of normal gates NG2.

In the IC device 400, a plurality of low-level first isolation layers 420 and a high-level first isolation layer 422 for providing insulation regions may be formed between the plurality of first fin-shaped active regions F1A and F1B in the first region I of the substrate 110.

Similar to the plurality of first isolation layers 220 described above with reference to FIG. 4A, the plurality of low-level first isolation layers 420 may include internal first isolation layers 220I and external first isolation layers 220E. The plurality of low-level first isolation layers 420 may be disposed between the plurality of first fin-shaped active regions F1A and between the plurality of first fin-shaped active regions F1B in the first region I, may each extend parallel to the plurality of first fin-shaped active regions F1A and F1B and may have upper surfaces that are lower than those of the plurality of first fin-shaped active regions F1A and F1B. The plurality of low-level first isolation layers 420 may be formed in or may fill the first trenches T1 by being disposed between the plurality of first fin-shaped active regions F1A and between the plurality of first fin-shaped active regions F1B. Each of the plurality of internal first isolation layers 220I of the plurality of low-level first isolation layers 420 may include a first insulation liner 122, a first stressor liner 124, and a first gap-fill insulation layer 126 sequentially stacked on the bottom of the first trench T1. Each of the plurality of external first isolation layers 220E of the plurality of low-level first isolation layers 420 may include a first insulation liner 222, a first stressor liner 224, and a first gap-fill insulation layer 226 sequentially stacked on the bottom of the first trench T1.

The high-level first isolation layer 422 may be disposed between a pair of first fin-shaped active regions F1A and F1B that are adjacent to each other and are spaced apart from each other in the first direction (X direction) and may extend in the second direction (Y direction) that crosses the plurality of first fin-shaped active regions F1A and F1B.

Figure 12A:
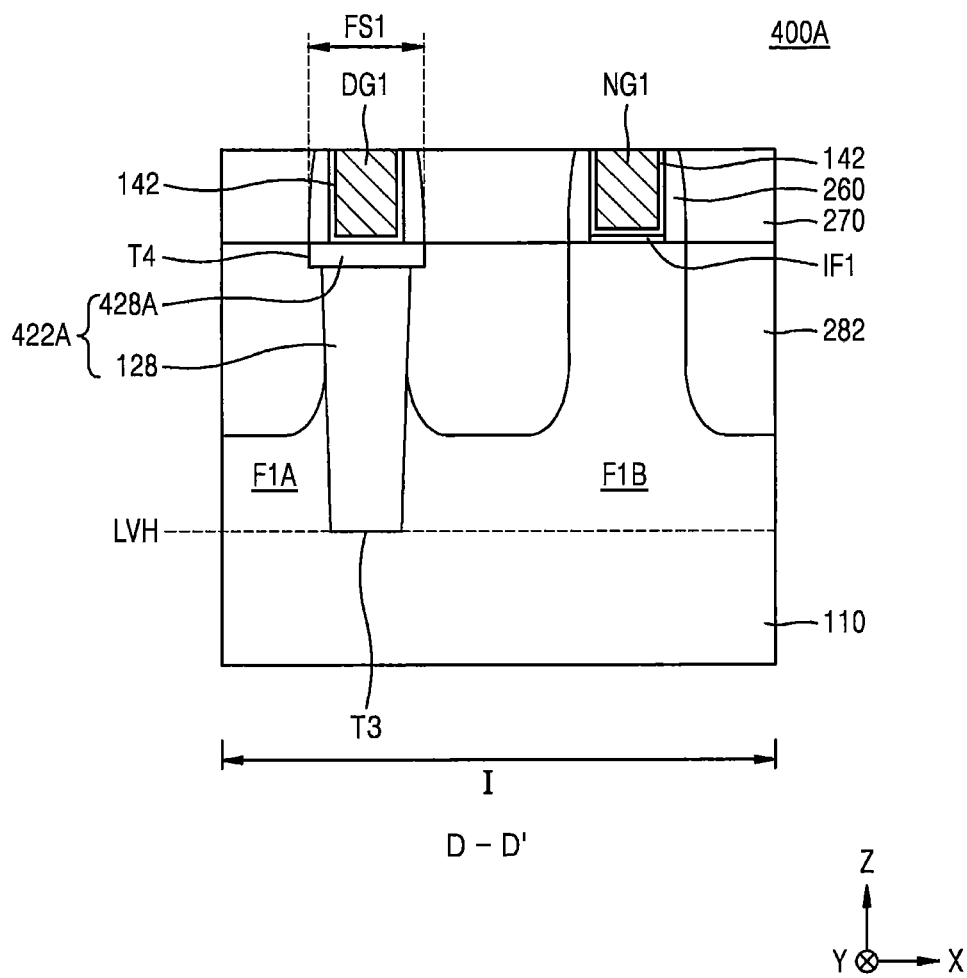
FIGS. 12A and 12B are cross-sectional views taken along the lines D-D' and E-E' of FIG. 11A, respectively according to some embodiments of the inventive concept.
Figure 12B:
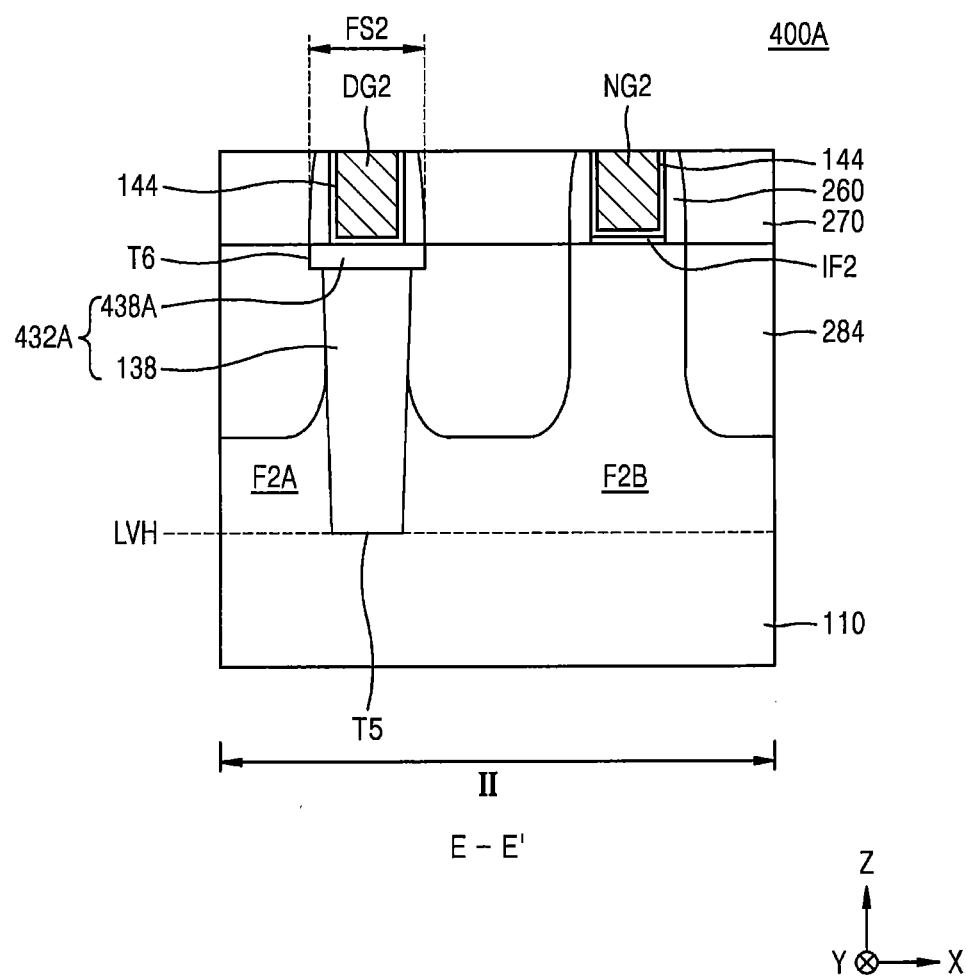

As shown in FIG. 11D, the high-level first isolation layer 422 may have an upper surface that is higher than that of each of the plurality of first fin-shaped active regions F1A and F1B. However, the inventive concept is not limited thereto. In some embodiments, the high-level first isolation layer 422 may have an upper surface that is on the same level as that of each of the plurality of first fin-shaped active regions F1A and F1B as illustrated in FIGS. 12A and 12B.

As shown in FIG. 11D, the high-level first isolation layer 422 may include a first lower fin separation insulating layer 128 that fills a fin separation trench T3 extending parallel to the plurality of normal gates NG1 and the dummy gate DG1 in the first fin separation region FS1 between the pair of first fin-shaped active regions F1A and F1B, and a first upper fin separation insulating layer 428 that fills an upper trench T4 that is formed on the fin separation trench T3 such as to communicate with the fin separation trench T3 and has a large width than the fin separation trench T3.

According to some embodiments, the first upper fin separation insulating layer 428 may be formed of an oxide layer formed by coating or deposition. For example, the first upper fin separation insulating layer 428 may be formed of FSG, USG, BPSG, PSG, FOX, PE-TEOS, and/or TOSZ.

As shown in FIG. 11A, one dummy gate DG1 may be formed on one high-level first isolation layer 422 such that the high-level first isolation layer 422 is in a one-to one relationship with the dummy gate DG1. The dummy gate DG1 may be disposed between a pair of adjacent normal gates NG1. The high-level first isolation layer 422 may be disposed to be overlapped with the dummy gate DG1 in plan view, and the high-level first isolation layer 422 and the dummy gate DG1 may extend in the second direction (Y direction) that crosses the plurality of first fin-shaped active regions F1A and F1B.

In the IC device 400, a plurality of low-level second isolation layers 430 and a high-level second isolation layer 432 for providing insulation regions may be formed between the plurality of second fin-shaped active regions F2A and F2B in the second region II of the substrate 110.

Similar to the plurality of second isolation layers 230 described above with reference to FIG. 4A, the plurality of low-level second isolation layers 430 may include internal second isolation layers 230I and external second isolation layers 230E. The plurality of low-level second isolation layers 430 may be disposed between the plurality of second fin-shaped active regions F2A and between the plurality of second fin-shaped active regions F2B in the second region II, may each extend parallel to the plurality of second fin-shaped active regions F2A and F2B and may have upper surfaces that are lower than those of the plurality of second fin-shaped active regions F2A and F2B. The plurality of low-level second isolation layers 430 may be formed in or may fill second trenches T2 by being disposed between the plurality of second fin-shaped active regions F2A and between the plurality of second fin-shaped active regions F2B. Each of the plurality of internal second isolation layers 230I of the plurality of low-level second isolation layers 430 may include a second insulation liner 132, a second stressor liner 134, and a second gap-fill insulation layer 136 sequentially stacked on the bottom of the second trench T2. Each of the plurality of external second isolation layers 230E of the plurality of low-level second isolation layers 430 may include a second insulation liner 232, a second stressor liner 234, and a second gap-fill insulation layer 236 sequentially stacked on the bottom of the second trench T2.

The high-level second isolation layer 432 may be disposed between a pair of second fin-shaped active regions F2A and F2B that are adjacent to each other and are spaced apart from each other in the first direction (X direction) and may extend in the second direction (Y direction) that crosses the plurality of second fin-shaped active regions F2A and F2B.

As shown in FIG. 11E, the high-level second isolation layer 432 may have an upper surface that is higher than that of each of the plurality of second fin-shaped active regions F2A and F2B. However, the inventive concept is not limited to the example of FIG. 11E. In some embodiments, the high-level second isolation layer 432 may have an upper surface that is on the same level as that of each of the plurality of second fin-shaped active regions F2A and F2B. This will be described in greater detail later with reference to FIGS. 12A and 12B.

As shown in FIG. 11E, the high-level second isolation layer 432 may include a second lower fin separation insulating layer 138 that is formed in or fills a fin separation trench T5 extending parallel to the plurality of normal gates NG2 and the dummy gate DG2 in the second fin separation region FS2 between the pair of second fin-shaped active regions F2A and F2B adjacent to each other, and a second upper fin separation insulating layer 438 that is formed in or fills an upper trench T6 that is formed on the fin separation trench T5 such as to communicate with the fin separation trench T5 and has a large width than the fin separation trench T5.

According to some embodiments, the second upper fin separation insulating layer 438 may be formed of an oxide layer formed by coating and/or deposition. For example, the second upper fin separation insulating layer 438 may be formed of FSG, USG, BPSG, PSG, FOX, PE-TEOS and/or TOSZ.

As shown in FIG. 11A, one dummy gate DG2 may be formed on one high-level second isolation layer 432 such that the high-level second isolation layer 432 is in a one-to one relationship with the dummy gate DG2. The dummy gate DG2 may be disposed between a pair of adjacent normal gates NG2. The high-level second isolation layer 432 may be disposed to be overlapped by the dummy gate DG2 in plan view, and both the high-level second isolation layer 432 and the dummy gate DG2 may extend in the second direction (Y direction) that crosses the plurality of second fin-shaped active regions F2A and F2B.

According to some embodiments, a lower surface level LVDT of each of the first and second inter-device isolation insulating layers 112 and 114 formed within the first and second deep trenches DT1 and DT2 (see FIGS. 11B and 11C) formed between the first region I and the second region II may be lower than a lower surface level LVH of the high-level first isolation layer 422.

In the first region I of the IC device 400 of FIGS. 11A-11E, the first stressor liners 124 and 224 may be formed only within the low-level first isolation layers 420, and no stressor liners are formed within the high-level first isolation layer 422 and the first inter-device isolation insulating layers 112.

In the second region II of the IC device 400 of FIGS. 11A-11E, the second stressor liners 134 and 234 may be formed only within the low-level second isolation layers 430, and no stressor liners are formed within the high-level second isolation layer 432 and the second inter-device isolation insulating layers 114.

The plurality of normal gates NG1 and the dummy gate DG1 formed in the first region I, and the plurality of normal gates NG2 and the dummy gate DG2 formed in the second region II may have similar structures to those of the first gate 152 and the second gate 154 of FIGS. 1A and 1B, respectively.

Both sidewalls of each of the plurality of normal gates NG1 and the dummy gate DG1 formed in the first region I, and both sidewalls of each of the plurality of normal gates NG2 and the dummy gate DG2 formed in the second region II may be covered with insulation spacers 260 and an inter-gate insulation layer 270. According to some embodiments, the insulation spacers 260 may be formed of a silicon nitride layer of $Si_3N_4$, a silicon oxynitride layer of SiON, a carbon-containing silicon oxynitride layer of SiCON, or a combination thereof. According to some embodiments, the inter-gate insulation layer 270 may be formed of a tetra ethyl ortho silicate (TEOS) layer, or an ultra low K (ULK) layer having an ultra low dielectric constant K of about 2.2 to about 2.4, for example, a SiOC layer or a SiCOH layer.

According to some embodiments, the plurality of normal gates NG1 and NG2 and the dummy gates DG1 and DG2 may be formed using a gate-last process (i.e., a replacement poly-gate (RPG) process). However, the inventive concept is not limited thereto.

As shown in FIG. 11D, in the first region I, first gate insulation layers 142 may be respectively interposed between each of the plurality of normal gates NG1 and each of the plurality of first fin-shaped active regions F1A and F1B and between the dummy gate DG1 and the first upper fin separation insulating layer 428.

In the first region I, source/drain regions 282 may be respectively formed in the plurality of first fin-shaped active regions F1A and F1B at both sides of each of the plurality of normal gates NG1. Some source/drain regions 282 on both sides of the first fin separation region FS1 of the plurality of source/drain regions 282 formed in the plurality of first fin-shaped active regions F1A and F1B may be vertically overlapped by the first upper fin separation insulating layer 428 formed within the upper trench T4 and the insulation spacers 260 and thus may each have a tucked shape of being tucked under the first upper fin separation insulating layer 428 as illustrated in FIG. 11D.

In the second region II, second gate insulation layers 144 may be respectively interposed between each of the plurality of normal gates NG2 and each of the plurality of second fin-shaped active regions F2A and F2B, and between the dummy gate DG2 and the second upper fin separation insulating layer 438.

In the second region II, source/drain regions 284 may be respectively formed in the plurality of second fin-shaped active regions F2A and F2B at both sides of each of the plurality of normal gates NG2. Some source/drain regions 284 on both sides of the second fin separation region FS2 of the plurality of source/drain regions 284 formed in the plurality of second fin-shaped active regions F2A and F2B may be vertically overlapped by the second upper fin separation insulating layer 438 formed within the upper trench T6 and the insulation spacers 260 and thus may each have a tucked shape of being tucked under the second upper fin separation insulating layer 438 as illustrated in FIG. 11E.

In the IC device 400 of FIGS. 11A-11E, the plurality of low-level first isolation layers 420 formed in the first region I may include the first stressor liners 124 and 224 extending along both sidewalls of each of the first fin-shaped active regions F1A and F1B to apply the first stress to the first conductive channel regions CHA of the first fin-shaped active regions F1A and F1B, and the plurality of low-level second isolation layers 430 formed in the second region II may include the second stressor liners 134 and 234 extending along both sidewalls of each of the second fin-shaped active regions F2A and F2B to apply the second stress, which is different from the first stress, to the second conductive channel regions CHB of the second fin-shaped active regions F2A and F2B. Accordingly, the first conductive channel regions CHA of the first fin-shaped active regions F1A and F1B and the second conductive channel regions CHB of the second fin-shaped active regions F2A and F2B may receive stresses capable of independently enhancing carrier mobility of the first and second conductive channel regions CHA and CHB, and thus the performance of transistors formed in the first region I and the second region II may be enhanced.

Although the first region I and the second region II of the IC device 400 include the plurality of first isolation layers 420 and the plurality of second isolation layers 430 having the same structures as the plurality of first isolation layers 220 and the plurality of second isolation layers 230 included in each of the IC devices 200 and 200A of FIGS. 4A-4D in FIGS. 11A-11E, the inventive concept is not limited thereto. In some embodiments, the IC device 400 of FIGS. 11A-11E may include the plurality of first isolation layers 120 and the plurality of second isolation layers 130 of FIGS. 1A-1C, the plurality of first isolation layers 120A and the plurality of second isolation layers 130A of FIG. 2, the plurality of first isolation layers 120B and the plurality of second isolation layers 130B of FIG. 3, the plurality of first isolation layers 220C and the plurality of second isolation layers 230C of FIG. 5, the plurality of first isolation layers 220D and the plurality of second isolation layers 230D of FIG. 6, the plurality of first isolation layers 220 and the plurality of second isolation layers 230 of each of FIGS. 7-10, or a plurality of first isolation layers and a plurality of second isolation layers having various structures into which the structures of the aforementioned plurality of first and second isolation layers are modified and changed within the spirit of the inventive concept.

FIGS. 12A and 12B illustrate an IC device 400A according to some embodiments of the inventive concept that has a plan view similar to that illustrated in FIG. 11A. In detail, FIG. 12A is a cross-sectional view of a portion of the IC device 400A taken along the line D-D' of FIG. 11A, and FIG. 12B is a cross-sectional view of a portion of the IC device 400A taken along the line E-E of FIG. 11A. The same reference characters and numerals in FIGS. 12A and 12B as those in FIGS. 1A-11E denote the same elements, and thus their description will be omitted herein.

Referring to FIGS. 12A and 12B, the IC device 400A may have a similar structure to that of the IC device 400 described above with reference to FIGS. 11A-11E. However, in a high-level first isolation layer 422A formed in the first region I of the substrate 110, an upper surface of a first upper fin separation insulating layer 428A formed within the upper trench T4 may be at the substantially the same or the same level as the upper surfaces of the plurality of first fin-shaped active regions F1A and F1B. In a high-level second isolation layer 432A formed in the second region II of the substrate 110, an upper surface of a second upper fin separation insulating layer 438A formed within the upper trench T6 may be at the substantially the same or the same level as the upper surfaces of the plurality of second fin-shaped active regions F2A and F2B.

Details of the first and second upper fin separation insulating layers 428A and 438A are similar to those of the first and second upper fin separation insulating layers 428 and 438 in FIGS. 11A-11E.

Figure 13A:
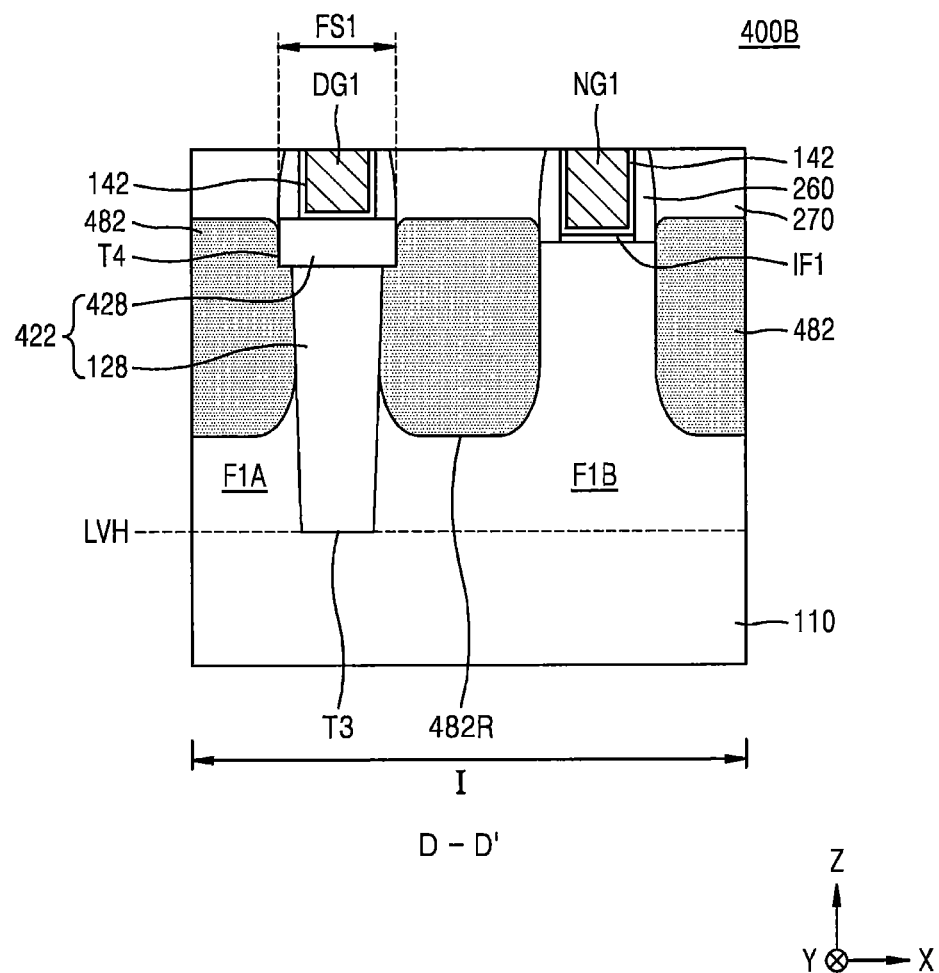
FIGS. 13A and 13B are cross-sectional views taken along the lines D-D' and E-E' of FIG. 11A, respectively according to some embodiments of the inventive concept.
Figure 13B:
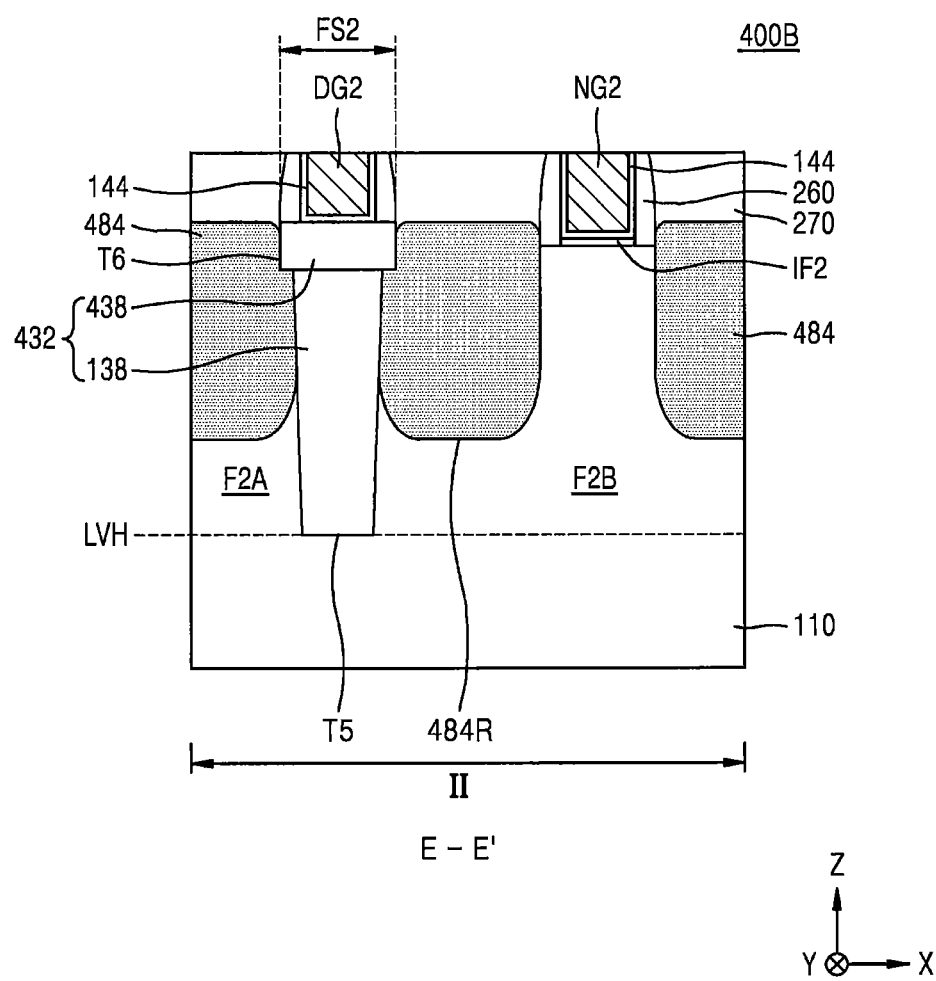

FIGS. 13A and 13B illustrate an IC device 400B according to some embodiments of the inventive concept that has a plan view similar to that illustrated in FIG. 11A. In detail, FIG. 13A is a cross-sectional view of a portion of the IC device 400B taken along the line D-D' of FIG. 11A, and FIG. 13B is a cross-sectional view of a portion of the IC device 400B taken along the line E-E' of FIG. 11A. The same reference characters and numerals in FIGS. 13A and 13B as those in FIGS. 1A-11E denote the same elements, and thus their description will be omitted herein.

Referring to FIGS. 13A and 13B, the IC device 400B may have a similar structure as that of the IC device 400 described above with reference to FIGS. 11A-11E. However, in the first region I and the second region II, source/drain regions 482 and source/drain regions 484 each having a raised source/drain (RSD) structure are formed in the first fin-shaped active regions F1A and F1B and the second fin-shaped active regions F2A and F2B, respectively.

In the first region I, the source/drain regions 482 each having an RSD structure may be respectively formed in the plurality of first fin-shaped active regions F1A and F1B at both sides of each of the plurality of normal gates NG1. In the second region II, source/drain regions 484 each having an RSD structure may be respectively formed in the plurality of second fin-shaped active regions F2A and F2B at both sides of each of the plurality of normal gates NG2.

To form the source/drain regions 482 and 484 in the first region I and the second region II, recesses 482R and 484R may be formed by removing portions of the first and second fin-shaped active regions F1A, F1B, F2A, and F2B. Thereafter, a semiconductor layer necessary for forming the source/drain regions 482 and 484 may be formed within the recesses 482R and 484R via epitaxial growth. According to some embodiments, the source/drain regions 482 may be formed of Si or SiC in the first region I. In the first region I, N+ doping may be performed simultaneously or concurrently when a semiconductor layer formed of Si or SiC is epitaxially grown. In the second region II, the source/drain regions 484 may be formed of SiGe. In the second region II, P+ doping may be performed simultaneously or concurrently when a semiconductor layer formed of SiGe is epitaxially grown.

The source/drain regions 482 and 484 may be formed to have upper surfaces that are higher than the upper surfaces of the first and second fin-shaped active regions F1A, F1B, F2A, and F2B.

In the first region I, some source/drain regions 482 on both sides of the first fin separation region FS1 of the plurality of source/drain regions 482 formed in the plurality of first fin-shaped active regions F1A and F1B may be vertically overlapped by the first upper fin separation insulating layer 428 formed within the upper trench T4 and the insulation spacers 260 and thus may each have a tucked shape of being tucked under the first upper fin separation insulating layer 428 as illustrated in FIG. 13A.

In the second region II, some source/drain regions 484 on both sides of the second fin separation region FS2 of the plurality of source/drain regions 484 formed in the plurality of second fin-shaped active regions F2A and F2B may be vertically overlapped by the second upper fin separation insulating layer 438 formed within the upper trench T6 and the insulation spacers 260 and thus may each have a tucked shape of being tucked under the second upper fin separation insulating layer 438 as illustrated in FIG. 13B.

In the IC devices 400, 400A, and 400B of FIGS. 11A-13B, the high-level first isolation layers 422 and 422A each disposed below the dummy gate DG1 in the first region I of the substrate 110, and the high-level second isolation layers 432 and 432A each disposed below the dummy gate DG2 in the second region II thereof may have upper surfaces that are at the same level as or higher than the upper surfaces of the plurality of first and second fin-shaped active regions F1A, F1B, F2A, and F2B. Accordingly, no dummy gates DG1 and DG2 are disposed between first fin-shaped active regions F1A, between first fin-shaped active regions F1B, between second fin-shaped active regions F2A, and between second fin-shaped active regions F2B. Thus, compared with the case where the upper surfaces of the high-level first isolation layers 422 and 422A and the high-level second isolation layers 432 and 432A are lower than those of the plurality of first and second fin-shaped active regions F1A, F1B, F2A, and F2B, parasitic capacitances between the dummy gates DG1 and DG2 and the plurality of first and second fin-shaped active regions F1A, F1B, F2A, and F2B may be less. Additionally, as spaces between the dummy gates DG1 and DG2 and the plurality of first and second fin-shaped active regions F1A, F1B, F2A, and F2B are secured, a leakage current may be reduced or possibly prevented. Moreover, the first and second upper fin separation region 428, 428A, 438, and 438A in the high-level first isolation layers 422 and 422A and the high-level second isolation layers 432 and 432A may have widths in the X direction that are larger than those of the dummy gates DG1 and DG2 in the X direction, and thus, when the dummy gates DG1 and DG2 are formed on the high-level first isolation layers 422 and 422A and the high-level second isolation layers 432 and 432A, an alignment margin may be secured.

Figure 14:
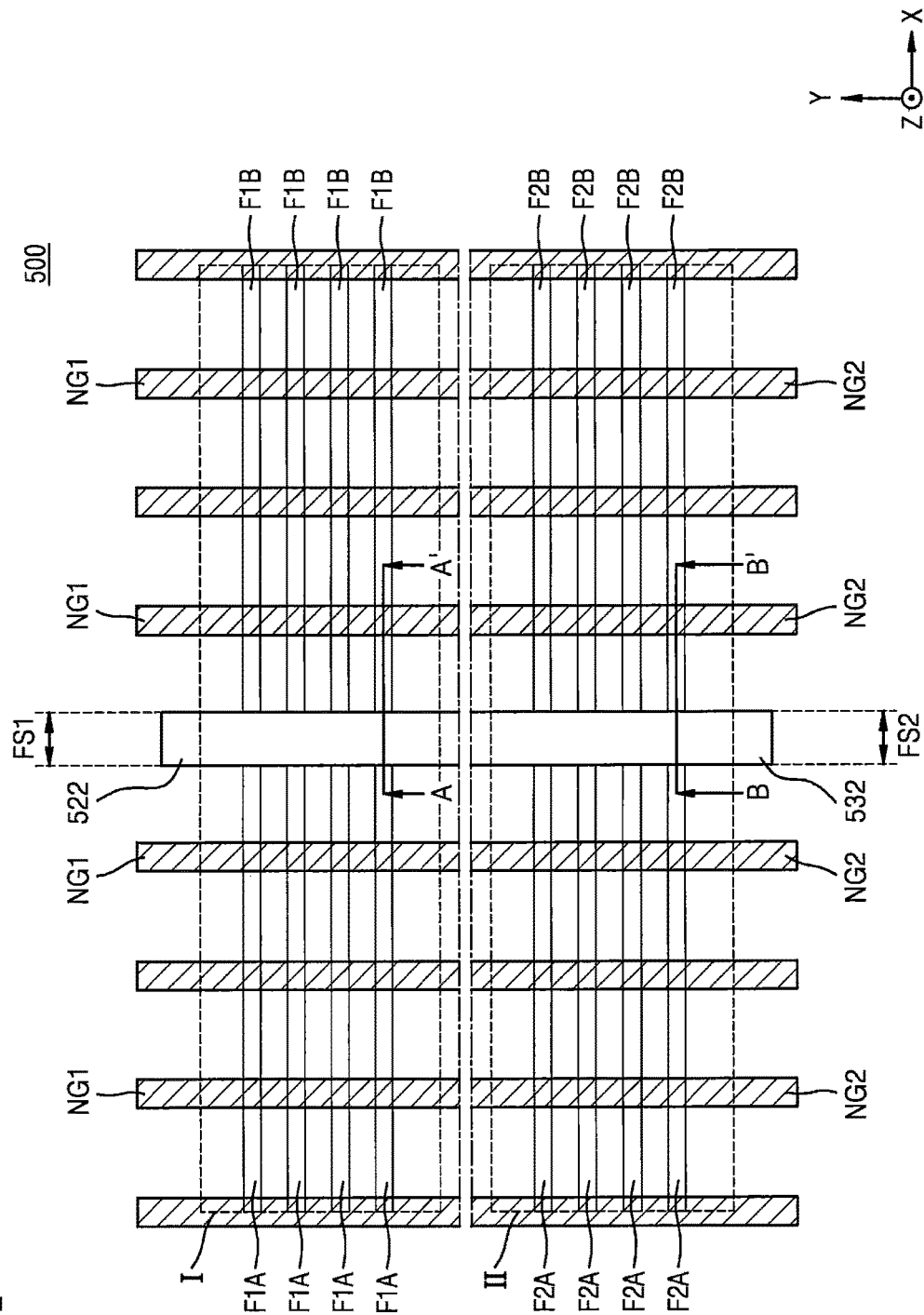
FIG. 14 is a plan view of an IC device according to some embodiments of the inventive concept.

FIG. 14 is a plan view of an IC device 500 according to some embodiments of the inventive concept.

The IC device 500 of FIG. 14 may have a structure similar to that of the IC device 400 of FIG. 11A. However, a high-level first isolation layer 522 extends between the plurality of first fin-shaped active regions F1A and the plurality of first fin-shaped active regions F1B in the first fin separation region FS1, a high-level second isolation layer 532 extends between the plurality of second fin-shaped active regions F2A and the plurality of second fin-shaped active regions F2B in the second fin separation region FS2, and no dummy gates are formed on the high-level first isolation layer 522 and the high-level second isolation layer 532.

Figure 15A:
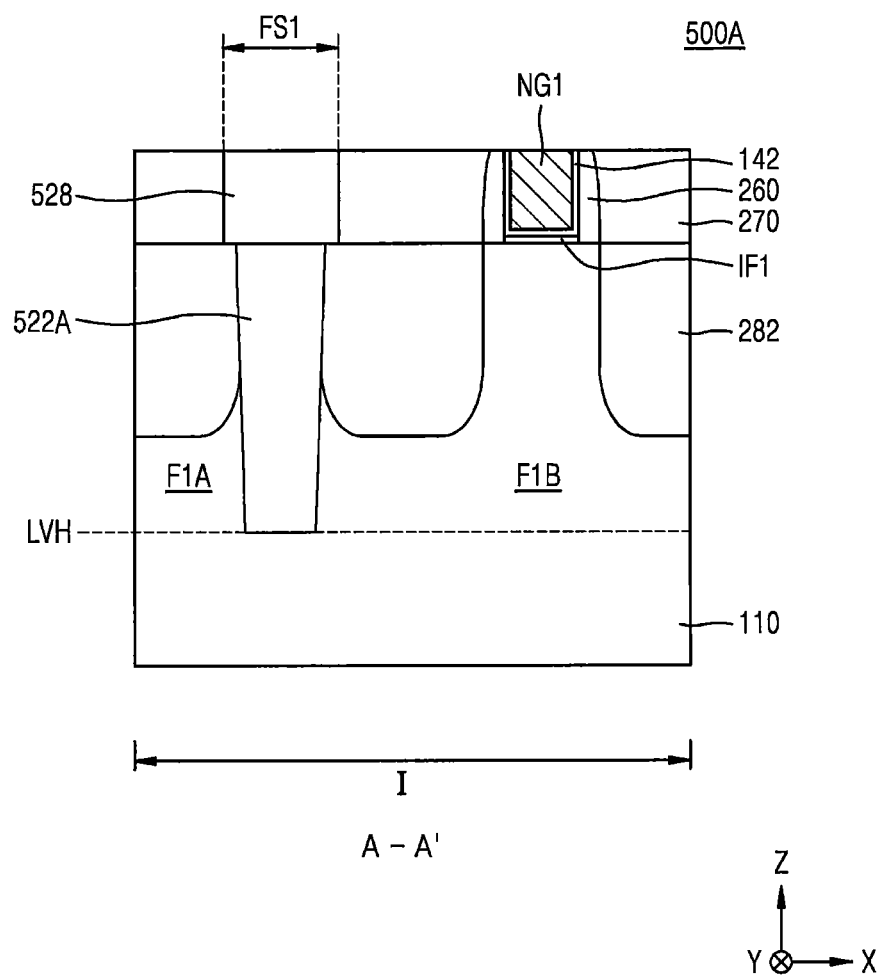
FIGS. 15A and 15B are cross-sectional views taken along the lines A-A' and B-B' of FIG. 14, respectively according to some embodiments of the inventive concept.
Figure 15B:
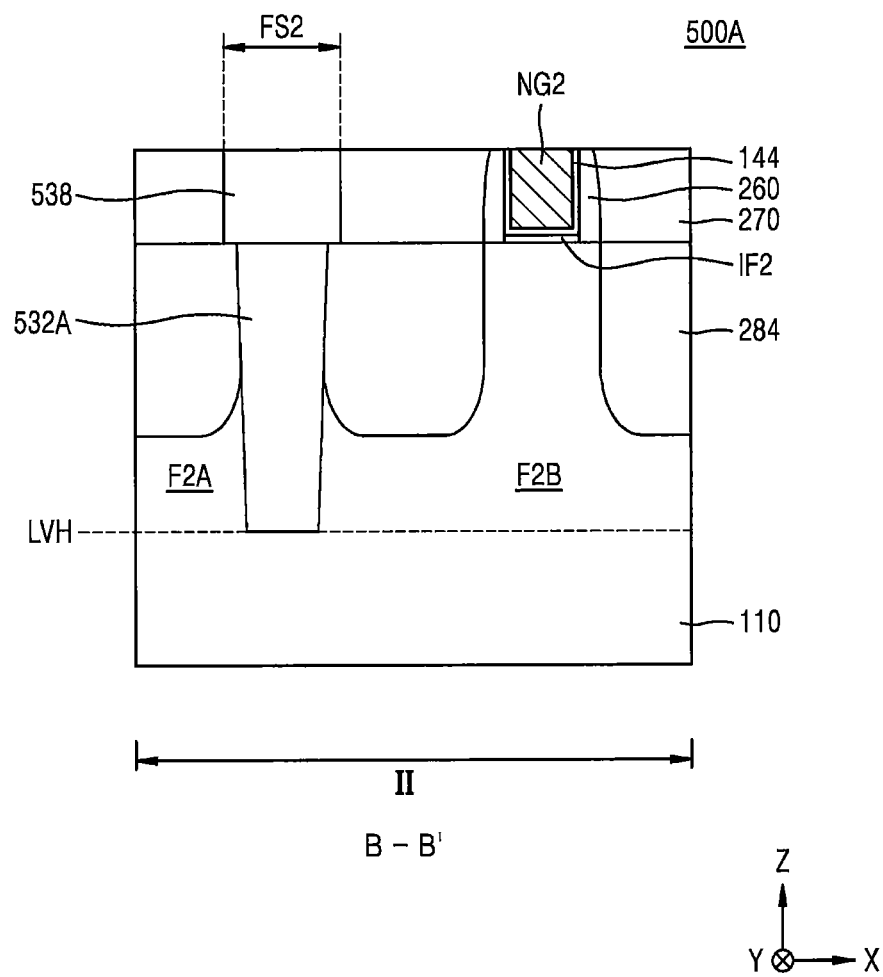

FIGS. 15A and 15B are cross-sectional views of an IC device 500A that may have a plan view similar to that illustrated in FIG. 14. In detail, FIG. 15A is a cross-sectional view of a portion of the IC device 500A taken along the line A-A' of FIG. 14, and FIG. 15B is a cross-sectional view of a portion of the IC device 500A taken along the line B-B' of FIG. 14. The same reference characters and numerals in FIGS. 15A and 15B as those in FIGS. 1A-14 denote the same elements, and thus their description will be omitted herein.

Referring to FIGS. 15A and 15B, in the first region I, the IC device 500A may include, as a component corresponding to the high-level first isolation layer 522 of FIG. 14, a first fin separation insulating layer 522A that may be formed in and may fill the first fin separation region FS1 while contacting the plurality of first fin-shaped active regions F1A and the plurality of first fin-shaped active regions F1B, and an insulation line 528 extending parallel to the normal gates NG1, instead of the dummy gate DG1, may be formed on the first fin separation insulating layer 522A. In the second region II, the IC device 500A may include, as a component corresponding to the high-level second isolation layer 532 of FIG. 14, a second fin separation insulating layer 532A that may be formed in and may fill the second fin separation region FS2 while contacting the plurality of second fin-shaped active regions F2A and the plurality of second fin-shaped active regions F2B, and an insulation line 538 extending parallel to the normal gates NG2, instead of the dummy gate DG2, may be formed on the second fin separation insulating layer 532A.

Figure 16A:
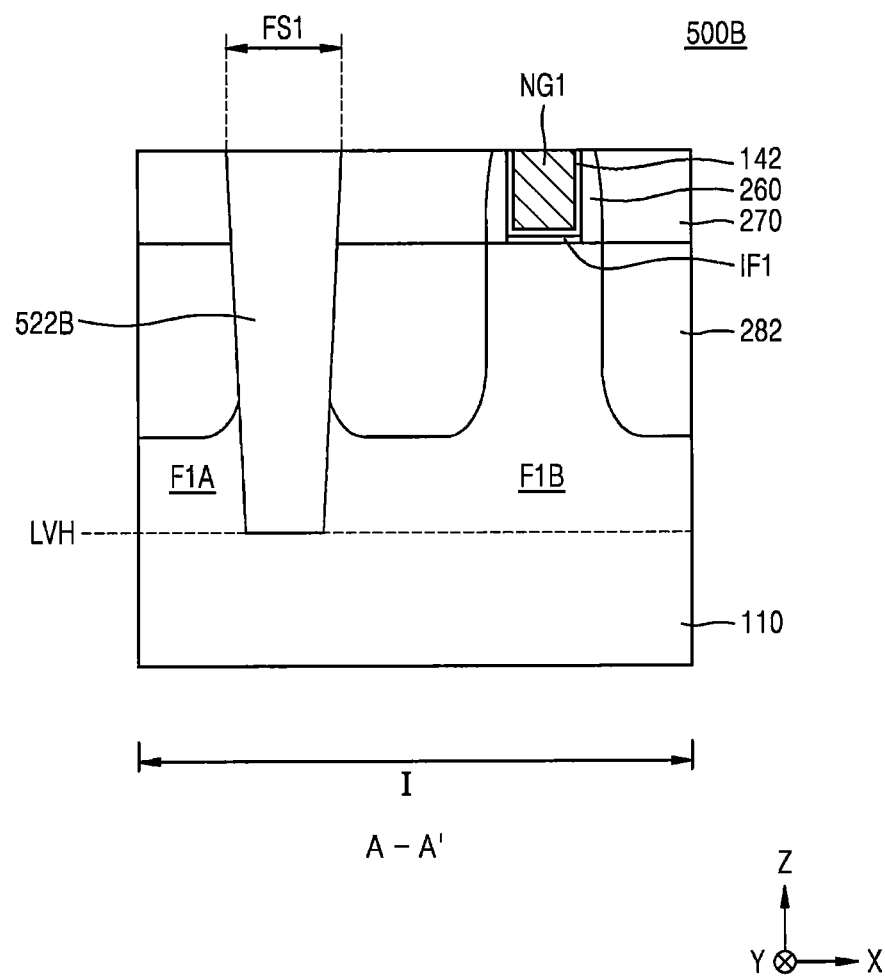
FIGS. 16A and 16B are cross-sectional views taken along the lines A-A' and B-B' of FIG. 14, respectively according to some embodiments of the inventive concept.
Figure 16B:
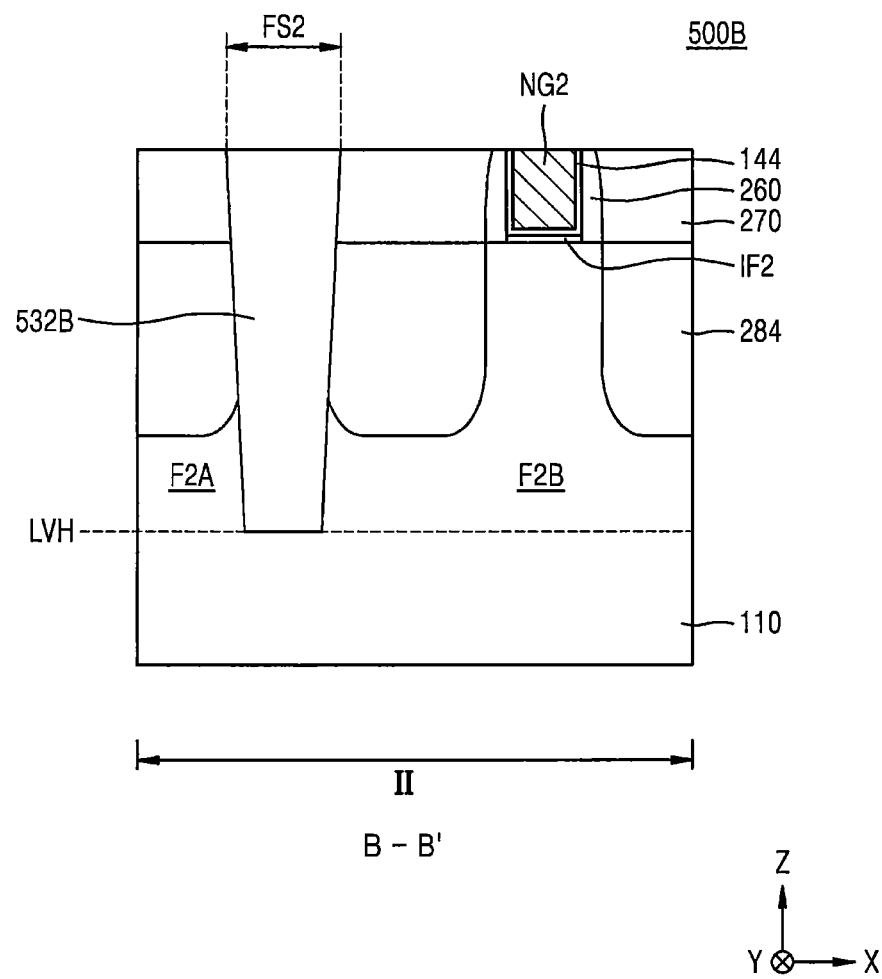

FIGS. 16A and 16B are partial cross-sectional views of an IC device 500B that may have a plan view similar to that illustrated in FIG. 14. In detail, FIG. 16A is a cross-sectional view of a portion of the IC device 500B taken along the line A-A' of FIG. 14, and FIG. 16B is a cross-sectional view of a portion of the IC device 500B taken along the line B-B' of FIG. 14. The same reference characters and numerals in FIGS. 16A and 16B as those in FIGS. 1A-14 denote the same elements, and thus their description will be omitted herein.

Referring to FIGS. 16A and 16B, the IC device 500B may include a first fin separation insulating layer 522B having an upper surface that is at the same level as that of each normal gate NG1, as a component corresponding to the high-level first isolation layer 522 of FIG. 14, and a second fin separation insulating layer 532B having an upper surface that is at the same level as that of each normal gate NG2, as a component corresponding to the high-level second isolation layer 532 of FIG. 14.

In more detail, the first fin separation insulating layer 522B may be formed to fill the first fin separation region FS1 while contacting the plurality of first fin-shaped active region F1A and the plurality of first fin-shaped active region F1B in the first region I. An upper portion of the first fin separation insulating layer 522B may extend parallel to the normal gates NG1, on the same level as the normal gates NG1.

The second fin separation insulating layer 532B may be formed to fill the second fin separation region FS2 while contacting the plurality of second fin-shaped active region F2A and the plurality of second fin-shaped active region F2B in the second region II. An upper portion of the second fin separation insulating layer 532B may extend parallel to the normal gates NG2, on the same level as the normal gates NG2.

Figure 17A:
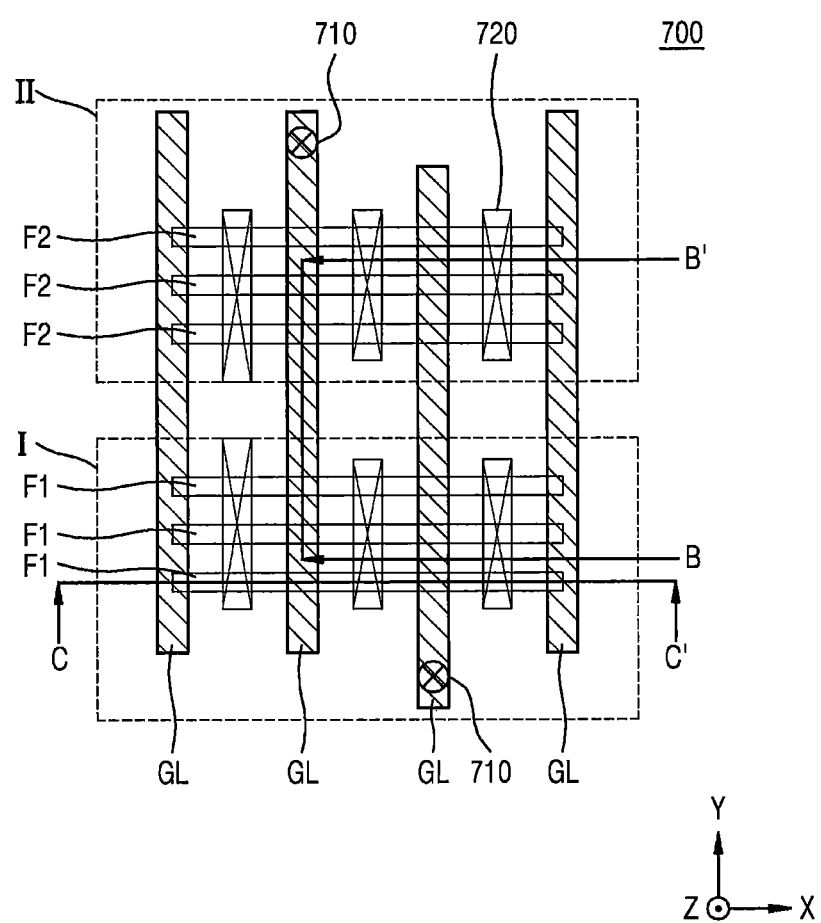
FIG. 17A is a plan view showing major components of an IC device according to some embodiments of the inventive concept.
Figure 17B:
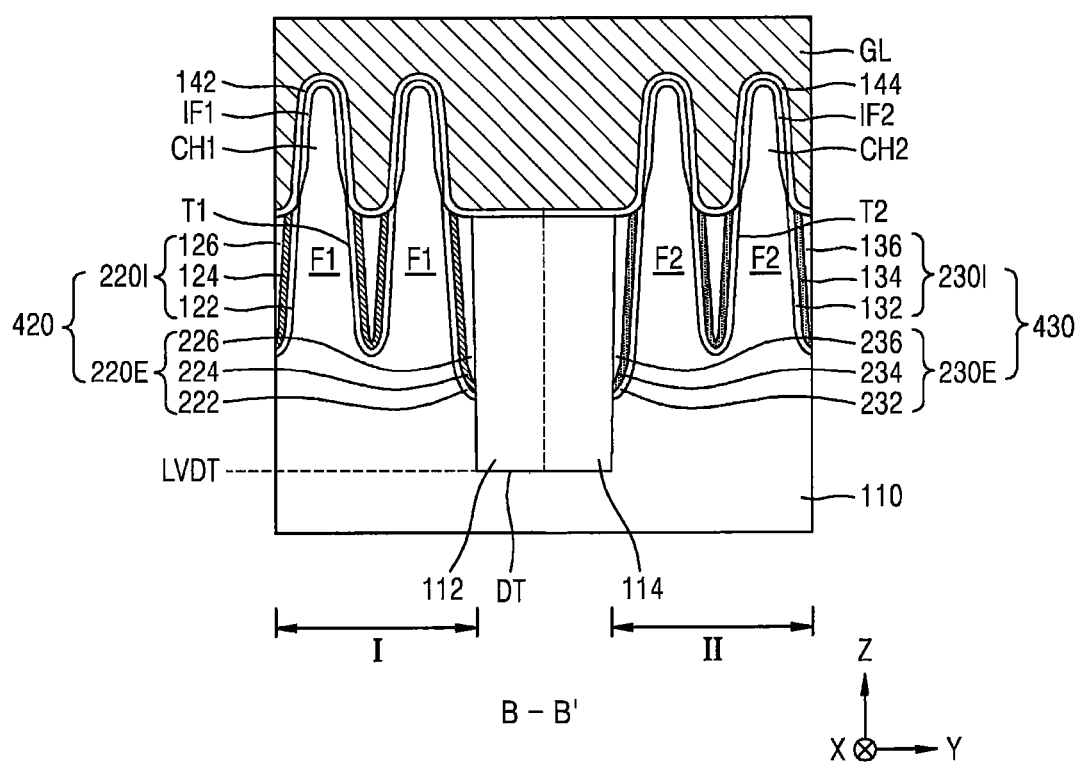
FIG. 17B is a cross-sectional view taken along the line B-B' if of FIG. 17A.
Figure 17C:
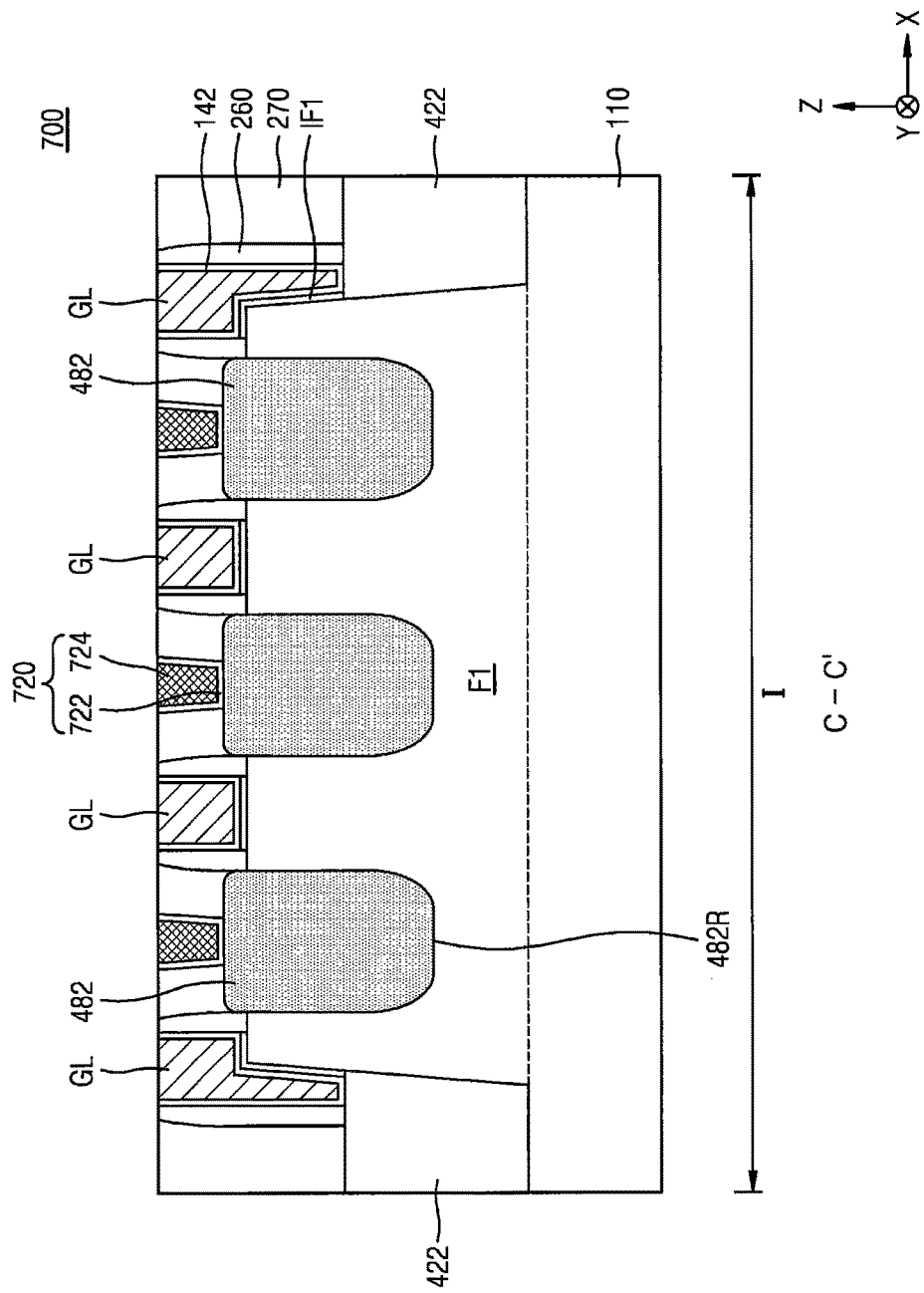
FIG. 17C is a cross-sectional view taken along the line C-C' of FIG. 17A.

FIGS. 17A-17C illustrate an IC device 700 according to some embodiments of the inventive concept. FIG. 17A is a plan view of the IC device 700. FIG. 17B is a cross-sectional view taken along the line B-B' of FIG. 17A. FIG. 17C is a cross-sectional view taken along the line C-C' of FIG. 17A. The same reference characters and numerals in FIGS. 17A-17C as those in FIGS. 1A-16B denote the same elements, and thus their description will be omitted herein.

Referring to FIGS. 17A-17C, in the IC device 700, a plurality of first fin-shaped active regions F1 may protrude in a third direction (Z direction) perpendicular to a main surface of the substrate 110, in the first region I of the substrate 110. Each of the plurality of first fin-shaped active regions F1 may have a first conductive channel region CH2. Both lower sidewalls of each of the plurality of first fin-shaped active regions F1 that are below the first conductive channel region CH1 and are in a short axial direction of the first conductive channel region CH1 may be covered with a plurality of first isolation layers 420 as illustrated in FIG. 17B. Both lower sidewalls of each of the plurality of first fin-shaped active regions F1 that are below the first conductive channel region CH1 and are in a long axial direction of the first conductive channel region CH1 may be covered with fin separation insulating layers 422 as illustrated in FIG. 17C. First stressor liners 124 and 224 may be formed only in the first isolation layers 420, and the fin separation insulating layers 422 may not include first stressor liners 124 and 224.

A plurality of second fin-shaped active regions F2 may protrude in the Z direction, in the second region II of the substrate 110. Each of the plurality of second fin-shaped active regions F2 may have a second conductive channel region CH2. Both lower sidewalls of each of the plurality of second fin-shaped active regions F2 that are below the second conductive channel region CH2 and are in a short axial direction of the second conductive channel region CH2 may be covered with a plurality of second isolation layers 430 as illustrated in FIG. 17B. Similar to the first region I, both lower sidewalls of each of the plurality of second fin-shaped active regions F2 that are below the second conductive channel region CH2 and are in a long axial direction of the second conductive channel region CH2 may be covered with fin separation insulating layers (not shown). Second stressor liners 134 and 234 may be formed only in the second isolation layers 430, which cover the sidewalls of the second conductive channel region CH2, and the fin separation insulating layers may not include second stressor liners 134 and 234.

The plurality of first and second fin-shaped active regions F1 and F2 may each extend in a first direction (X direction) on the substrate 110 so as to be parallel to each other.

Although three first fin-shaped active regions F1 and three second fin-shaped active regions F2 are shown in FIG. 17A, the inventive concept is not limited thereto.

In the first and second regions I and II of the substrate 110, a plurality of gate lines GL may extend in a second direction (Y direction) that crosses the plurality of first and second fin-shaped active regions F1 and F2. In the first region I, a first interfacial layer IF1 and a first gate insulation layer 142 may be interposed between the first conductive channel regions CH1 of the plurality of first fin-shaped active regions F1 and the plurality of gate lines GL. In the second region II, a second interfacial layer IF2 and a second gate insulation layer 144 may be interposed between the second conductive channel regions CH2 of the plurality of second fin-shaped active regions F2 and the plurality of gate lines GL.

Referring to FIG. 17B, first and second inter-device isolation insulating layers 112 and 114 may be formed within deep trenches DT formed between the first region I and the second region II.

As shown in FIG. 17B, the first and second stressor liners 124, 224, 134, and 234 may be formed within the first and second isolation layers 420 and 430 of the IC device 700, and no stressor liners may be included in the first and second inter-device isolation insulating layers 112 and 114.

In the first region I and the second region II of the substrate 110, the plurality of first and second gate insulation layers 142 and 144 and the plurality of gate lines GL, covering both sidewalls and upper surfaces of the plurality of first and second fin-shaped active regions F1 and F2, may be formed on the first and second fin-shaped active regions F1 and F2, the first and second isolation layers 420 and 430, and the first and second inter-device isolation insulating layers 112 and 114. Details of the plurality of first and second gate insulation layers 142 and 144 and the plurality of gate lines GL may be similar to those of the first and second gate insulation layers 142 and 144 and the first and second gates 152 and 154 in FIGS. 1A and 1B.

As shown in FIG. 17A, gate contacts 710 may be formed in some parts of the plurality of gate lines GL.

As shown in FIG. 17B, some of the plurality of gate lines GL may each extend to cover the upper surfaces of the plurality of first and second fin-shaped active regions F1 and F2 and both sidewalls thereof in the short axial direction. As shown in FIG. 17C, others of the plurality of gate lines GL may each extend to cover the upper surfaces of the plurality of first and second fin-shaped active regions F1 and F2 and the sidewall of one end of each of the plurality of first and second fin-shaped active regions F1 and F2 in the long axial direction.

As shown in FIG. 17C, in the plurality of first and second fin-shaped active regions F1 and F2, a plurality of source/drain regions 482 may be respectively formed at both sides of the plurality of gate lines GL. Contacts 720 may be formed on the plurality of source/drain regions 482, respectively. Each of the contacts 720 may include a conductive barrier layer 722 and a wiring layer 724. According to some embodiments, the conductive barrier layer 722 may be formed of titanium nitride, tantalum nitride, tungsten nitride, titanium carbon nitride, or a combination thereof, but is not limited thereto. According to some embodiments, the wiring layer 724 may be formed of a doped semiconductor, metal (such as, Cu, Ti, W, or Al), metal silicide (such as, nickel silicide, cobalt silicide, tungsten silicide, or tantalum silicide), or a combination thereof, but is not limited thereto. An inter-gate insulation layer 270 may be formed in or may fill the spaces between the plurality of gate lines GL and the plurality of contacts 720 to thereby insulate the plurality of gate lines GL from the plurality of contacts 720.

In the IC device 700 of FIGS. 17A-17C, the first and second stressor liners 124, 224, 134, and 234 may be formed only in the first and second isolation layers 420 and 430 and may not be formed in the first and second inter-device isolation insulating layers 112 and 114 and the fin separation insulating layers 422. Therefore, a stress capable of selectively enhancing carrier mobility may be applied to necessary portions of the plurality of first and second fin-shaped active regions F1 and F2. Thus, performance of the transistors that are formed in the first region I and the second region II may be improved.

FIGS. 18A-18J are cross-sectional views illustrating a method of fabricating an IC device according to some embodiments of the inventive concept. A method of fabricating the IC device 100A of FIG. 1C will now be described with reference to FIGS. 18A-18J. The same reference characters and numerals in FIGS. 18A-18J as those in FIGS. 1A-1C denote the same elements, and thus their description will be omitted herein.

Figure 18A:
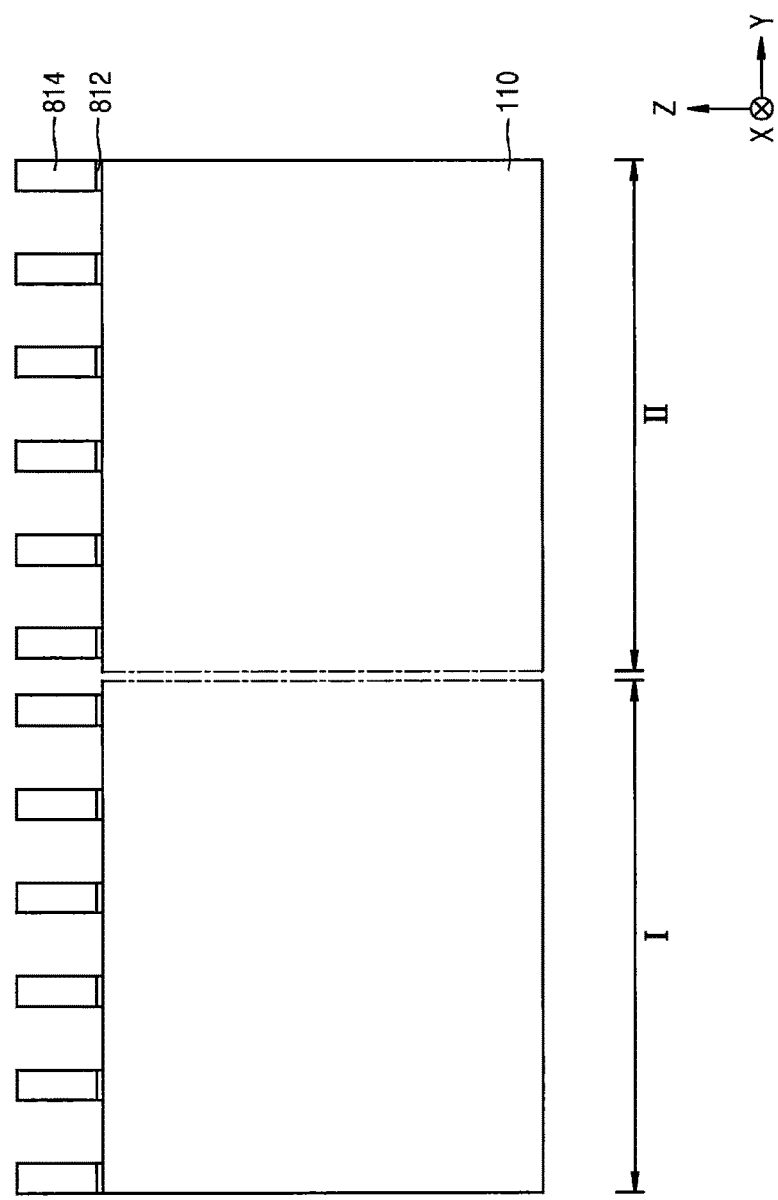
FIGS. 18A-18J are cross-sectional views illustrating a method of fabricating an IC device according to some embodiments of the inventive concept.

Referring to FIG. 18A, a substrate 110 including a first region I and a second region II may be prepared. In the first and second regions I and II of the substrate 110, a plurality of pad oxide layer patterns 812 and a plurality of mask patterns 814 may be formed.

The plurality of pad oxide layer patterns 812 and the plurality of mask patterns 814 may each extend in a first direction (X direction) on the substrate 110 so as to be parallel to each other.

According to some embodiments, the plurality of pad oxide layer patterns 812 may be formed of an oxide layer obtained by thermally oxidizing the surface of the substrate 110. The plurality of mask patterns 814 may be formed of a silicon nitride layer, a silicon oxynitride layer, a spin on glass (SOG) layer, a spin on hardmask (SOH) layer, a photoresist layer, or a combination thereof, but is not limited thereto.

Figure 18B:
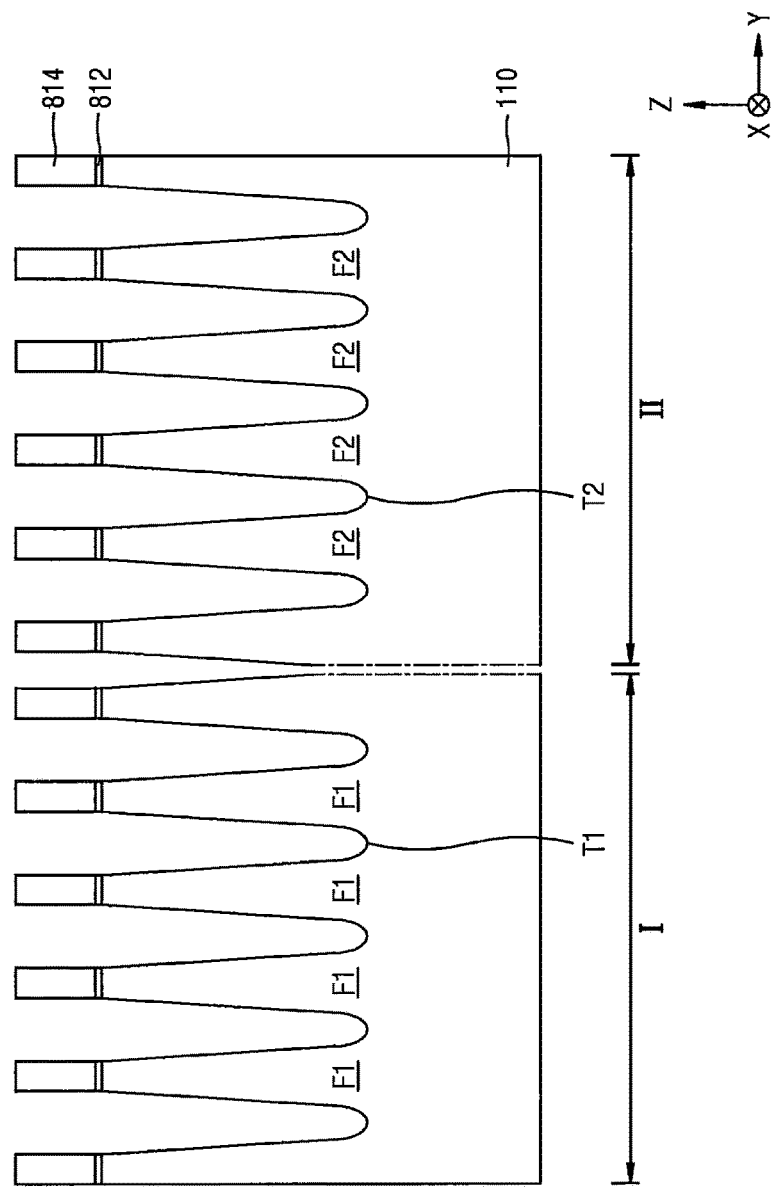

Referring to FIG. 18B, a plurality of first and second trenches T1 and T2 may be formed in the substrate 110 by etching a partial region of the substrate 110 by using the plurality of mask patterns 814 as an etch mask. Due to the formation of the plurality of first and second trenches T1 and T2, a plurality of first and second fin-shaped active regions F1 and F2 each protruding upward in the third direction (Z direction) perpendicular to the main surface of the substrate 110 and extending in the first direction (X direction) may be obtained from the substrate 110.

Figure 18C:
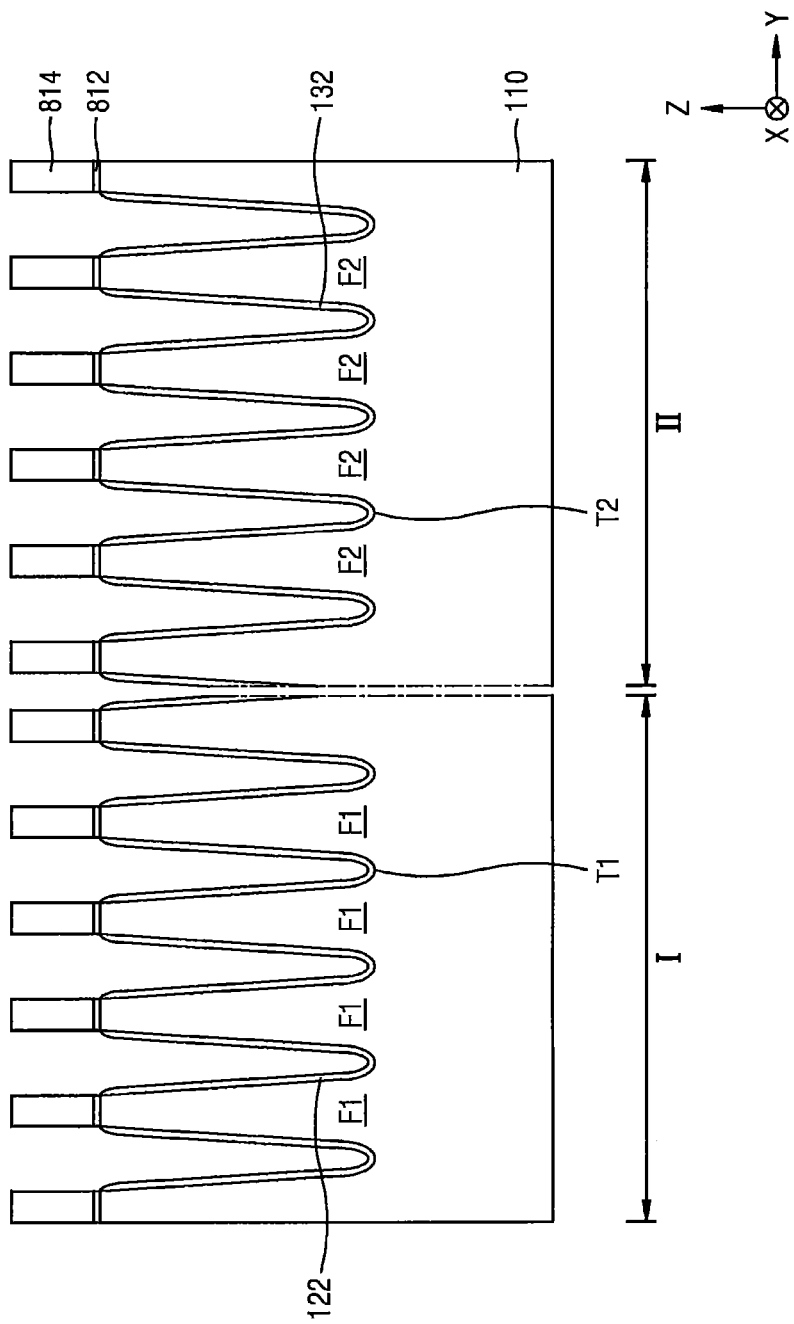

Referring to FIG. 18C, a first insulation liner 122 covering exposed surfaces of the plurality of first fin-shaped active regions F1 are formed in the first region I, and a second insulation liner 132 covering exposed surfaces of the plurality of second fin-shaped active regions F2 are formed in the second region II.

The first insulation liner 122 and the second insulation liner 132 may be obtained by oxidizing the surfaces of the plurality of first fin-shaped active regions F1 and the surfaces of the plurality of second fin-shaped active regions F2, respectively. For example, each of the first and second insulation liners 122 and 132 may be formed via thermal oxidation, but is not limited thereto. According to some embodiments, the first and second insulation liners 122 and 132 may be formed simultaneously or concurrently. The first and second insulation liners 122 and 132 may be formed of the same material. Each of the first and second insulation liners 122 and 132 may have a thickness of about 10 Å to about 100 Å.

Figure 18D:
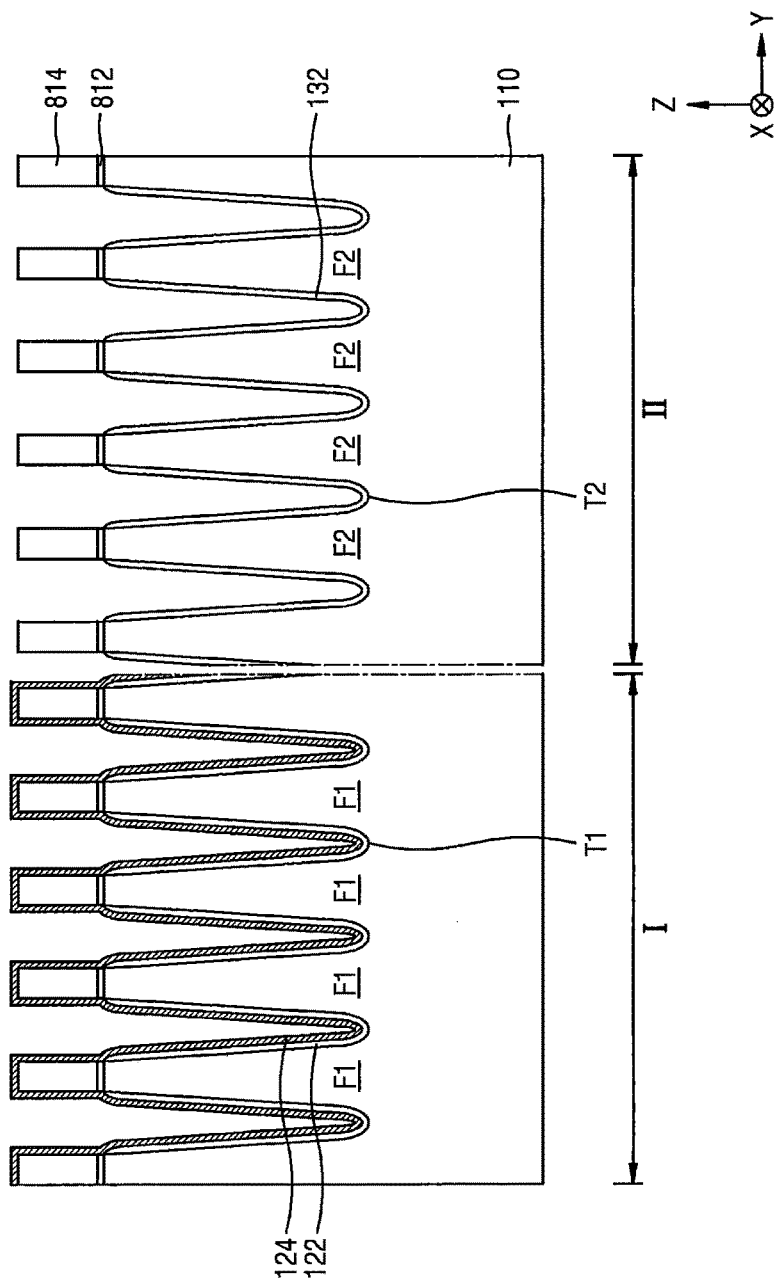

Referring to FIG. 18D, a first stressor liner 124 may be formed on the first insulation liner 122 in the first region I of the substrate 110.

According to some embodiments, to form the first stressor liner 124, a first stressor liner 124 covering the first insulation liner 122 and the second insulation liner 132 may be formed on the plurality of first fin-shaped active regions F1 and the plurality of second fin-shaped active regions F2 in the first region I and the second region II, a mask pattern (not shown) covering the first region I may then be formed such that the second region II is exposed, and the first stressor liner 124 may be removed from the second region II such that the second insulation liner 132 may be exposed.

The first stressor liner 124 may be formed to have a uniform (i.e., constant) thickness to conformally cover the first insulation liner 122.

To form an NMOS transistor in the first region I, the first stressor liner 124 may be formed of a material that applies a tensile stress to channel regions of the plurality of first fin-shaped active regions F1. For example, the first stressor liner 124 may be formed of SiN, SiON, SiBN, SiC, SiC:H, SiCN, SiCN:H, SiOCN, SiOCN:H, SiOC, $SiO_2$, polysilicon, or a combination thereof. According to some embodiments, the first stressor liner 124 may have a thickness of about 10 Å to about 100 Å.

According to some embodiments, the first stressor liner 124 may be formed via plasma enhanced chemical vapor deposition (PECVD), high density plasma CVD (HDP CVD), inductively coupled plasma CVD (ICP CVD), or capacitor coupled plasma CVD (CCP CVD).

Figure 18E:
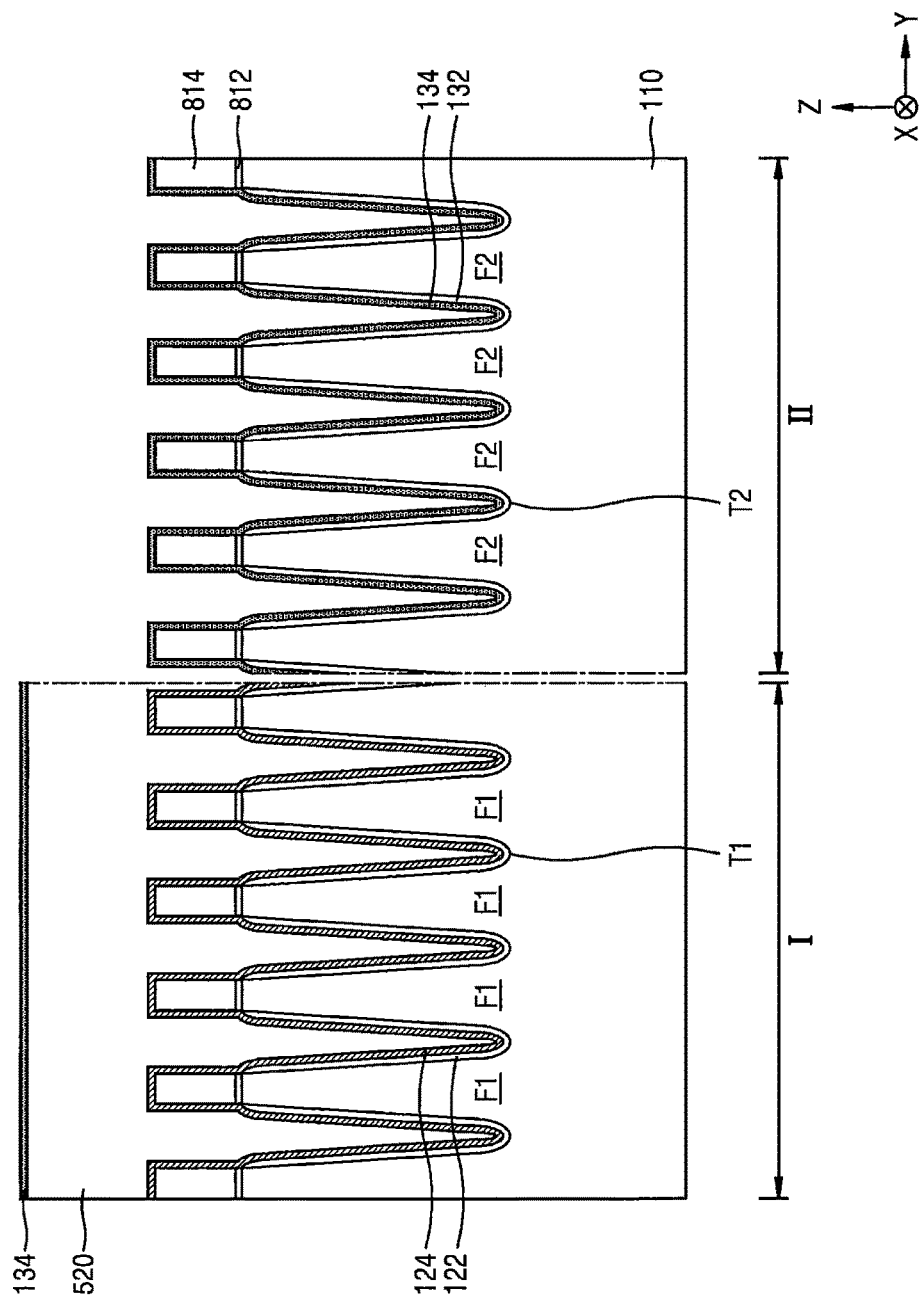

Referring to FIG. 18E, after a mask pattern 520 covering the first region I is formed such that the second region II of the substrate 110 is exposed, a second stressor liner 134 may be formed on the second insulation liner 132 in the second region II.

While the second stressor liner 134 is being formed on the second insulation liner 132 in the second region II, the second stressor liner 134 may be formed on the mask pattern 520 in the first region I. According to some embodiments, the mask pattern 520 may be formed of a photoresist layer.

The second stressor liner 134 may be formed to have a uniform (i.e., constant) thickness to conformally cover the second insulation liner 132.

To form a PMOS transistor in the second region II, the second stressor liner 134 may be formed of a material that applies a compressive stress to channel regions of the plurality of second fin-shaped active regions F2. For example, the second stressor liner 134 may be formed of SiN, SiON, SiBN, SiC, SiC:H, SiCN, SiCN:H, SiOCN, SiOCN:H, SiOC, $SiO_2$, polysilicon, or a combination thereof. According to some embodiments, the second stressor liner 134 may have a thickness of about 10 Å to about 100 Å.

According to some embodiments, the second stressor liner 134 may be formed via PECVD, HDP CVD, ICP CVD, or CCP CVD.

Figure 18F:
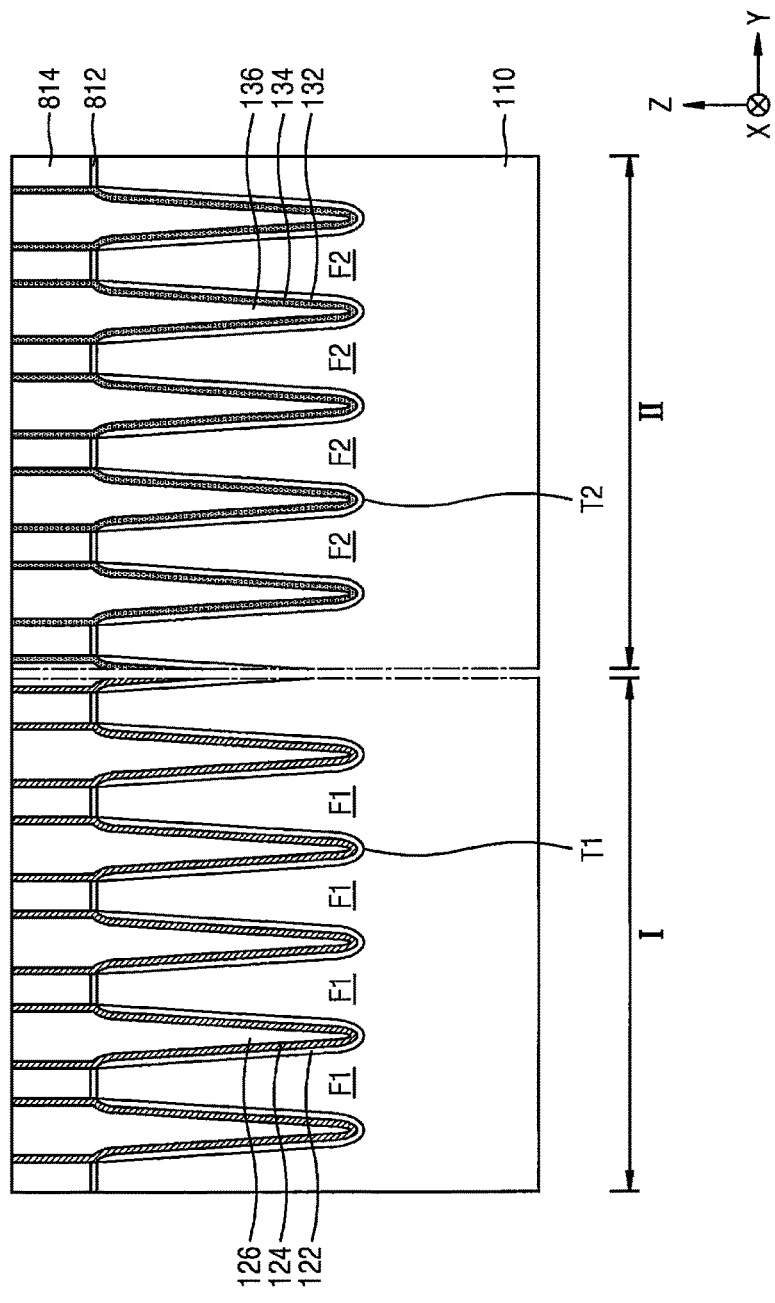

Referring to FIG. 18F, after the first stressor liner 124 is exposed in the first region I by removing the mask pattern 520 (see FIG. 18E) and the second insulation liner 134 covering the mask pattern 520 from the first region I, a first gap-fill insulation layer 126 filling the plurality of first trenches T1 may be formed in the first region I, and a second gap-fill insulation layer 136 filling the plurality of second trenches T2 may be formed in the second region II.

The first gap-fill insulation layer 126 and the second gap-fill insulation layer 136 may be formed simultaneously or concurrently and may be formed of the same material layer. To form the first gap-fill insulation layer 126 and the second gap-fill insulation layer 136, oxide may be deposited to fill the plurality of first trenches T1 and the plurality of second trenches T2, and then the deposited oxide may be annealed. Thereafter, upper portions of the first gap-fill insulation layer 126 and the second gap-fill insulation layer 136 may be partially removed such that upper surfaces of the plurality of mask patterns 814 are exposed.

The first and second gap-fill insulation layers 126 and 136 may be formed by FCVD and/or spin coating. For example, the first and second gap-fill insulation layers 126 and 136 may be formed of FSG, USG, BPSG, PSG, FOX, PE-TEOS and/or TOSZ. According to some embodiments, an oxide layer in the second gap-fill insulation layer 136 may be formed of the same layer as an oxide layer in the first gap-fill insulation layer 126, which is formed using the same method as a method used to form the oxide layer in the first gap-fill insulation layer 126.

Figure 18G:
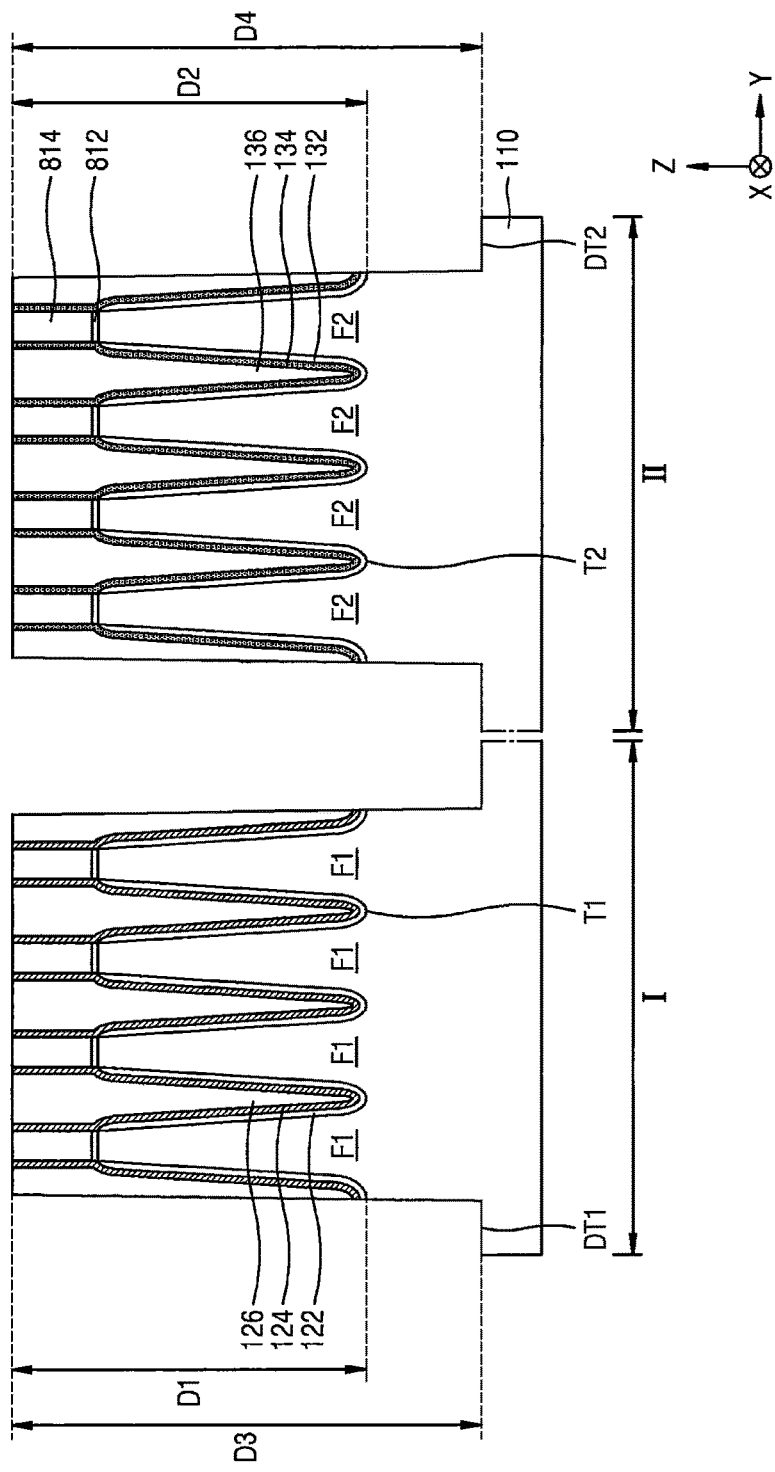

Referring to FIG. 18G, first and second deep trenches DT1 and DT2 may be formed by removing some of the plurality of first fin-shaped active regions F1, some of the plurality of second fin-shaped active regions F2, and insulation layers surrounding the some first fin-shaped active regions F1 and the some second fin-shaped active regions F2 from the first region I and the second region II of the substrate 110.

Depths D3 and D4 from the upper surfaces of the plurality of mask patterns 814 to lower surfaces of the first and second deep trenches DT1 and DT2 may be greater than depths D1 and D2 from the upper surfaces of the plurality of mask patterns 814 to lower surfaces of the first trenches T1 and the second trenches T2. For example, the depths D3 and D4 of the first and second deep trenches DT1 and DT2 may be each about 50 nm to about 150 nm greater than each of the depths D1 and D2 of the first and second trenches T1 and T2.

According to some embodiments, the first region I may be defined by the first deep trenches DT1, and the second region II may be defined by the second deep trenches DT2.

According to some embodiments, to form the first and second deep trenches DT1 and DT2, a photoresist pattern that partially exposes an upper surface of a resultant structure of FIG. 18F may be formed on the resultant structure of FIG. 18F, and the exposed upper surface portion of the resultant structure may be dry etched using the photoresist pattern as an etch mask.

Figure 18H:
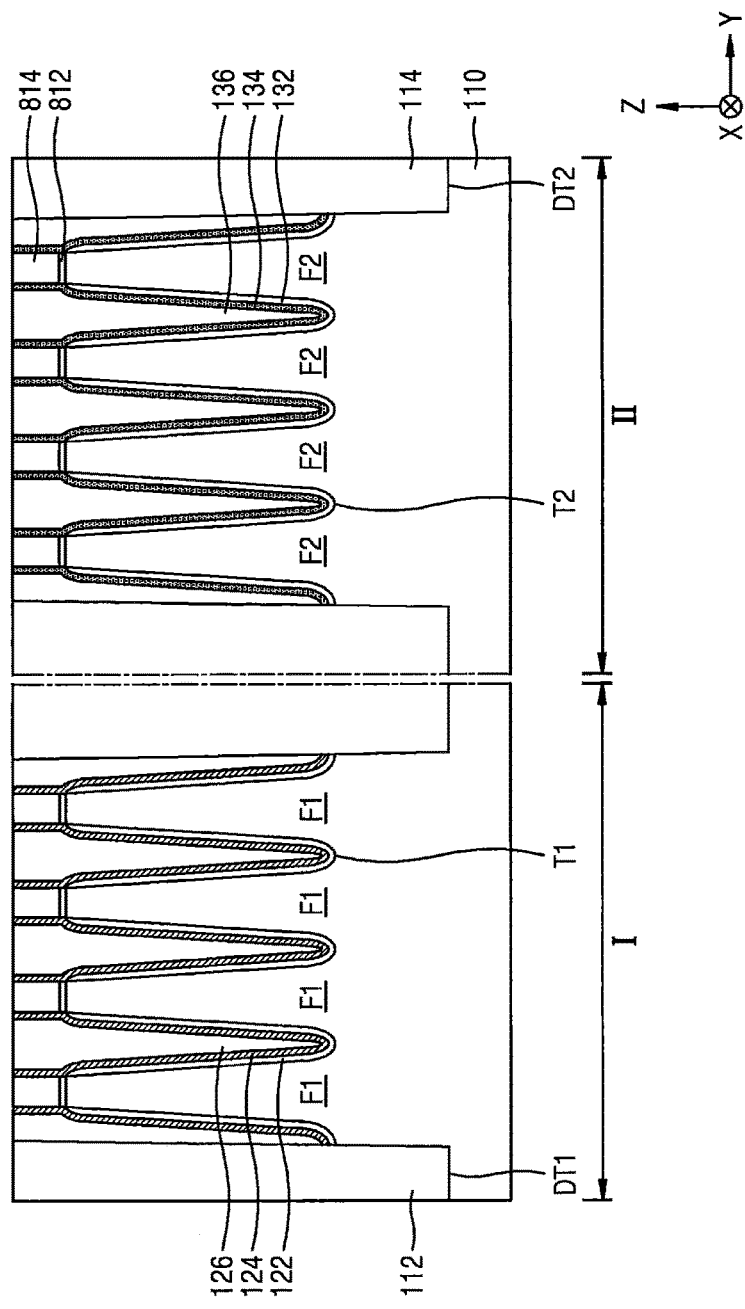

Referring to FIG. 18H, first and second inter-device isolation insulating layers 112 and 114 may be formed to fill the first and second deep trenches DT1 and DT2.

The first and second inter-device isolation insulating layers 112 and 114 may be formed via coating or deposition. According to some embodiments, the first and second inter-device isolation insulating layers 112 and 114 may each be, but is not limited thereto, formed of USG.

In the first region I, the first inter-device isolation insulating layers 112 may be formed to directly contact the first insulation liner 122, the first stressor liner 124, and the first gap-fill insulation layer 126. In the second region II, the second inter-device isolation insulating layers 114 may be formed to directly contact the second insulation liner 132, the second stressor liner 134, and the second gap-fill insulation layer 136.

According to some embodiments, to form the first and second inter-device isolation insulating layers 112 and 114, insulation layers may be formed to fill the first and second deep trenches DT1 and DT2, and then upper surfaces of the insulation layers may be planarized such that the plurality of mask patterns 814 are exposed. At this time, the plurality of mask patterns 814 and the first and second gap-fill insulation layers 126 and 136 may be partially removed, and thus the heights thereof may be reduced.

Figure 18I:
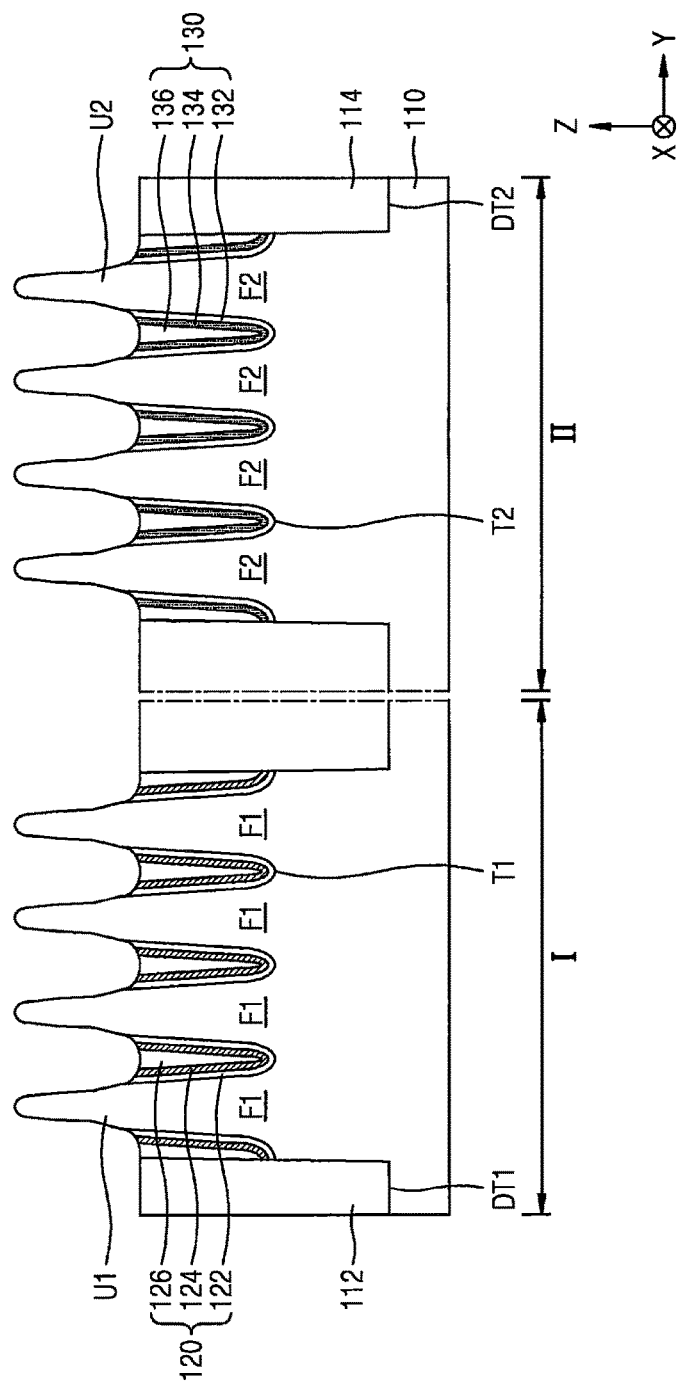

Referring to FIG. 18I a recess process for removing the plurality of mask patterns 814 (see FIG. 18H), the plurality of pad oxide layer patterns 812 (see FIG. 18H), portions of the first and second inter-device isolation insulating layers 112 and 114, portions of the first and second gap-fill insulation layers 126 and 136, portions of the first and second stressor liners 124 and 134, and portions of the first and second insulation liners 122 and 132 may be performed such that upper surfaces and sidewalls of first and second upper portions U1 and U2 of the plurality of first and second fin-shaped active regions F1 and F2 are exposed.

Consequently, first and second isolation layers 120 and 130 respectively exposing the first and second upper portions U1 and U2 of the first and second fin-shaped active regions F1 and F2 may be formed in the first region I and the second region II, respectively.

According to some embodiments, dry etching, wet etching, or a combination thereof may be used to perform the recess process. While the recess process is being performed, the exposed first and second upper portions U1 and U2 of the first and second fin-shaped active regions F1 and F2 in the first region I and the second region II are exposed to an etch atmosphere and/or a subsequent cleaning atmosphere, and thus portions of the exposed first and second upper portions U1 and U2 are removed from external surfaces thereof by etching, oxidation, and/or cleaning. Accordingly, as shown in FIG. 18I, the upper portions U1 and U2 of the first and second fin-shaped active regions F1 and F2 may have reduced widths. In particular, as the amount of unnecessary layers in the first region I and the second region II removed from the resultant structure of FIG. 18H during the recess process increases, the areas of the first and second upper portions U1 and U2 of the first and second fin-shaped active regions F1 and F2 exposed increase, and accordingly, top portions of the first and second fin-shaped active regions F1 and F2 may be exposed to an etch atmosphere during the recess process longer than bottom portions thereof. Thus, the amounts of the upper portions of the first and second fin-shaped active regions F1 and F2 lost due to the etch atmosphere may increase in a direction toward the top portions of the upper portions of the first and second fin-shaped active regions F1 and F2, and consequently, the widths of the first and second upper portions U1 and U2 obtained after the recess process may decrease in the direction toward the top portions of the upper portions U1 and U2.

In some embodiments, sidewalls of the first upper portion U1 may have a change in slope as illustrated in FIG. 18I. The sidewalls of the first upper portion U1 may have a first slope adjacent a top of the first upper portion U1 that is steeper than a second slope adjacent the plurality of first isolation layers 120. In some embodiments, sidewalls of the second upper portion U2 may also have a change in slope as illustrated in FIG. 18I. The sidewalls of the second upper portion U2 may have a third slope adjacent a top of the second upper portion U2 that is steeper than a fourth slope adjacent the plurality of second isolation layers 130.

According to some embodiments, the first and second upper portions U1 and U2 of the first and second fin-shaped active regions F1 and F2, which are exposed in the first region I and the second region II, may undergo an impurity ion injection process for threshold voltage control. During the impurity ion injection process for threshold voltage control, boron (B) ions as impurities may be injected into a region including NMOS transistors in the first region I and the second region II, and phosphorus (P) ions or arsenic (As) as impurities may be injected into a region including PMOS transistors in the first region I and the second region II.

Figure 18J:
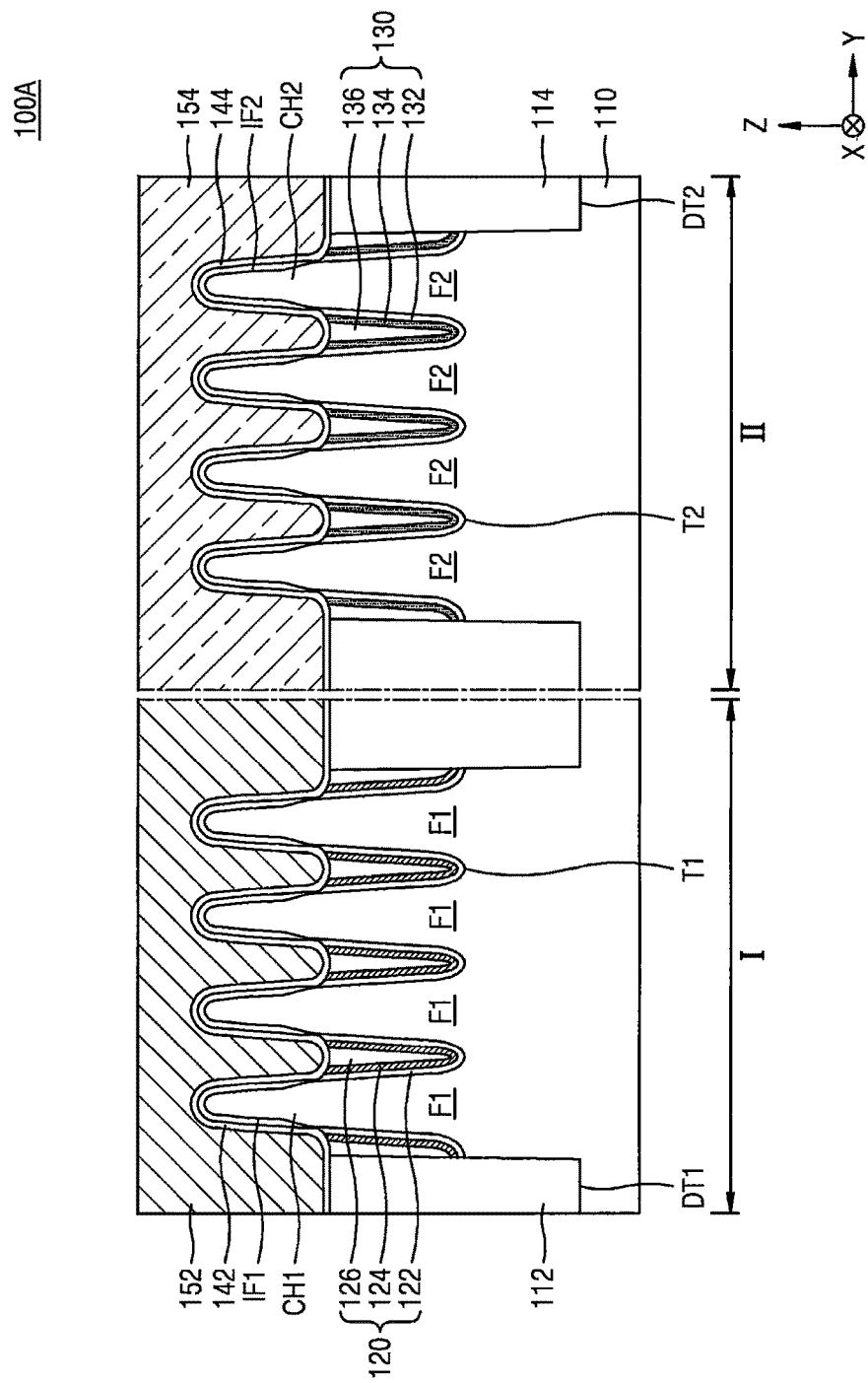

Referring to FIG. 18J, after first and second interfacial layers IF1 and IF2 may be formed on respective exposed surfaces of the first and second fin-shaped active regions F1 and F2 in the first region I and the second region II, a first gate insulation layer 142 and a first gate 152 sequentially covering the first upper portions U1 (see FIG. 18I) of the plurality of first fin-shaped active regions F1 may be formed in the first region I, a second gate insulation layer 144 and a second gate 154 sequentially covering the second upper portions U2 (see FIG. 18I) of the plurality of second fin-shaped active regions F2 may be formed in the second region II, and the first and second source/drain regions 162 and 164 (see FIG. 1A) may be formed on both sides of the first gate 152 and both sides of the second gate 154, respectively, in the plurality of first and second fin-shaped active regions F1 and F2. In this way, the IC device 100A of FIG. 1C may be manufactured.

According to some embodiments, the first and second gates 152 and 154 may be formed using an RPG process. The first and second upper portions U1 and U2 of the plurality of first and second fin-shaped active regions F1 and F2 may be the channel regions CH1 and CH2, respectively.

According to the method of fabricating the IC device 100A described above with reference to FIGS. 18A-18J, the first and second isolation layers 120 and 130 including the first and second stressor liners 124 and 134 having different stresses may be formed in the first region I and the second region II using a simplified process, and thus an IC device having independently enhanced carrier mobility according to the conductive types of the plurality of channel regions CH1 and CH2 formed in the first region I and the second region II may be easily obtained.

Although the method of fabricating the IC device 100A of FIG. 1C is illustrated and described above with reference to FIGS. 18A-18J, the IC devices having various structures described in this specification may be manufactured using various methods into which the method of FIGS. 18A-18J is modified and changed within the scope of the inventive concept.

For example, to form the IC device 100 of FIGS. 1A and 1B, the IC device 100B of FIG. 2, and the IC device 100C of FIG. 3, the thickness of the first stressor liner 124 may be adjusted during the process described above with reference to FIG. 18D, or the thickness of the second stressor liner 134 may be adjusted during the process described above with reference to FIG. 18E.

Figure 19A:
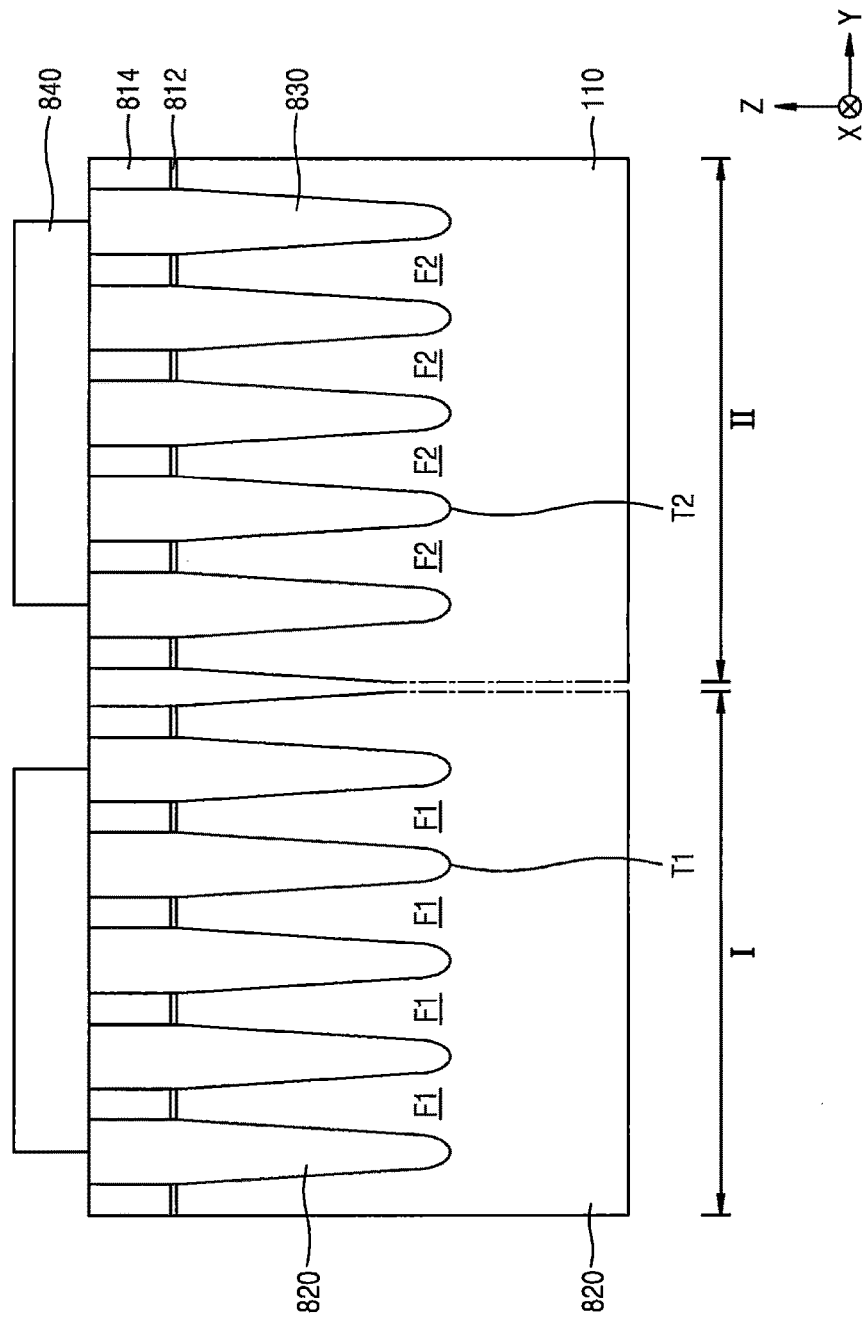
FIGS. 19A-19C are cross-sectional views illustrating a method of fabricating an IC device according to some embodiments of the inventive concept.
Figure 19B:
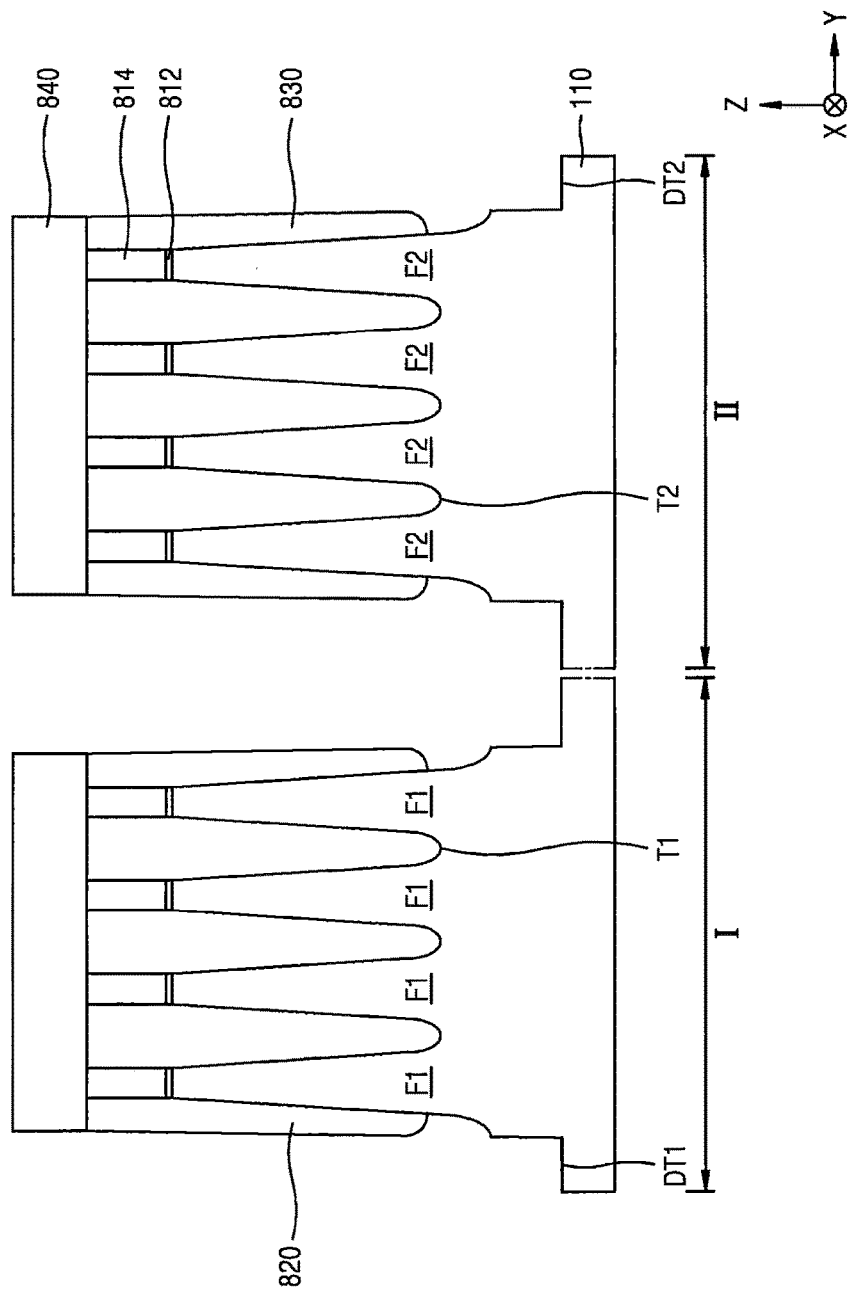
Figure 19C:
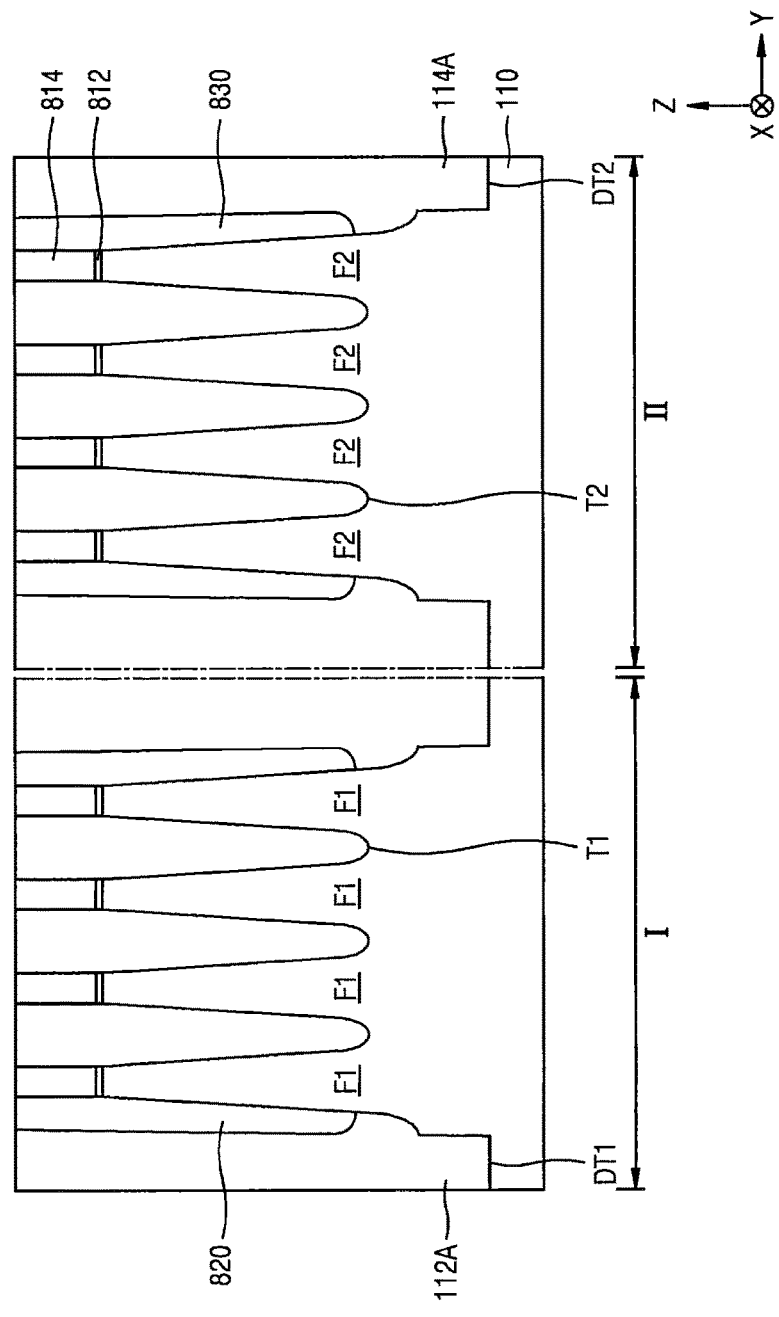

FIGS. 19A-19C are cross-sectional views illustrating a method of fabricating an IC device according to some embodiments of the inventive concept.

Referring to FIG. 19A, after the plurality of first and second fin-shaped active regions F1 and F2 are formed using a method as described above with reference to FIGS. 18A and 18B, first and second preliminary isolation layers 820 and 830 filling the spaces between the plurality of first fin-shaped active regions F1 and the spaces between the plurality of second fin-shaped active regions F2, respectively, may be formed using a method as described above with reference to FIGS. 18C-18F, and mask patterns 840 may be formed on the first and second preliminary isolation layers 820 and 830.

According to some embodiments, the first preliminary isolation layer 820 may have a structure in which the first insulation liner 122, the first stressor liner 124, and the first gap-fill insulation layer 126 of FIG. 18F are stacked. The second preliminary isolation layer 830 may have a structure in which the first insulation liner 132, the first stressor liner 134, and the first gap-fill insulation layer 136 of FIG. 18F are stacked.

Referring to FIG. 19B, some of the plurality of pad oxide layer patterns 812, some of the plurality of mask patterns 814, some of the first and second fin-shaped active regions F1 and F2, and some of the first and second preliminary isolation layers 820 and 830 may be removed via anisotropic etching using the mask pattern 840 as an etch mask that is a similar method to that described above with reference to FIG. 18G, thereby forming the first and second deep trenches DT1 and DT2.

While the first and second deep trenches DT1 and DT2 are being formed, when the first and second preliminary isolation layers 820 and 830 may be etched within first trenches T1 and second trenches T2 adjacent to the first and second deep trenches DT1 and DT2 among the plurality of first trenches T1 and the plurality of second trenches T2 and then the substrate 110 starts being etched from lower surfaces of the first and second trenches T1 and T2, the etching of the substrate 110 is temporarily conducted not only vertically but also horizontally because a layer that is to be etched changes. Thus, a portion of the substrate 110 and some parts of the first and second preliminary isolation layers 820 and 830 may be etched similar to isotropic etching. Thus, some parts of the first and second preliminary isolation layers 820 and 830 may be consumed horizontally, and the first and second trenches T1 and T2 adjacent to the first and second deep trenches DT1 and DT2 may become deeper.

Referring to FIG. 19C, after a portion of the mask pattern 840 that remains on a resultant structure of FIG. 19B is removed, first and second insulation layers 112A and 114A may be formed to fill the first and second deep trenches DT1 and DT2.

The first and second insulation layers 112A and 114A may correspond to the first and second inter-device isolation insulating layers 112 and 114 of FIG. 18H, respectively.

Thereafter, the processes described above with referenced to FIGS. 18I and 18J may be performed.

According to some embodiments, the IC devices 200, 200A, 200B, 200C, and 200D of FIGS. 4A-7 may be formed by applying various modifications and changes to the method described above with reference to FIGS. 19A-19C within the spirit of the inventive concept.

For example, in processes for forming the IC device 200B of FIG. 5 and the IC device 200C of FIG. 6, the thicknesses of the first stressor liners 124 and 224 may be adjusted, or the thicknesses of the second stressor liners 134 and 234 may be adjusted, similar to the above description of the IC device 100B of FIG. 2 and the IC device 100C of FIG. 3.

In processes for forming the IC device 200D of FIG. 7, processes up to a process for forming the first and second deep trenches DT1 and DT2 may be performed according to the methods as described above with reference to FIGS. 18A-18G. In this case, similar to the principle described above with reference to FIG. 19B, while the etching process for forming the first and second deep trenches DT1 and DT2 are being performed, when the first and second isolation layers 120 and 130 within first trenches T1 and second trenches T2 adjacent to the first and second deep trenches DT1 and DT2 from among the plurality of first trenches T1 and the plurality of second trenches T2 may be etched and then the substrate 110 starts being etched at lower surfaces of the first and second trenches T1 and T2, the etching of the substrate 110 is temporarily conducted not only vertically but also horizontally. Thus, portions of the first and second stressor liners 224E and 234E and portions of the first and second gap-fill isolation layers 226 and 236 within first and second trenches T1 and T2 adjacent to the first and second deep trenches DT1 and DT2 may be removed. Consequently, after the first and second inter-device isolation insulating layers 112 and 114 may be formed within the first and second deep trenches DT1 and DT2, resultant structures in which the remaining first and second stressor liners 224E and 234E may be separated from the first and second inter-device isolation insulating layers 112 and 114 may be obtained.

Boundary surfaces between the first and second trenches T1 and T2 adjacent to the first and second deep trenches DT1 and DT2 and the first and second inter-device isolation insulating layers 112 and 114 are illustrated as straight lines for convenience of explanation in FIG. 7. However, as the first and second inter-device isolation insulating layers 112 and 114 are partially introduced into empty spaces within the first and second trenches T1 and T2 adjacent to the first and second deep trenches DT1 and DT2 via lower portions of the first and second trenches T1 and T2, the boundary surfaces between the first and second trenches T1 and T2 and the first and second inter-device isolation insulating layers 112 and 114 may have nonlinear shapes extending to the insides of the first and second trenches T1 and T2.

In processes for forming the IC devices 300 and 300A of FIGS. 8A and 8B, various processes into which the methods described above with reference to FIGS. 18A-18J and FIGS. 19A-19C are modified and changed within the spirit of the inventive concept may be used. In particular, in the process for forming the first and second insulation liners 122 and 132 as described above with reference to FIG. 18C, oxidation conditions may be controlled such that an oxide layer obtained on the side of a lower surface of each of the first and second trenches T1 and T2 may be thicker than an oxide layer obtained on the side of an entrance of each of the first and second trenches T1 and T2. Thus, the first insulation liners 122A and 222A and the second insulation liners 132A and 232A of FIGS. 8A and 8B may be formed. For example, a portion of each of the first trench T1 and the second trench T2 on the side of the entrance of each of the first trench T1 and the second trench T2 may be thinner than a portion thereof on the side of the lower surface thereof. In this case, while respective exposed surfaces of the first and second fin-shaped active regions F1 and F2 are thermally oxidized for the same period of time, oxide layers are grown from the lower surfaces of the first trench T1 and the second trench T2 within narrow spaces compared with the side of the entrances of the first trench T1 and the second trench T2, and growth of an oxide layer from the lower surface of each of the first trench T1 and the second trench T2 and growth of an oxide layer from the sidewall thereof may be simultaneously conducted in a lower portion of each of the first trench T1 and the second trench T2. Thus, the thickness of an oxide layer formed on the side of the lower surface of each of the first and second trenches T1 and T2, defining a relatively narrow space, may be greater than that of an oxide layer formed on the side of the entrance thereof, defining a relatively wide space.

The IC device 300B of FIG. 9 may be formed using the aforementioned methods of forming the IC devices 300 and 300A of FIGS. 8A and 8B, the aforementioned method of forming the IC device 200D of FIG. 7, or various methods into which these three methods are modified and changed within the scope of the inventive concept may be used.

In a method of forming the IC device 300C of FIG. 10, during a deposition process for forming the first and second stressor liners 224E, 234E, 324, and 334 within the first trenches T1 and the second trenches T2, step coverage characteristics may be controlled such that deposition is less smoothly conducted in relatively deep portions of the first trenches T1 and the second trenches T2 than in the entrances of the first trenches T1 and the second trenches T2. Thus, as shown in FIG. 10, a structure may obtained in which each internal first isolation layer 220I includes two separate first stressor liners 324 in the first region I and each internal second isolation layer 230I includes two separate second stressor liners 334.

Although some example methods of manufacturing IC devices according to embodiments of the inventive concept have been described above, it will be understood by one of ordinary skill in the art that the IC devices 100, 100A, 100B, 100C, 200, 200A, 200B, 200C, 200D, 300, 300A, 300B, and 300C of FIGS. 1A-10, IC devices having various structures modified from the structures of the IC devices 100, 100A, 100B, 100C, 200, 200A, 200B, 200C, 200D, 300, 300A, 300B, and 300C of FIGS. 1A-10, the IC devices 400, 400A, 400B, 500, 500A, 500B, and 700 of FIGS. 11A-17C, and IC devices having various structures modified from the structures of the IC devices 400, 400A, 400B, 500, 500A, 500B, and 700 of FIGS. 11A-17C may be manufactured by applying various modifications and changes to the aforementioned methods within the spirit of the inventive concept.

IC devices including a FinFET having a 3D-structure channel and methods of manufacturing the IC devices have been described above with reference to FIGS. 1A-19C, but embodiments of the inventive concept are not limited thereto. For example, it will be understood by one of ordinary skill in the art that IC devices including planar MOSFETs having characteristics according to the inventive concept and methods of manufacturing the IC devices may be provided via various modifications and changes made without departing from the spirit of the above-described inventive concept.

Figure 20:
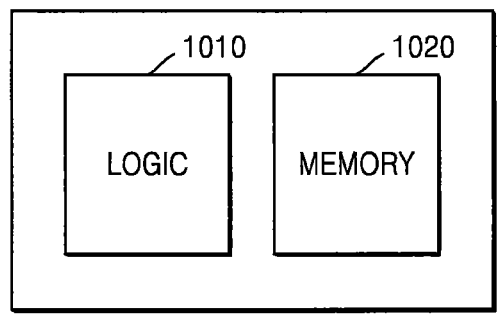
FIG. 20 is a block diagram of an electronic device according to embodiments of the inventive concept.

FIG. 20 is a block diagram of an electronic device 1000 according to some embodiments of the inventive concept.

Referring to FIG. 20, the electronic device 1000 may include a logic region 1010 and a memory region 1020.

The logic region 1010 may include various types of logic cells including a plurality of circuit elements, such as a transistor and a register, as standard cells performing desired logical functions, such as a counter and a buffer. The logic cells may constitute, for example, an AND, a NAND, an OR, a NOR, an exclusive OR (XOR), an exclusive NOR (XNOR), an inverter (INV), an adder (ADD), a buffer (BUF), a delay (DLY), a filter (FILL), a multiplexer (MXT/MXIT), an QR/AND/INVERTER (OAI), an AND/OR (AO), an AND/OR/INVERTER (AOI), a D flip-flop, a reset flip-flop, a master-slaver flip-flop, or a latch. However, the aforementioned cells are just examples, and logic cells according to the inventive concept are not limited the aforementioned cells.

The memory region 1020 may include at least one of SRAM, DRAM, MRAM, RRAM, and PRAM.

At least one of the logic region 1010 and the memory region 1020 may include at least one of the IC devices 100, 100A, 100B, 100C, 200, 200A, 200B, 200C, 200D, 300, 300A, 300B, 300C, 400, 400A, 400B, 500, 500A, 500B, and 700 of FIGS. 1A-17C and IC devices having various structures into which the structures of the IC devices 100, 100A, 100B, 100C, 200, 200A, 200B, 200C, 200D, 300, 300A, 300B, 300C, 400, 400A, 400B, 500, 500A, 500B, and 700 are modified and changed within the spirit of the inventive concept.

Figure 21:
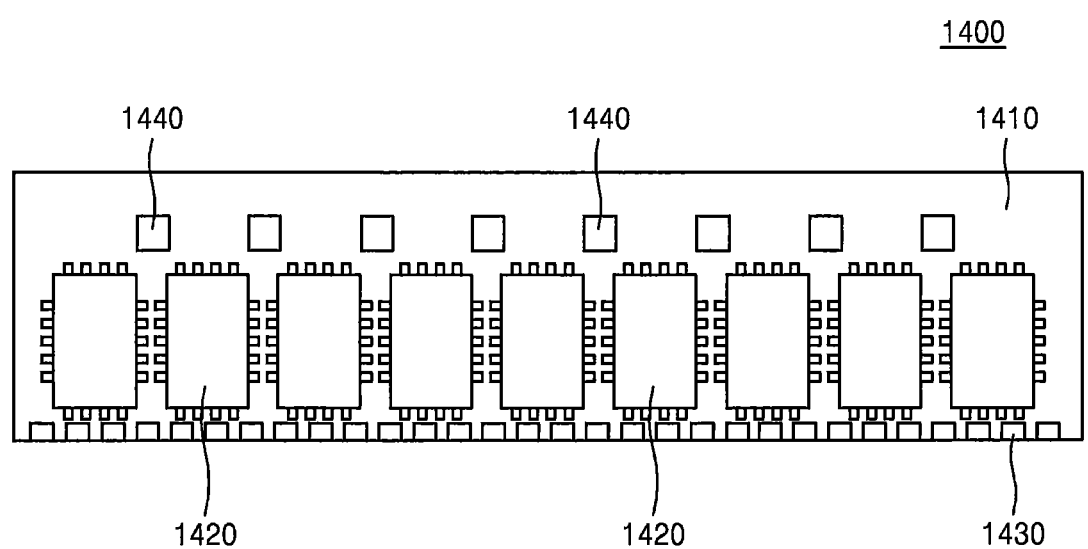
FIG. 21 is a plan view of a memory module according to some embodiments of the inventive concept.

FIG. 21 is a plan view of a memory module 1400 according to some embodiments of the inventive concept.

The memory module 1400 may include a module substrate 1410 and a plurality of semiconductor chips 1420 attached to the module substrate 1410.

The semiconductor chip 1420 may include an IC device according to the inventive concept. The semiconductor chip 1420 may include at least one of the IC devices 100, 100A, 100B, 100C, 200, 200A, 200B, 200C, 200D, 300, 300A, 300B, 300C, 400, 400A, 400B, 500, 500A, 500B, and 700 of FIGS. 1A-17C and IC devices having various structures into which the structures of the IC devices 100, 100A, 100B, 100C, 200, 200A, 200B, 200C, 200D, 300, 300A, 300B, 300C, 400, 400A, 400B, 500, 500A, 500B, and 700 are modified and changed within the spirit of the inventive concept.

Connection units 1430 that may fit into sockets of a mother board may be arranged on one side of the module substrate 1410. Ceramic decoupling capacitors 1440 may be arranged on the module substrate 1410. The memory module 1400 is not limited to the configuration illustrated in FIG. 21 and may be manufactured in various forms.

Figure 22:
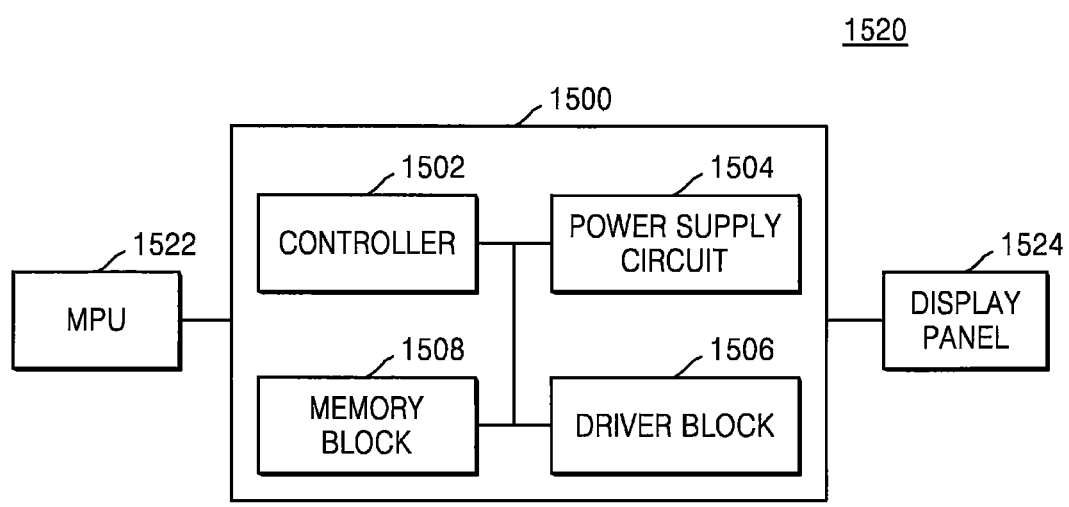
FIG. 22 is a schematic block diagram of a display driver IC (DDI) and a display device including the DDI, according to some embodiments of the inventive concept.

FIG. 22 is a schematic block diagram of a display driver IC (DDI) 1500 and a display device 1520 including the DDI 1500, according to some embodiments of the inventive concept.

Referring to FIG. 22, the DDI 1500 may include a controller 1502, a power supply circuit 1504, a driver block 1506, and a memory block 1508. The controller 1502 receives and decodes a command applied by a main processing unit (MPU) 1522, and controls the blocks of the DDI 1500 to accomplish an operation corresponding to the command. The power supply circuit 1504 generates a driving voltage in response to a control of the controller 1502. The driver block 1506 drives a display panel 1524 by using the driving voltage generated by the power supply circuit 1504, in response to a control of the controller 1502. The display panel 1524 may be liquid crystal display panel or a plasma display panel. The memory block 1508 temporarily stores a command input to the controller 1502 or control signals output by the controller 1502, or stores pieces of necessary data. The memory block 1508 may include memory such as RAM or ROM. At least one of the power supply circuit 1504 and the driver block 1506 may include at least one of the IC devices 100, 100A, 100B, 100C, 200, 200A, 200B, 200C, 200D, 300, 300A, 300B, 300C, 400, 400A, 400B, 500, 500A, 500B, and 700 of FIGS. 1A-17C, and IC devices having various structures into which the structures of the IC devices 100, 100A, 100B, 100C, 200, 200A, 200B, 200C, 200D, 300, 300A, 300B, 300C, 400, 400A, 400B, 500, 500A, 500B, and 700 are modified and changed within the spirit of the inventive concept.

Figure 23:
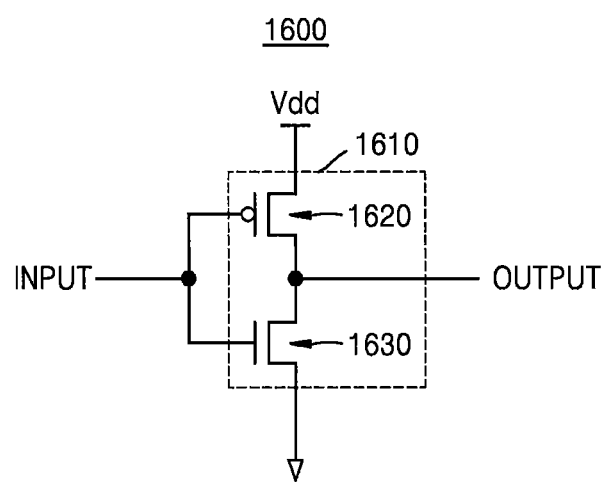
FIG. 23 is a circuit diagram of a CMOS inverter according to some embodiments of the inventive concept.

FIG. 23 is a circuit diagram of a CMOS inverter 1600 according to some embodiments of the inventive concept.

The CMOS inverter 1600 may include a CMOS transistor 1610. The CMOS transistor 1610 may include a PMOS transistor 1620 and an NMOS transistor 1630 connected between a power supply terminal Vdd and a ground terminal. The CMOS transistor 1610 may include at least one of the IC devices 100, 100A, 100B, 100C, 200, 200A, 200B, 200C, 200D, 300, 300A, 300B, 300C, 400, 400A, 400B, 500, 500A, 500B, and 700 of FIGS. 1A-17C and IC devices having various structures into which the structures of the IC devices 100, 100A, 100B, 100C, 200, 200A, 200B, 200C, 200D, 300, 300A, 300B, 300C, 400, 400A, 400B, 500, 500A, 500B, and 700 are modified and changed within the spirit of the inventive concept.

Figure 24:
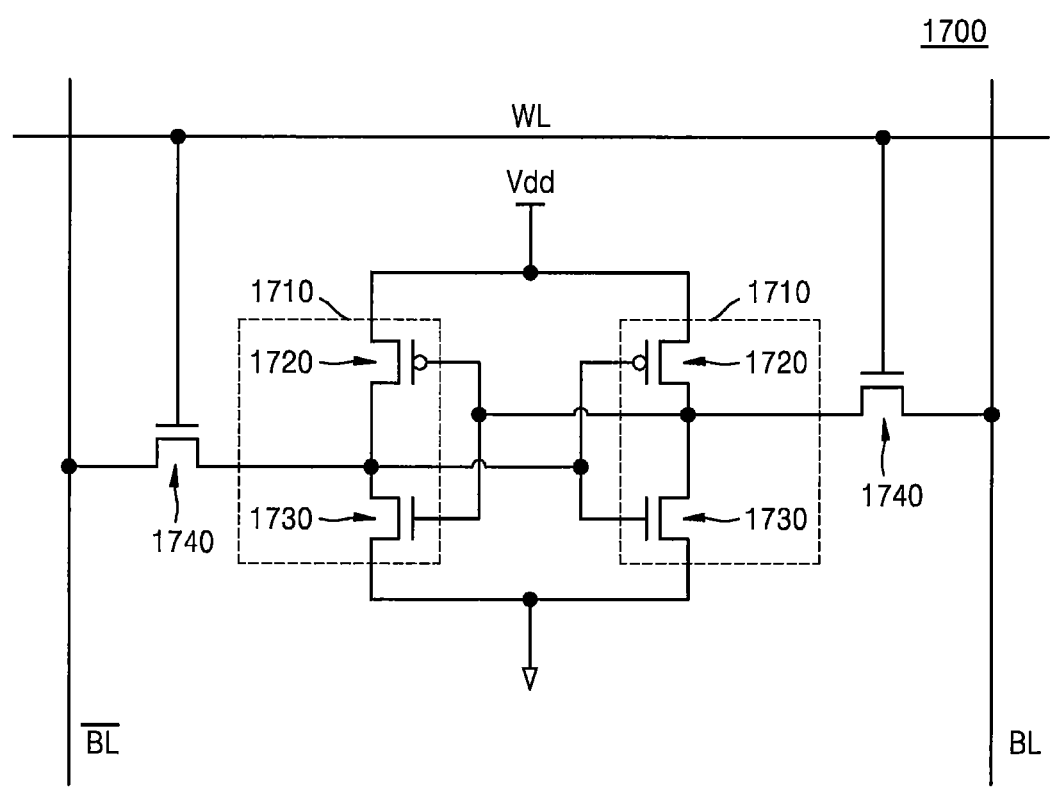
FIG. 24 is a circuit diagram of a CMOS SRAM according to some embodiments of the inventive concept.

FIG. 24 is a circuit diagram of a CMOS SRAM 1700 according to some embodiments of the inventive concept.

The CMOS SRAM 1700 may include a pair of driving transistors 1710. Each of the two driving transistors 1710 may include a PMOS transistor 1720 and an NMOS transistor 1730 connected between a power supply terminal Vdd and a ground terminal. The CMOS SRAM 1700 may further include a pair of transmission transistors 1740. Sources of the transmission transistors 1740 may be cross-connected to common nodes of the PMOS transistors 1720 and the NMOS transistors 1730, which constitute the driving transistors 1710. The power supply terminal Vdd may be connected to sources of the PMOS transistors 1720, and the ground terminal may be connected to sources of the NMOS transistors 1730. A word line WL may be connected to gates of the transmission transistors 1740, and a bit line BL and an inverted bit line $\overline{BL}$ may be connected to drains of the transmission transistors 1740, respectively.

At least one of the driving transistors 1710 and the transmission transistors 1740 of the CMOS SRAM 1700 may include at least one of the IC devices 100, 100A, 100B, 100C, 200, 200A, 200B, 200C, 200D, 300, 300A, 300B, 300C, 400, 400A, 400B, 500, 500A, 500B, and 700 of FIGS. 1A-17C, and IC devices having various structures into which the structures of the IC devices 100, 100A, 100B, 100C, 200, 200A, 200B, 200C, 200D, 300, 300A, 300B, 300C, 400, 400A, 400B, 500, 500A, 500B, and 700 are modified and changed within the spirit of the inventive concept.

Figure 25:
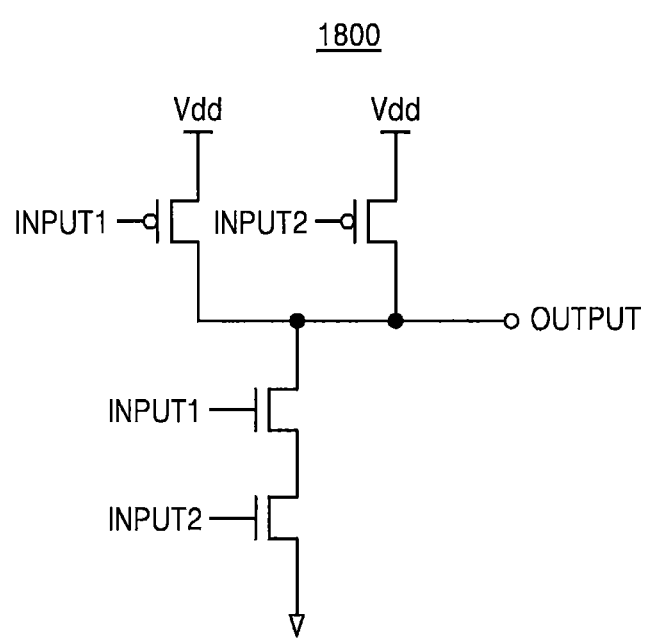
FIG. 25 is a circuit diagram of a CMOS NAND circuit according to some embodiments of the inventive concept.

FIG. 25 is a circuit diagram of a CMOS NAND circuit 1800 according to some embodiments of the inventive concept.

The CMOS NAND circuit 1800 may include a pair of CMOS transistors to which different input signals are transmitted. The CMOS NAND circuit 1800 may include at least one of the IC devices 100, 100A, 100B, 100C, 200, 200A, 200B, 200C, 200D, 300, 300A, 300B, 300C, 400, 400A, 400B, 500, 500A, 500B, and 700 of FIGS. 1A-17C, and IC devices having various structures into which the structures of the IC devices 100, 100A, 100B, 100C, 200, 200A, 200B, 200C, 200D, 300, 300A, 300B, 300C, 400, 400A, 400B, 500, 500A, 500B, and 700 are modified and changed within the spirit of the inventive concept.

Figure 26:
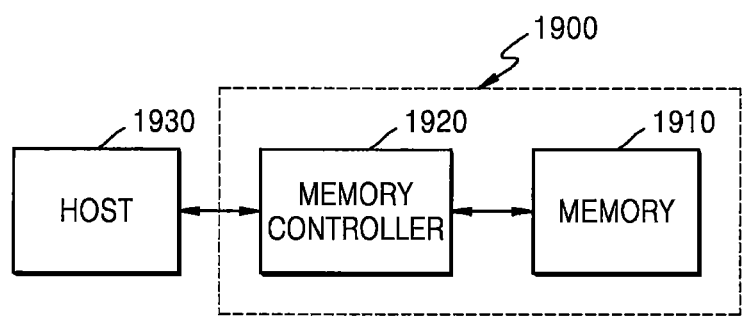
FIG. 26 is a block diagram of an electronic system according to some embodiments of the inventive concept.

FIG. 26 is a block diagram of an electronic system 1900 according to some embodiments of the inventive concept.

The electronic system 1900 may include a memory 1910 and a memory controller 1920. The memory controller 1920 controls the memory 1910 to perform data readout from and/or data writing to the memory 1910 in response to a request of a host 1930. At least one of the memory 1910 and the memory controller 1920 may include at least one of the IC devices 100, 100A, 100B, 100C, 200, 200A, 200B, 200C, 200D, 300, 300A, 300B, 300C, 400, 400A, 400B, 500, 500A, 500B, and 700 of FIGS. 1A-17C, and IC devices having various structures into which the structures of the IC devices 100, 100A, 100B, 100C, 200, 200A, 200B, 200C, 2000, 300, 300A, 300B, 300C, 400, 400A, 400B, 500, 500A, 500B, and 700 are modified and changed within the spirit of the inventive concept.

Figure 27:
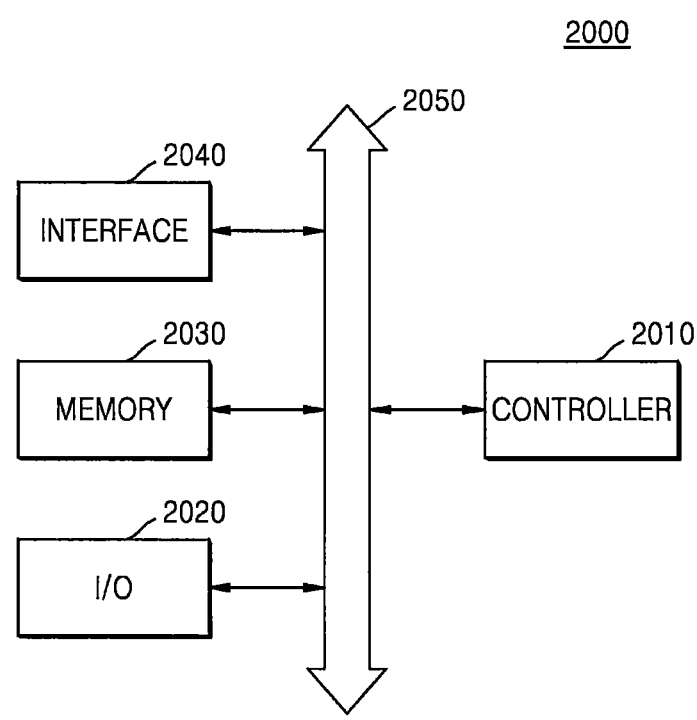
FIG. 27 is a block diagram of an electronic system according to some embodiments of the inventive concept.

FIG. 27 is a block diagram of an electronic system 2000 according to some embodiments of the inventive concept.

The electronic system 2000 may include a controller 2010, an input/output (I/O) device 2020, a memory 2030, and an interface 2040, which are connected to one another via a bus 2050.

The controller 2010 may include at least one of a microprocessor, a digital signal processor, and a processing device that is similar to these devices. The I/O device 2020 may include at least one of a keypad, a keyboard, and a display. The memory 2030 may store commands executed by the controller 2010. For example, the memory 2030 may store user data.

The electronic system 2000 may form a wireless communication device, or a device capable of transmitting and/or receiving information under wireless environments. The interface 2040 may be implemented by a wireless interface in order to help the electronic system 2000 to transmit/receive data via a wireless communication network. The interface 2040 may include an antenna and/or a wireless transceiver. According to some embodiments, the electronic system 2000 may be used in a communication interface protocol of a third-generation communication system, for example, code division multiple access (CDMA), a global system for mobile communications (GSM), north American digital cellular (NADC), extended-time division multiple access (E-TDMA), and/or wide band code division multiple access (WCDMA). The electronic system 2000 may include at least one of the IC devices 100, 100A, 100B, 100C, 200, 200A, 200B, 200C, 200D, 300, 300A, 300B, 300C, 400, 400A, 400B, 500, 500A, 500B, and 700 of FIGS. 1A-17C, and IC devices having various structures into which the structures of the IC devices 100, 100A, 100B, 100C, 200, 200A, 200B, 200C, 200D, 300, 300A, 300B, 300C, 400, 400A, 400B, 500, 500A, 500B, and 700 are modified and changed within the spirit of the inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
    first and second fin-shaped channel regions protruding from a substrate in a vertical direction, the first and second fin-shaped channel regions defining a recess therebetween;
    an isolation layer comprising a first isolation layer directly contacting a first side of the first fin-shaped channel region and a second isolation layer directly contacting a second side of the first fin-shaped channel region, the second side being opposite the first side, the first isolation layer being in a lower portion of the recess in a depth direction of the recess, and the first isolation layer comprising a first liner directly contacting a surface of the lower portion of the recess and a first insulation layer on the first liner, and the second isolation layer comprising a second liner conformally extending on the second side of the first fin-shaped channel region; a device isolation layer, wherein the second isolation layer is between the first fin-shaped channel region and the device isolation layer, and the device isolation layer is free of the second liner;
    a gate insulation layer extending along surfaces of upper portions of the first and second fin-shaped channel regions that are exposed by the isolation layer; and
    a gate electrode layer on the gate insulation layer,
    wherein a first vertical distance between an uppermost portion of the first fin-shaped channel region and a lowermost portion of the first isolation layer is less than a second vertical distance between the uppermost portion of the first fin-shaped channel region and a lowermost portion of the second isolation layer.

2. The device of claim 1, wherein the gate insulation layer directly contacts uppermost surfaces of the first liner and the first insulation layer.

3. The device of claim 1, wherein a lower most portion of the recess has a round shape.

4. The device of claim 1, wherein the first liner comprises a first insulation liner directly contacting the surface of the lower portion of the recess and a first stress liner between the first insulation liner and the first insulation layer, and the first stress liner comprises a first material different from the first insulation liner and the first insulation layer, and wherein the second isolation layer further comprises second insulation layer on the second liner, the second liner comprises a second insulation liner directly contacting the second side of the first fin-shaped channel region and a second stress liner between the second insulation liner and the second insulation layer, and the second stress liner comprises the first material.

5. An integrated circuit device comprising:
a fin-shaped channel region protruding from a substrate in a vertical direction;
a gate insulation layer extending along a surface of an upper portion of the fin-shaped channel region;
a gate electrode layer on the gate insulation layer; and
an isolation structure on a first side and a second side of a lower portion of the fin-shaped channel region, the second side being opposite the first side, the isolation structure comprising a first isolation layer directly contacting the first side of the fin-shaped channel region, a second isolation layer directly contacting the second side of the fin-shaped channel region and a device isolation layer, the second isolation layer being between the fin-shaped channel region and the device isolation layer, and the second isolation layer comprising a liner extending along the second side of the fin-shaped channel region, wherein the device isolation layer is free of the liner, and
wherein a first vertical distance between an uppermost portion of the fin-shaped channel region and a lowermost portion of the first isolation layer is less than a second vertical distance between the uppermost portion of the fin-shaped channel region and a lowermost portion of the second isolation layer.

6. The device of claim 5, wherein the liner comprises a stress liner and an insulation liner between the second side of the fin-shaped channel region and the stress liner, the stress liner comprises a first material, and the insulation liner comprises a second material that is different from the first material.

7. The device of claim 6, wherein the device isolation layer is free of the stress liner.

8. The device of claim 5, wherein the device isolation layer directly contacts the liner of the second isolation layer, and
wherein the second vertical distance is less than a third vertical distance between the uppermost portion of the fin-shaped channel region and a lowermost portion of the device isolation layer.

9. An integrated circuit device comprising:
first and second fin-shaped channel regions protruding from a substrate in a vertical direction, the first and second fin-shaped channel regions defining a recess therebetween, and a lower portion of the first fin-shaped channel region comprising a first side that defines the recess and a second side opposite the first side;
an isolation layer comprising a first isolation layer directly contacting the first side of the first fin-shaped channel region and a second isolation layer directly contacting the second side of the first fin-shaped channel region, the second isolation layer comprising a liner conformally extending on the second side of the first fin-shaped channel region and an insulation layer on the liner; a gate insulation layer extending along surfaces of upper portions of the first and second fin-shaped channel regions;
a gate electrode layer on the gate insulation layer; and
a device isolation layer directly contacting the insulation layer of the second isolation layer, the device isolation layer extending into the substrate to a deeper level than the second isolation layer, wherein the device isolation layer is free of the liner, and
wherein a first vertical distance between an uppermost portion of the first fin-shaped channel region and a lowermost portion of the first isolation layer is less than a second vertical distance between the uppermost portion of the first fin-shaped channel region and a lowermost portion of the second isolation layer.

10. The device of claim 9, wherein the gate insulation layer directly contacts an uppermost surface of the liner of the second isolation layer.

11. The device of claim 10 further comprising an interfacial layer between the first fin-shaped channel region and the gate insulation layer.

12. The device of claim 9, wherein the second vertical distance is less than a third vertical distance between the uppermost portion of the first fin-shaped channel region and a lowermost portion of the device isolation layer.

13. The device of claim 9, wherein the second isolation layer is between the first fin-shaped channel region and the device isolation layer.

14. The device of claim 1, wherein the first side and the second side of the first fin-shaped channel region are asymmetric with respect to a center axis of the first fin-shaped channel region that extends in the vertical direction.

15. The device of claim 1, wherein a first vertical length of the first side of the first fin-shaped channel region is shorter than a second vertical length of the second side of the first fin-shaped channel region.

16. The device of claim 1, wherein the first fin-shaped channel region are asymmetric with respect to a center axis of the first fin-shaped channel region that extends in the vertical direction, and
wherein the second fin-shaped channel region are substantially symmetric with respect to a center axis of the second fin-shaped channel region that extends in the vertical direction.

17. The device of claim 5, wherein the first side and the second side of the fin-shaped channel region are asymmetric with respect to a center axis of the fin-shaped channel region that extends in the vertical direction.

18. The device of claim 9, wherein the first side and the second side of the first fin-shaped channel region are asymmetric with respect to a center axis of the first fin-shaped channel region that extends in the vertical direction.

19. The device of claim 4, wherein each of the first stress liner and the second stress liner comprises silicon boronitride (SiBN), silicon carbide (SiC), SiC:H, SiCN, SiCN:H, SiOCN, SiOCN:H, silicon oxycarbide (SiOC), silicon dioxide (SiO2), polysilicon, or a combination thereof.

20. The device of claim 19, wherein each of the first stress liner and the second stress liner has a thickness of about 10Å to about 100Å.

* * * * *